US012787533B2

(12) United States Patent
Kim et al.

(10) Patent No.: US 12,787,533 B2
(45) Date of Patent: Nov. 3, 2026

(54) DISPLAY DEVICE AND MANUFACTURING METHOD OF THE SAME

(71) Applicant: Samsung Display Co., LTD., Yongin-si (KR)

(72) Inventors: Hoon Kim, Yongin-si (KR); Min Joo Kim, Yongin-si (KR); Je Won Yoo, Yongin-si (KR); Seung Kyu Lee, Yongin-si (KR); Yong Sik Hwang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 408 days.

(21) Appl. No.: 18/446,811

(22) Filed: Aug. 9, 2023

(65) Prior Publication Data

US 2024/0113260 A1 Apr. 4, 2024

(30) Foreign Application Priority Data

Sep. 29, 2022 (KR) ........................ 10-2022-0124220

(51) Int. Cl.

| | |
|---|---|
| ***H10H 29/49*** | (2025.01) |
| ***H10H 20/813*** | (2025.01) |
| ***H10H 20/83*** | (2025.01) |
| ***H10H 29/80*** | (2025.01) |
| ***H10W 90/00*** | (2026.01) |

(52) U.S. Cl.

CPC .......... *H10H 29/49* (2025.01); *H10H 20/813* (2025.01); *H10H 20/83* (2025.01); *H10H 29/832* (2025.01); *H10W 90/00* (2026.01)

(58) Field of Classification Search

None

See application file for complete search history.

(56) References Cited

U.S. PATENT DOCUMENTS

| | | | |
|---|---|---|---|
| 12,015,047 | B2 | 6/2024 | Park et al. |
| 12,557,458 | B2 | 2/2026 | Park et al. |

(Continued)

FOREIGN PATENT DOCUMENTS

| | | |
|---|---|---|
| KR | 10-2008-0059928 | 7/2008 |
| KR | 10-2022-0014472 | 2/2022 |

(Continued)

*Primary Examiner* — Feifei Yeung Lopez

(74) *Attorney, Agent, or Firm* — Womble Bond Dickinson (US) LLP

(57) ABSTRACT

A display device includes a display area where an image is displayed, a non-display area disposed adjacent to the display area, a first sub-pixel disposed in the display area, and a second sub-pixel disposed adjacent to the first sub-pixel in the display area. Each of the first sub-pixel and the second sub-pixel includes a plurality of alignment electrodes spaced apart from each other, and a plurality of light emitting elements disposed between the plurality of alignment electrodes. Each of the plurality of light emitting elements includes a first end having a first polarity, and a second end having a second polarity different from the first polarity. An orientation of the light emitting elements in the first sub-pixel and an orientation of the light emitting elements in the second sub-pixel are symmetrical. The first sub-pixel includes an identification pattern for distinguishing the first sub-pixel from the second sub-pixel.

5 Claims, 35 Drawing Sheets

(56) References Cited

U.S. PATENT DOCUMENTS

| | | | | |
|---|---|---|---|---|
| 2015/0362165 | A1* | 12/2015 | Chu | H01L 25/0753 362/235 |
| 2021/0335883 | A1* | 10/2021 | Park | G09G 3/32 |
| 2022/0011487 | A1* | 1/2022 | Park | G02B 5/286 |
| 2022/0199677 | A1* | 6/2022 | Park | H10H 20/831 |
| 2022/0254816 | A1* | 8/2022 | Park | H01L 25/167 |

FOREIGN PATENT DOCUMENTS

| | | | |
|---|---|---|---|
| KR | 1020220014390 | A | 2/2022 |
| KR | 1020220091701 | A | 7/2022 |

* cited by examiner

RME : RME1, RME2, RME3, RME4, RME5, RME6, RME7, RME8
RME1 : RME1a
CNE : CNEL1, CNEL2
CNEL1 : CNE1, CNE3, CNE6, CNE8
CNEL2 : CNE2, CNE4, CNE5, CNE7
ED : ED1, ED2, ED3, ED4, ED5, ED6
BP : BP1, BP2, BP3, BP4, BP5, BP6, BP7, BP8

RME : RME5, RME6, RME7, RME8
CNE : CNEL1, CNEL2
CNEL1 : CNE6, CNE8
CNEL2 : CNE5, CNE7
CNE6 : CNE6a, CNE6b
CNE7 : CNE7a, CNE7b
BP :BP5, BP6, BP7, BP8

ED : ED4, ED5, ED6
ED4 : ED4a, ED4b
ED5 : ED5a, ED5b
ED6 : ED6a, ED6b

RME : RME1, RME2, RME3, RME4, RME5, RME6, RME7, RME8
RME1 : RME1a
CNE : CNEL1, CNEL2
CNEL1 : CNE1, CNE3, CNE6, CNE8
CNEL2 : CNE2, CNE4, CNE5, CNE7
ED : ED1, ED2, ED3, ED4, ED5, ED6
BP : BP1, BP2, BP3, BP4, BP5, BP6, BP7, BP8

RME_1 : RME1_1, RME2, RME3, RME4, RME5, RME6, RME7, RME8
CNE : CNEL1, CNEL2
CNEL1 : CNE1, CNE3, CNE6, CNE8
CNEL2 : CNE2, CNE4, CNE5, CNE7
ED : ED1, ED2, ED3, ED4, ED5, ED6
BP : BP1, BP2, BP3, BP4, BP5, BP6, BP7, BP8

RME_1 : RME1_1, RME2, RME3, RME4, RME5, RME6, RME7, RME8
CNE : CNEL1, CNEL2
CNEL1 : CNE1, CNE3, CNE6, CNE8
CNEL2 : CNE2, CNE4, CNE5, CNE7
ED : ED1, ED2, ED3, ED4, ED5, ED6
BP : BP1, BP2, BP3, BP4, BP5, BP6, BP7, BP8

RME_1 : RME1_1, RME2, RME3, RME4, RME5, RME6, RME7, RME8
CNE : CNEL1, CNEL2
CNEL1 : CNE1, CNE3, CNE6, CNE8
CNEL2 : CNE2, CNE4, CNE5, CNE7
ED : ED1, ED2, ED3, ED4, ED5, ED6
BP : BP1, BP2, BP3, BP4, BP5, BP6, BP7, BP8
PH_3 : PH1_3a, PH1_3b, PH2_3

RME_1 : RME1_1, RME2, RME3, RME4, RME5, RME6, RME7, RME8
CNE : CNEL1, CNEL2
CNEL1 : CNE1, CNE3, CNE6, CNE8
CNEL2 : CNE2, CNE4, CNE5, CNE7
ED : ED1, ED2, ED3, ED4, ED5, ED6
BP : BP1, BP2, BP3, BP4, BP5, BP6, BP7, BP8
PH_4 : PH1_4, PH2_3

RME_1 : RME1_1, RME2, RME3, RME4, RME5, RME6, RME7, RME8
CNE : CNEL1, CNEL2
CNEL1 : CNE1, CNE3, CNE6, CNE8
CNEL2 : CNE2, CNE4, CNE5, CNE7
ED : ED1, ED2, ED3, ED4, ED5, ED6
BP : BP1, BP2, BP3, BP4, BP5, BP6, BP7, BP8
PH_5 : PH1_5, PH2_3

RME_1 : RME1_1, RME2, RME3, RME4, RME5, RME6, RME7, RME8
CNE : CNEL1, CNEL2
CNEL1 : CNE1, CNE3, CNE6, CNE8
CNEL2 : CNE2, CNE4, CNE5, CNE7
ED : ED1, ED2, ED3, ED4, ED5, ED6
BP_6 : BP1_6, BP2, BP3, BP4, BP5, BP6, BP7, BP8

RME_8 : RME1_8, RME2_8, RME3_8, RME4_8
RME1_8 : RME1a_8
CNE_8 : CNEL1_8, CNEL2_8
CNEL1_8 : CNE1_8, CNE4_8
CNEL2_8 : CNE2_8, CNE3_8
ED_8 : ED1_8, ED2_8
BP_8 : BP1_8, BP2_8, BP3_8, BP4_8

DISPLAY DEVICE AND MANUFACTURING METHOD OF THE SAME

CROSS-REFERENCE TO RELATED APPLICATION(S)

This application claims priority to and benefits of Korean Patent Application No. 10-2022-0124220 under 35 U.S.C. § 119, filed on Sep. 29, 2022, in the Korean Intellectual Property Office (KIPO), the entire contents of which are incorporated herein by reference.

BACKGROUND

1. Technical Field

The disclosure relates to a display device and a manufacturing method of the same.

2. Description of the Related Art

The importance of display devices has steadily increased with the development of multimedia technology. In response thereto, various types of display devices such as an organic light emitting display (OLED), a liquid crystal display (LCD) and the like have been used.

A display device is a device for displaying an image, and includes a display panel, such as an organic light emitting display panel or a liquid crystal display panel. The light emitting display panel may include light emitting elements, e.g., light emitting diodes (LED), and examples of the light emitting diode include an organic light emitting diode (OLED) using an organic material as a fluorescent material and an inorganic light emitting diode using an inorganic material as a fluorescent material.

An inorganic light emitting diode using an inorganic semiconductor as a fluorescent material has an advantage in that it has durability even in a high temperature, and has higher efficiency of blue light than an organic light emitting diode.

SUMMARY

Aspects of the disclosure provide a display device having improved element reliability.

Aspects of the disclosure also provide a method of manufacturing a display device having improved element reliability.

However, aspects of the disclosure are not restricted to those set forth herein. The above and other aspects of the disclosure will become more apparent to one of ordinary skill in the art to which the disclosure pertains by referencing the detailed description of the disclosure given below.

According to an embodiment of the disclosure, a display device may include a display area where an image is displayed, a non-display area disposed adjacent to the display area, a first sub-pixel disposed in the display area, and a second sub-pixel disposed adjacent to the first sub-pixel in the display area. Each of the first sub-pixel and the second sub-pixel may include a plurality of alignment electrodes spaced apart from each other, and a plurality of light emitting elements disposed between adjacent ones of the plurality of alignment electrodes. Each of the plurality of light emitting elements may include a first end having a first polarity, and a second end having a second polarity different from the first polarity. An orientation of the plurality of light emitting elements in the first sub-pixel and an orientation of the plurality of light emitting elements in the second sub-pixel may be symmetrical. The first sub-pixel may include an identification pattern for distinguishing the first sub-pixel from the second sub-pixel.

The plurality of alignment electrodes may include a first alignment electrode and a second alignment electrode spaced apart from each other in the first sub-pixel, and a third alignment electrode and a fourth alignment electrode spaced apart from each other in the second sub-pixel. At least one of the first alignment electrode and the second alignment electrode may include a portion protruding in a direction as the identification pattern.

The first sub-pixel may include an emission area in which the plurality of light emitting elements are disposed. The identification pattern may not overlap the emission area in a plan view.

The second alignment electrode may be disposed between the first alignment electrode and the third alignment electrode. The third alignment electrode may be disposed between the second alignment electrode and the fourth alignment electrode. The plurality of light emitting elements may include a first light emitting element disposed between the first alignment electrode and the second alignment electrode, and a second light emitting element disposed between the third alignment electrode and the fourth alignment electrode. A first end of the first light emitting element may be disposed on the first alignment electrode, a second end of the first light emitting element may be disposed on the second alignment electrode, a first end of the second light emitting element may be disposed on the fourth alignment electrode, and a second end of the second light emitting element may be disposed on the third alignment electrode.

The first sub-pixel and the second sub-pixel may be alternately and repeatedly arranged in the display area.

The display device may further include an external bank defining a first emission area in which the plurality of light emitting elements are disposed in the first sub-pixel and a second emission area in which the plurality of light emitting elements are disposed in the second sub-pixel. The external bank may include a portion protruding in a direction as the identification pattern.

The identification pattern may be disposed adjacent to the first emission area.

The external bank may include a colored dye.

The display device may further include an external bank defining a first emission area in which the plurality of light emitting elements are disposed in the first sub-pixel and a second emission area in which the plurality of light emitting elements are disposed in the second sub-pixel, a first internal bank disposed in the first emission area, and a second internal bank disposed in the second emission area. The first internal bank may include a portion extending beyond the first emission area as the identification pattern.

The external bank may include a transparent material. The first internal bank may include a colored dye.

According to an embodiment of the disclosure, a display device may include a display area where an image is displayed, a non-display area disposed adjacent to the display area, a first sub-pixel disposed in the display area and including a first identification pattern, and a second sub-pixel disposed adjacent to the first sub-pixel in the display area and including a second identification pattern. Each of the first sub-pixel and the second sub-pixel may include a plurality of alignment electrodes spaced apart from each other, and a plurality of light emitting elements disposed between adjacent ones of the plurality of alignment electrodes. Each of the plurality of light emitting elements may include a first end having a first polarity, and a second end having a second polarity different from the first polarity. An orientation of the plurality of light emitting elements in the first sub-pixel and an orientation of the plurality of light emitting elements in the second sub-pixel may be symmetrical. A size of the first identification pattern and a size of the second identification pattern in a plan view may be different from each other.

The display device may further comprise a circuit element layer disposed under the plurality of alignment electrodes and including a first thin film transistor for driving the first sub-pixel and a second thin film transistor for driving the second sub-pixel, and a via insulating layer disposed between the circuit element layer and the plurality of alignment electrodes. The first identification pattern may include a first contact hole penetrating the via insulating layer to electrically connect the first thin film transistor to one of the plurality of alignment electrodes. The second identification pattern may include a second contact hole penetrating the via insulating layer to electrically connect the second thin film transistor to another one of the plurality of alignment electrodes.

A width of the first contact hole may be greater than a width of the second contact hole in a direction.

The first sub-pixel and the second sub-pixel may be alternately and repeatedly arranged in the display area.

The display device may further include an external bank defining a first emission area in which the plurality of light emitting elements are disposed in the first sub-pixel and a second emission area in which the plurality of light emitting elements are disposed in the second sub-pixel, and a first insulating layer disposed on the plurality of alignment electrodes. The first identification pattern may include a first through hole penetrating the first insulating layer and disposed on a side of the first emission area. The second identification pattern may include a second through hole penetrating the first insulating layer and disposed on a side of the second emission area.

Each of the first identification pattern and the second identification pattern may not disposed in the first emission area or the second emission area.

The external bank may include a transparent material.

According to an embodiment of the disclosure, a display device may include a display area where an image is displayed, a non-display area disposed adjacent to the display area, a first sub-pixel disposed in the display area and including first identification patterns, and a second sub-pixel disposed adjacent to the first sub-pixel in the display area and including second identification patterns. Each of the first sub-pixel and the second sub-pixel may include a plurality of alignment electrodes spaced apart from each other, and a plurality of light emitting elements disposed between adjacent ones of the plurality of alignment electrodes. Each of the plurality of light emitting elements may include a first end having a first polarity, and a second end having a second polarity different from the first polarity. An orientation of the plurality of light emitting elements in the first sub-pixel and an orientation of the plurality of light emitting elements in the second sub-pixel may be symmetrical. A number of the first identification patterns may be different from a number of the second identification patterns.

The display device may further include an external bank defining a first emission area in which the plurality of light emitting elements are disposed in the first sub-pixel and a second emission area in which the plurality of light emitting elements are disposed in the second sub-pixel, and a first insulating layer disposed on the plurality of alignment electrodes. The first identification patterns may include first through holes penetrating the first insulating layer and disposed on a side of the first emission area. The second identification patterns may include second through holes penetrating the first insulating layer and disposed on a side of the second emission area. A number of first through holes may be greater than a number of second through holes.

The external bank may include a transparent material.

In the display device according to an embodiment, element reliability may be improved.

The method of manufacturing a display device according to an embodiment may provide a display device having improved element reliability.

However, effects according to the embodiments of the disclosure are not limited to those described above and various other effects are incorporated herein.

BRIEF DESCRIPTION OF THE DRAWINGS

The above and other aspects and features of the disclosure will become more apparent by describing embodiments thereof with reference to the attached drawings, in which.

DETAILED DESCRIPTION OF THE EMBODIMENTS

Figure 1:
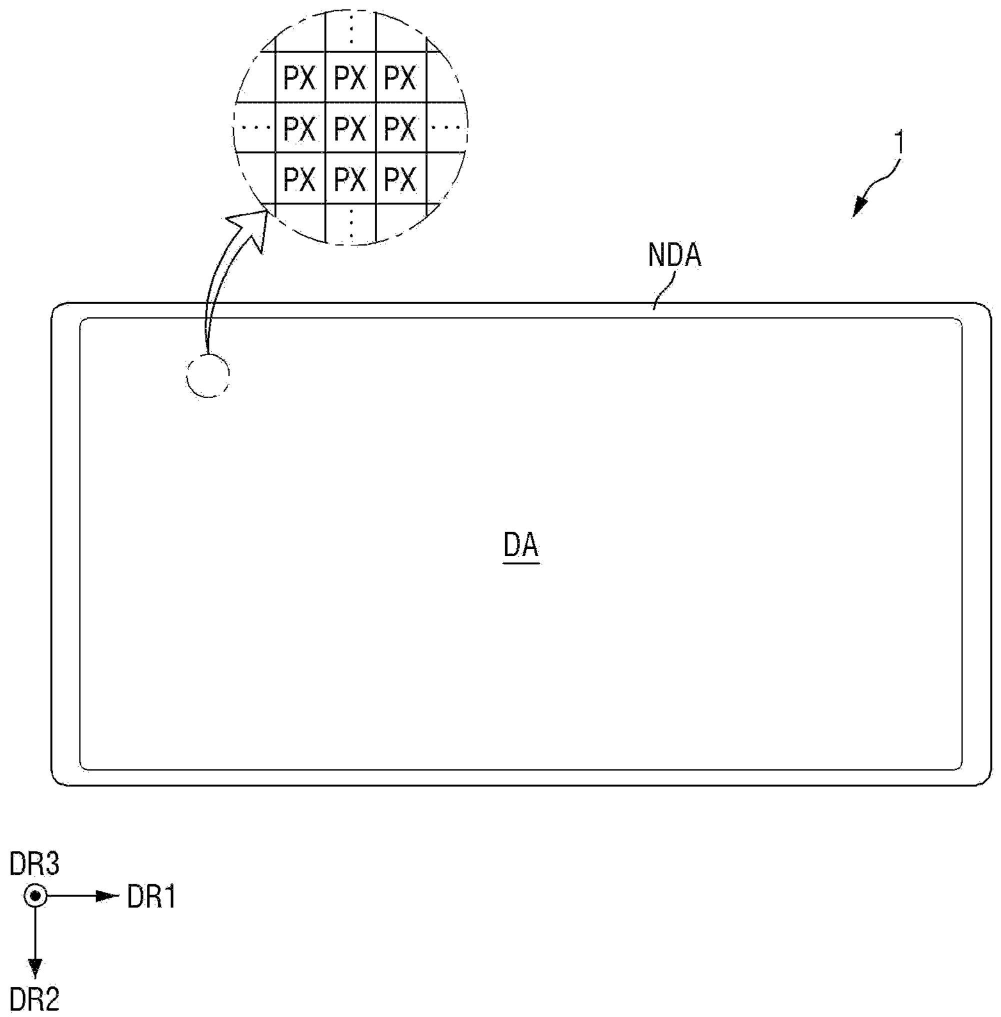
FIG. 1 is a schematic plan view of a display device according to an embodiment.

In the following description, for the purposes of explanation, numerous specific details are set forth in order to provide a thorough understanding of various embodiments or implementations of the disclosure. As used herein "embodiments" and "implementations" are interchangeable words that are non-limiting examples of devices or methods employing one or more of the disclosure disclosed herein. It is apparent, however, that various embodiments may be practiced without these specific details or with one or more equivalent arrangements. In other instances, structures and devices are shown in block diagram form in order to avoid unnecessarily obscuring various embodiments. Further, various embodiments may be different, but do not have to be exclusive nor limit the disclosure. For example, specific shapes, configurations, and characteristics of an embodiment may be used or implemented in other embodiments without departing from the disclosure.

Unless otherwise specified, the illustrated embodiments are to be understood as providing features of varying detail of some ways in which the disclosure may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

Further, the X-axis, the Y-axis, and the Z-axis are not limited to three axes of a rectangular coordinate system, and thus the X-, Y-, and Z-axes, and may be interpreted in a broader sense. For example, the X-axis, the Y-axis, and the Z-axis may be perpendicular to one another, or may represent different directions that are not perpendicular to one another.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, ZZ, or the like. In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

Although the terms "first," "second," and the like may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

The terminology used herein is for the purpose of describing embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the illustrated shapes of regions, but are to include deviations in shapes that result from, for instance, manufacturing. In this manner, regions illustrated in the drawings may be schematic in nature, and the shapes of these regions may not reflect actual shapes of regions of a device and, as such, are not necessarily intended to be limiting.

As customary in the field, some embodiments are described and illustrated in the accompanying drawings in terms of functional blocks, units, parts, and/or modules. Those skilled in the art will appreciate that these blocks, units, parts, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, parts, and/or modules being implemented by microprocessors or other similar hardware, they may be programmed and controlled using software (e.g., microcode) to perform various functions discussed herein and may optionally be driven by firmware and/or software. It is also contemplated that each block, unit, part, and/or module may be implemented by dedicated hardware, or as a combination of dedicated hardware to perform some functions and a processor (e.g., one or more programmed microprocessors and associated circuitry) to perform other functions. Also, each block, unit, part, and/or module of some embodiments may be physically separated into two or more interacting and discrete blocks, units, parts, and/or modules without departing from the scope of the disclosure. Further, the blocks, units, parts, and/or modules of some embodiments may be physically combined into more complex blocks, units, parts, and/or modules without departing from the scope of the disclosure.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, embodiments of the disclosure are described with reference to the accompanying drawings.

FIG. 1 is a schematic plan view of a display device according to an embodiment.

A first direction DR1, a second direction DR2, and a third direction DR3 are defined as shown in FIG. 1. The first direction DR1 and the second direction DR2 may be perpendicular to each other, the first direction DR1 and the third direction DR3 may be perpendicular to each other, and the second direction DR2 and the third direction DR3 may be perpendicular to each other. It may be understood that the first direction DR1 refers to a horizontal direction in the drawing, the second direction DR2 refers to a vertical direction in the drawing, and the third direction DR3 refers to an upward and downward direction (i.e., a thickness direction) in the drawing.

In the following specification, unless otherwise stated, "direction" may refer to both of directions extending in the direction. Further, when it is necessary to distinguish both "directions" extending in both sides, one side will be referred to as "one side in the direction" and the other side will be referred to as "the other side in the direction." Referring to FIG. 1, a direction in which an arrow is directed is referred to as one side, and the opposite direction is referred to as the other side.

Hereinafter, for simplicity of description, when referring to a display device 1 or the surfaces of each member constituting the display device 1, a surface facing to one side in the direction in which the image is displayed, for example, the third direction DR3 is referred to as a top surface, and the opposite surface of the surface is referred to as a bottom surface. However, the disclosure is not limited thereto, and a surface and another surface of the member may be referred to as a front surface and a rear surface, respectively, or may also be referred to as a first surface and a second surface. In describing the relative position of each of the members of the display device 1, one side of the third direction DR3 may be referred to as an upper side and the other side of the third direction DR3 may be referred to as a lower side.

Referring to FIG. 1, a display device 1 may display a moving image or a still image. The display device 1 may be any electronic device providing a display screen. Examples of the display device 1 may include a television, a laptop computer, a monitor, a billboard, an Internet-of-Things device, a mobile phone, a smartphone, a tablet personal computer (PC), an electronic watch, a smart watch, a watch phone, a head-mounted display, a mobile communication terminal, an electronic notebook, an electronic book, a portable multimedia player (PMP), a navigation device, a game machine, a digital camera, a camcorder and the like, which provide a display screen.

The display device 1 may include a display panel which provides a display screen. Examples of the display panel may include an inorganic light emitting diode display panel, an organic light emitting display panel, a quantum dot light emitting display panel, a plasma display panel, and a field emission display panel. In the following description, a case where an inorganic light emitting diode display panel is applied as a display panel will be illustrated, but the disclosure is not limited thereto, and other display panels may be applied within the same scope of technical spirit.

The display device 1 may have various shapes. For example, the display device 1 may have a shape such as a rectangular shape elongated in a horizontal direction, a rectangular shape elongated in a vertical direction, a square shape, a quadrilateral shape with rounded corners (vertices), other polygonal shapes, and a circular shape. The shape of a display area DA of the display device 1 may be similar to the overall shape of the display device 1 in a plan view. FIG. 1 illustrates the display device 1 having a rectangular shape elongated in a second direction DR2.

The display device 1 may include the display area DA and a non-display area NDA. The display area DA may be an area where an image can be displayed, and the non-display area NDA may be an area where an image is not displayed. The display area DA may also be referred to as an active region, and the non-display area NDA may also be referred to as a non-active region. The display area DA may substantially occupy the center of the display device 1.

The display area DA may include multiple pixels PX. The pixels PX may be arranged in a matrix. The shape of each pixel PX may be a rectangular or square shape in plan view. However, the disclosure is not limited thereto, and the shape of the pixel PX may be a rhombic shape in which each side is inclined with respect to a direction. The pixels PX may be arranged in a stripe type or an island type. Each of the pixels PX may include one or more light emitting elements that emit light of a specific wavelength band to display a specific color.

The non-display area NDA may be disposed adjacent to the display area DA. The non-display area NDA may completely or partially surround the display area DA in a plan view. The display area DA may have a rectangular shape, and the non-display area NDA may be disposed adjacent to four sides of the display area DA. The non-display area NDA may form a bezel of the display device 1. Wires or circuit drivers included in the display device 1 may be disposed in the non-display area NDA, or external devices may be mounted thereon.

Figure 2:
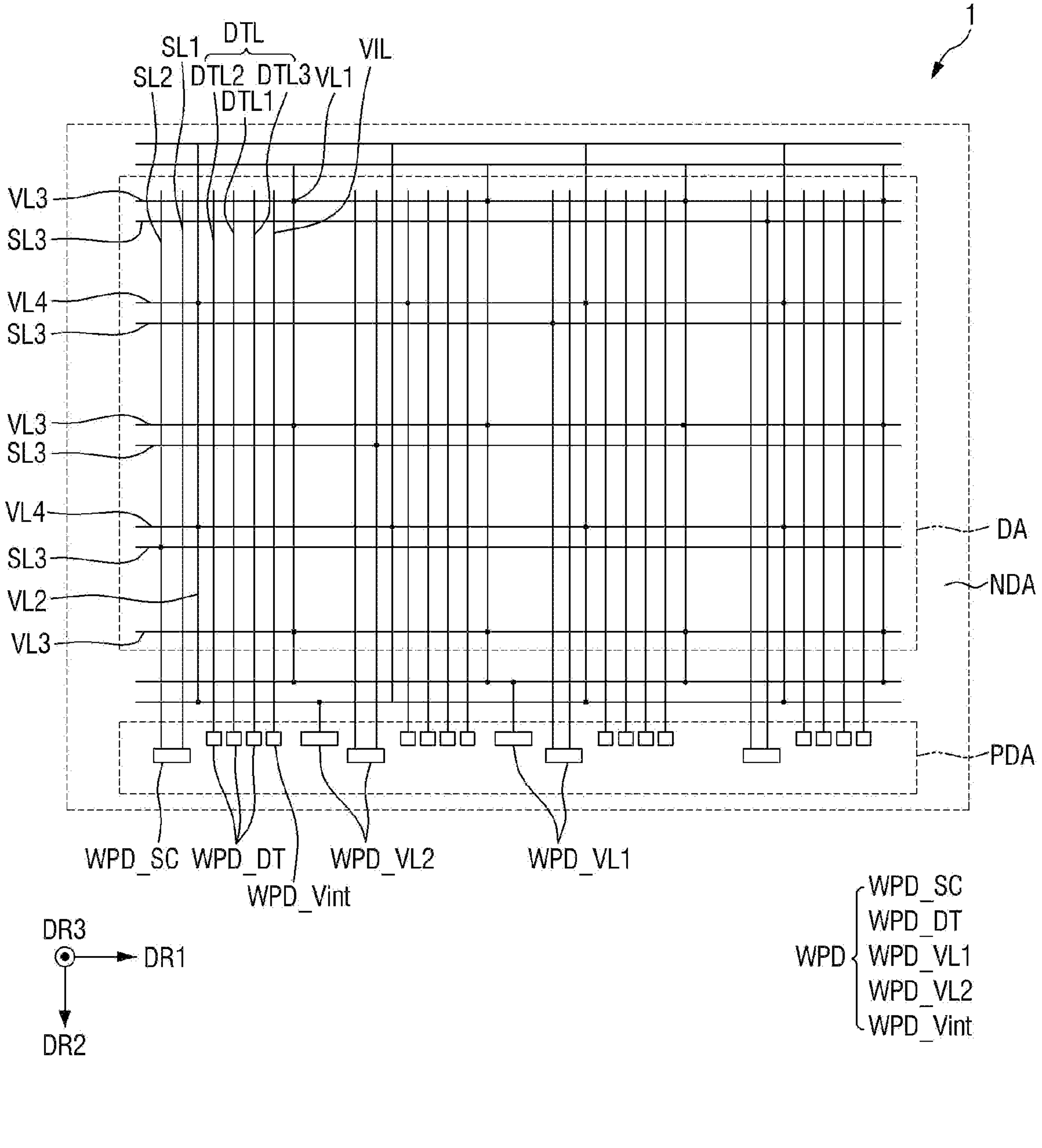
FIG. 2 is a schematic plan view illustrating layout of multiple wires of a display device according to an embodiment.

FIG. 2 is a schematic plan view illustrating layout of multiple wires of a display device according to an embodiment.

Referring to FIG. 2, the display device 1 may include multiple wires. The display device 1 may include multiple scan lines SL (SL1, SL2, and SL3), multiple data lines DTL (DTL1, DTL2, and DTL3), an initialization voltage line VIL, and multiple voltage lines VL1, VL2, VL3, and VL4. Although not shown in the drawing, other wires may be further provided in the display device 1. The wires may include wires formed of a first conductive layer and extending in a first direction DR1, and wires formed of a third conductive layer and extending in the second direction DR2. However, the extension directions of the wires are not limited thereto.

The first scan line SL1 and the second scan line SL2 may extend in the second direction DR2. The first scan line SL1 and the second scan line SL2 may be disposed adjacent to each other, and may be spaced apart from the other first scan line SL1 and second scan line SL2 in the first direction DR1. The first scan line SL1 and the second scan line SL2 may be connected to a scan line pad WPD_SC connected to a scan driver (not illustrated). The first scan line SL1 and the second scan line SL2 may extend from the pad area PDA disposed in the non-display area NDA to the display area DA.

The third scan line SL3 may extend in the first direction DR1, and may be spaced apart from other third scan line SL3 in the second direction DR2. One third scan line SL3 may be connected to one or more first scan lines SL1 or one or more second scan lines SL2. The scan lines SL may have a mesh structure in the entire surface of the display area DA, but the disclosure is not limited thereto.

The term "connected" as used herein may mean not only that a member is connected to another member through a physical contact, but also that a member is connected to another member through yet another member. The term may also be understood as a part and another part as an integral element are connected each other as the integrated element. Furthermore, if an element is connected to another element, this may be construed as a meaning including an electrical connection via another element in addition to a direct connection by physical contact.

The data lines DTL may extend in the second direction DR2. The data line DTL may include a first data line DTL1, a second data line DTL2, and a third data line DTL3, and each of the first to third data lines DTL1, DTL2, and DTL3 may form a pair and disposed adjacent to each other. Each of the data lines DTL1, DTL2, and DTL3 may extend from the pad area PDA disposed in the non-display area NDA to the display area DA. However, the disclosure is not limited thereto, and the data lines DTL may be spaced apart from each other with same distance between a first voltage line VL1 and a second voltage line VL2 to be described below.

The initialization voltage line VIL may extend in the second direction DR2. The initialization voltage line VIL may be disposed between the data lines DTL and the first voltage line VL1. The initialization voltage line VIL may extend from the pad area PDA disposed in the non-display area NDA to the display area DA.

The first voltage line VL1 and the second voltage line VL2 may extend in the second direction DR2, and the third voltage line VL3 and the fourth voltage line VL4 may extend in the first direction DR1. The first voltage line VL1 and the second voltage line VL2 may be alternately arranged in the first direction DR1, and the third voltage line VL3 and the fourth voltage line VL4 may be alternately arranged in the second direction DR2. The first voltage line VL1 and the second voltage line VL2 may extend in the second direction DR2 across the display area DA, and some of the third voltage line VL3 and the fourth voltage line VL4 may be disposed in the display area DA and another of the third voltage line VL3 and the fourth voltage line VL4 may be disposed in the non-display area NDA on both sides of the display area DA in the second direction DR2. The first voltage line VL1 and the second voltage line VL2 may be formed of the first conductive layer, and the third voltage line VL3 and the fourth voltage line VL4 may be formed of the third conductive layer disposed on a layer different from the first conductive layer. The first voltage line VL1 may be connected to at least one third voltage line VL3, the second voltage line VL2 may be connected to at least one fourth voltage line VL4, and the voltage lines VL1, VL2, VL3, and VL4 may have a mesh structure in the entire display area DA. However, the disclosure is not limited thereto.

The first scan line SL1, the second scan line SL2, the data line DTL, the initialization voltage line VIL, the first voltage line VL1, and the second voltage line VL2 may be electrically connected to at least one line pad WPD. Each line pad WPD may be disposed in the non-display area NDA. In an embodiment, each of the line pads WPD may be disposed in the pad area PDA positioned on the lower side of the display area DA, which is the other side of the display area DA in the second direction DR2. The first scan line SL1 and the second scan line SL2 may be connected to the scan line pad WPD_SC disposed in the pad area PDA, and the data lines DTL may be connected to the data line pads WPD_DT different from the scan line pad WPD_SC. The initialization voltage line VIL may be connected to an initialization line pad WPD_Vint, the first voltage line VL1 may be connected to a first voltage line pad WPD_VL1, and the second voltage line VL2 may be connected to a second voltage line pad WPD_VL2. External devices may be mounted on the line pads WPD. The external devices may be mounted on the line pads WPD by applying an anisotropic conductive film, ultrasonic bonding, or the like. FIG. 2 illustrates that each of the line pads WPD is disposed in the pad area PDA disposed on the lower side of the display area DA, but the disclosure is not limited thereto. Some of the line pads WPD may be disposed in an area on the upper side, on the left, or right sides of the display area DA.

Each pixel PX or sub-pixel SPXn (n is an integer of 1 to 3) of the display device 1 may include a pixel driving circuit. The above-described wires may pass through each pixel PX or the vicinity thereof to apply a driving signal to each pixel driving circuit. The pixel driving circuit may include transistors and capacitors. The number of the transistors and the capacitors of each pixel driving circuit is not limited. According to an embodiment, in each sub-pixel SPXn of the display device 1, the pixel driving circuit may have a 3T1C structure including three transistors and one capacitor. Hereinafter, the pixel driving circuit of the 3T1C structure will be described as an example, but the disclosure is not limited thereto, and various other modified structures such as a 2T1C structure, a 7T1C structure, and a 6T1C structure may be applied.

Figure 3:
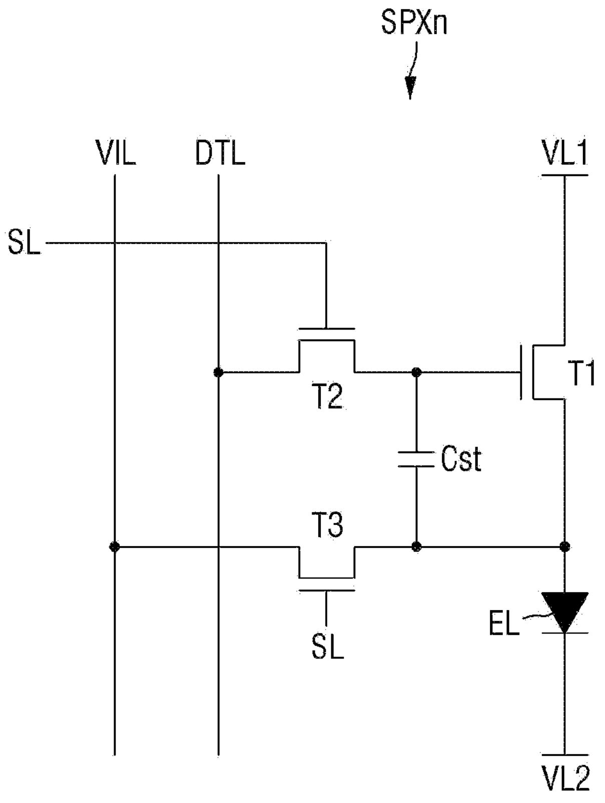
FIG. 3 is a schematic diagram of an equivalent circuit of a pixel of a display device according to an embodiment.

FIG. 3 is a schematic diagram of an equivalent circuit of a pixel of a display device according to an embodiment.

Referring to FIG. 3, each sub-pixel SPXn of the display device 1 according to an embodiment may include three transistors T1, T2 and T3 and one storage capacitor Cst in addition to a light emitting diode EL.

The light emitting diode EL may emit light by a current supplied through a first transistor T1. The light emitting diode EL may include a first electrode, a second electrode, and at least one light emitting element disposed between them. The light emitting element may emit light of a specific wavelength band by electrical signals transmitted from the first electrode and the second electrode.

An end of the light emitting diode EL may be connected to the source electrode of the first transistor T1, and another end thereof may be connected to the second voltage line VL2 to which a low potential voltage (hereinafter, a second power voltage) lower than a high potential voltage (hereinafter, a first power voltage) of the first voltage line VL1 is supplied.

The first transistor T1 may adjust a current flowing from the first voltage line VL1, to which the first power voltage is supplied, to the light emitting diode EL according to the voltage difference between the gate electrode and the source electrode. For example, the first transistor T1 may be a driving transistor for driving the light emitting diode EL. The gate electrode of the first transistor T1 may be connected to the source electrode of the second transistor T2, the source electrode of the first transistor T1 may be connected to the first electrode of the light emitting diode EL, and the drain electrode of the first transistor T1 may be connected to the first voltage line VL1 to which the first power voltage is applied.

The second transistor T2 may be turned on by a scan signal of the scan line SL to connect the data line DTL to the gate electrode of the first transistor T1. The gate electrode of the second transistor T2 may be connected to the scan line SL, the source electrode thereof may be connected to the gate electrode of the first transistor T1, and the drain electrode thereof may be connected to the data line DTL.

The third transistor T3 may be turned on by a scan signal of the scan line SL to connect the initialization voltage line VIL to an end of the light emitting diode EL. The gate electrode of the third transistor T3 may be connected to the scan line SL, the drain electrode thereof may be connected to the initialization voltage line VIL, and the source electrode thereof may be connected to an end of the light emitting diode EL or to the source electrode of the first transistor T1.

The source electrode and the drain electrode of each of the transistors T1, T2, and T3 are not limited to those described above, and may be opposite to each other. Each of the transistors T1, T2, and T3 may be formed of a thin film transistor. In FIG. 3, each of the transistors T1, T2, and T3 is described as an N-type metal oxide semiconductor field effect transistor (MOSFET), but the disclosure is not limited thereto. In an embodiment, each of the transistors T1, T2, and T3 may be formed of a P-type MOSFET. In another embodiment, some of the transistors T1, T2, and T3 may be formed of an N-type MOSFET and others may be formed of a P-type MOSFET.

The storage capacitor Cst may be formed between the gate electrode and the source electrode of the first transistor T1. The storage capacitor Cst may store a difference in voltage between the gate electrode and the source electrode of the first transistor T1.

In an embodiment, the gate electrode of the second transistor T2 may be connected to the scan line SL1, and the gate electrode of the third transistor T3 may be connected to the scan line SL2. For example, the second transistor T2 and the third transistor T3 may be turned on by scan signals applied from different scan lines. However, the disclosure is not limited thereto, and the second transistor T2 and the third transistor T3 may be connected to same scan line to be turned on by a scan signal applied from the same scan line.

Hereinafter, a structure of the pixel PX of the display device 1 according to an embodiment will be described.

Figure 4:
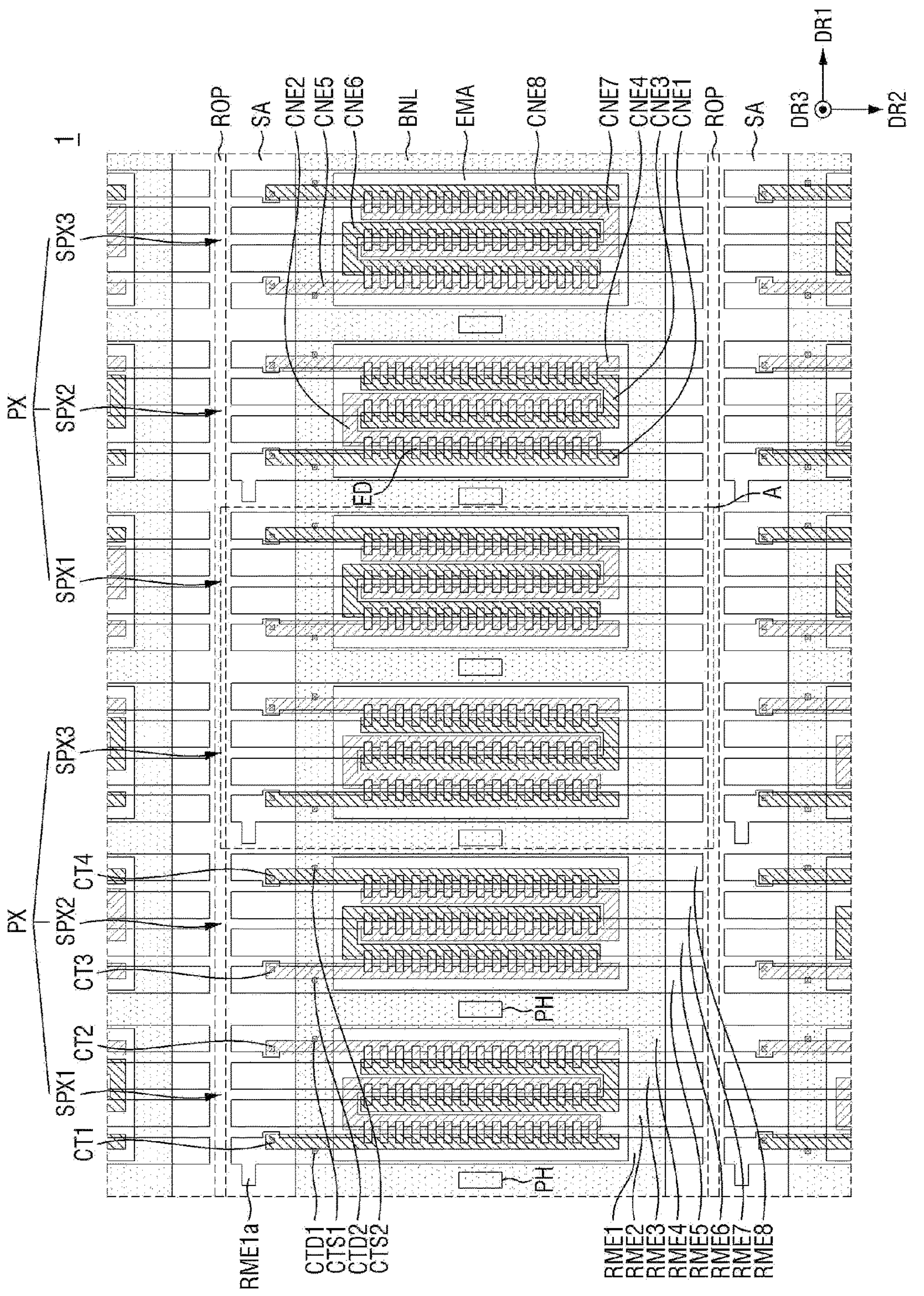
FIG. 4 is a plan view illustrating a structure of a pixel of a display device according to an embodiment.
Figure 5:
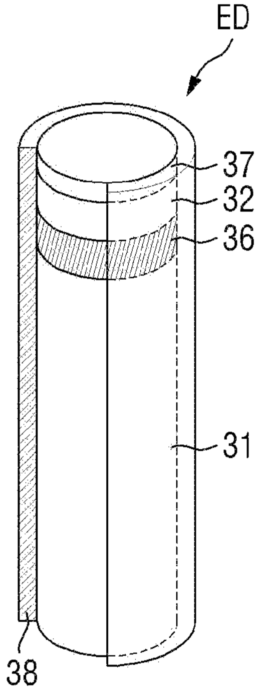
FIG. 5 is a schematic diagram illustrating the structure of the light emitting element of FIG. 4.
Figure 6:
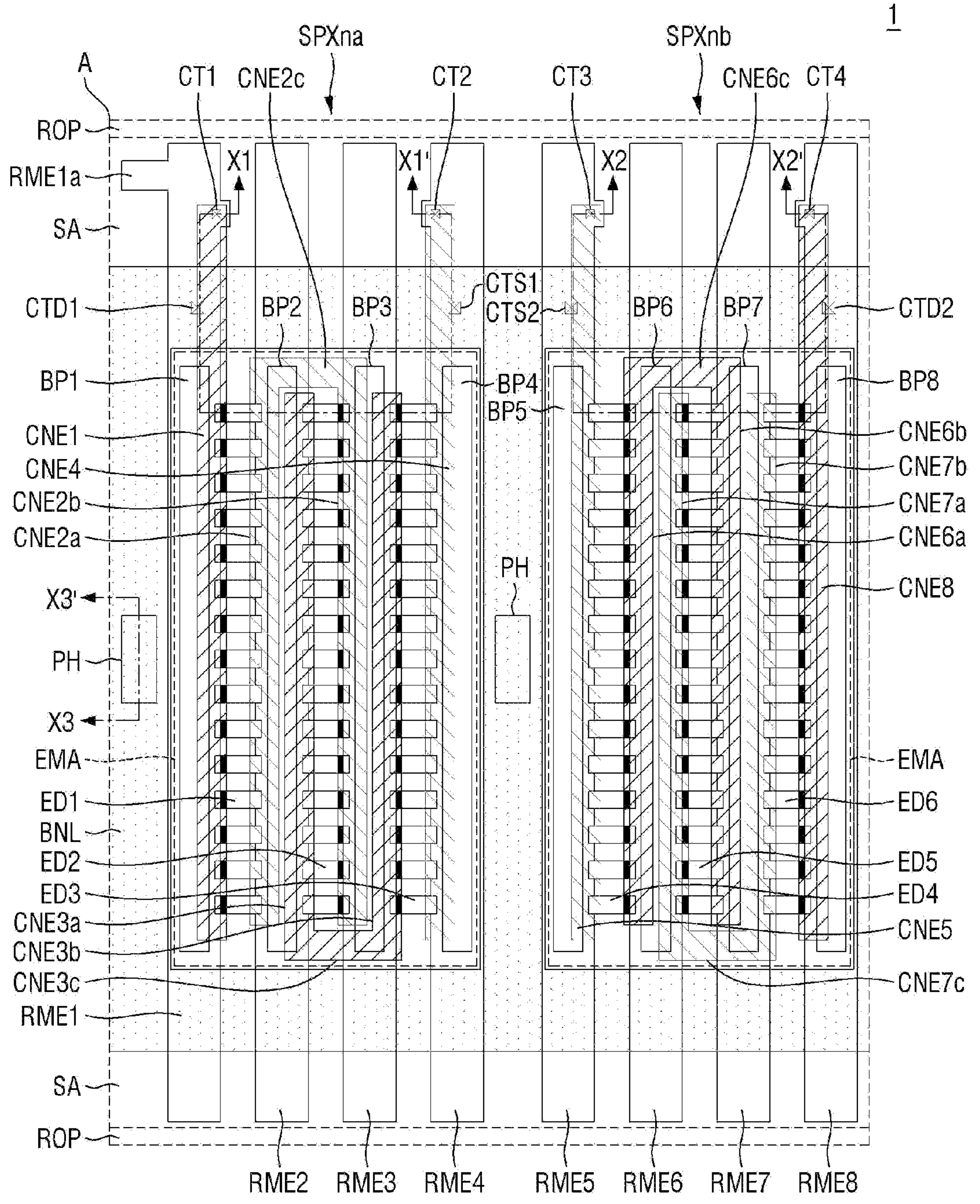
FIG. 6 is an enlarged view of area A of FIG. 4.

FIG. 4 is a plan view illustrating a structure of a pixel of a display device according to an embodiment. FIG. 5 is a schematic diagram illustrating the structure of the light emitting element of FIG. 4. FIG. 6 is an enlarged view of area A of FIG. 4.

FIGS. 4 and 6 illustrate a planar disposition of alignment electrodes RME, an external bank BNL, multiple light emitting elements ED, and a connection electrode CNE disposed in one pixel PX of the display device 1.

Referring to FIGS. 4 and 6, each of the pixels PX of the display device 1 may include multiple sub-pixels SPXn. For example, a pixel PX may include a first sub-pixel SPX1, a second sub-pixel SPX2, and a third sub-pixel SPX3. The first sub-pixel SPX1 may emit light of a first color, the second sub-pixel SPX2 may emit light of a second color, and the third sub-pixel SPX3 may emit light of a third color. For example, the first color may be blue, the second color may be green, and the third color may be red. However, the disclosure is not limited thereto, and the sub-pixels SPXn may emit light of same color. In an embodiment, each of the sub-pixels SPXn may emit blue light. Although it is illustrated in the drawing that a pixel PX includes three sub-pixels SPXn, the disclosure is not limited thereto, and the pixel PX may include a larger number of sub-pixels SPXn. Hereinafter, for simplicity of description, a case where a pixel PX includes three sub-pixels SPXn will be described.

The first sub-pixel SPX1, the second sub-pixel SPX2, and the third sub-pixel SPX3 may be sequentially arranged in the first direction DR1. For example, the first sub-pixel SPX1 may be disposed on a side of the third sub-pixel SPX3 in the first direction DR1.

Accordingly, at least one sub-pixel SPXn of a pixel PX may be disposed adjacent to at least one sub-pixel SPXn of adjacent pixel PX. For example, with reference to FIG. 4, the third sub-pixel SPX3 of the pixel PX disposed in the first direction DR1 may be disposed adjacent the first sub-pixel SPX1 of a pixel PX disposed adjacent to the pixel PX in the first direction DR1.

Each sub-pixel SPXn of the display device 1 may include an emission area EMA and a non-emission area. The emission area EMA may be an area in which the light emitting element ED is disposed to emit light of a specific wavelength band. The non-emission area may be a region in which the light emitting element ED is not disposed and a region from which light is not emitted because light emitted from the light emitting element ED does not reach there.

The emission area EMA may be defined by the external bank BNL. For example, the emission area EMA may be a space surrounded by the external bank BNL. In embodiments, the emission area EMA may have a rectangular shape including a short side in the first direction DR1 and a long side in the second direction DR2 in a plan view, but the disclosure is not limited thereto.

Multiple insulating layers may be disposed on an edge area surrounding the emission area EMA defined by the external bank BNL, and the insulating layers may include a through hole PH penetrating the insulating layers. The through hole PH may be disposed to correspond to each of the sub-pixels SPXn, and may serve to discharge out-gas that may be generated in a circuit element layer to be described below. A detailed description thereof will be given below.

The emission area EMA may include a region in which the light emitting element ED is disposed, and a region adjacent to the light emitting element ED in which the light emitted from the light emitting element ED is emitted. For example, the emission area EMA may include a region in which the light emitted from the light emitting element ED is reflected or refracted by another member and emitted. The light emitting elements ED may be disposed in each sub-pixel SPXn, and the emission area may include an area where the light emitting elements ED are disposed and an area adjacent thereto.

Although it is shown in the drawing that the sub-pixels SPXn have the emission areas EMA that are substantially identical in size in a plan view, the disclosure is not limited thereto. In embodiments, the emission areas EMA of the sub-pixels SPXn may have different sizes according to a color or wavelength band of light emitted from the light emitting element ED disposed therein.

Each sub-pixel SPXn may further include a sub-region SA disposed in the non-emission area. The sub-region SA may be a divided area according to the disposition of the alignment electrodes RME. The sub-region SA may be disposed on a side and another side of the emission area EMA in the second direction DR2. The emission areas EMA may be alternately arranged in the first direction DR1, and the sub-region SA may extend in the first direction DR1. Each of emission areas EMA and the sub-regions SA may be repeatedly disposed in the second direction DR2. Each of the emission areas EMA may be disposed between the sub-regions SA.

The sub-region SA may be a region shared by the sub-pixels SPXn adjacent to each other in the first direction DR1. For example, the first sub-pixel SPX1, the second sub-pixel SPX2, and the third sub-pixel SPX3 may share the sub-region SA. The sub-region SA may be a region shared by the sub-pixels SPXn adjacent to each other in the second direction DR2. For example, the sub-regions SA disposed on both sides of the external bank BNL in the second direction DR2 illustrated in FIG. 4 may be shared by the sub-pixel SPXn illustrated in the drawing and the sub-pixels SPXn not illustrated in the drawing and adjacent to the sub-pixel SPXn in the second direction DR2.

Light may not be emitted from the sub-region SA because the light emitting element ED is not disposed in the sub-region SA, and an alignment electrode RME disposed in each sub-pixel SPXn may extend to the sub-region SA. The alignment electrodes RME disposed in different sub-pixels SPXn may be separated at a separation portion ROP of the sub-region SA.

Multiple alignment electrodes RME and the connection electrodes CNE may be disposed in each sub-pixel SPXn in a shape extending in the second direction DR2.

The alignment electrode RME may include a first alignment electrode RME1, a second alignment electrode RME2, a third alignment electrode RME3, a fourth alignment electrode RME4, a fifth alignment electrode RME5, a sixth alignment electrode RME6, a seventh alignment electrode RME7, and an eighth alignment electrode RME8 sequentially arranged in one side of the first direction DR1. The first alignment electrode RME1, the second alignment electrode RME2, the third alignment electrode RME3, the fourth alignment electrode RME4, the fifth alignment electrode RME5, the sixth alignment electrode RME6, the seventh alignment electrode RME7, and the eighth alignment electrode RME8 may be spaced apart from each other in the first direction DR1. The alignment electrodes RME may be spaced apart from each other in the first direction DR1 to provide a space in which the light emitting element ED is disposed.

The first alignment electrode RME1, the second alignment electrode RME2, the third alignment electrode RME3, the fourth alignment electrode RME4, the fifth alignment electrode RME5, the sixth alignment electrode RME6, the seventh alignment electrode RME7, and the eighth alignment electrode RME8 may be repeatedly disposed as a unit. For example, on a side of the eighth alignment electrode RME8 in the first direction DR1, the first alignment electrode RME1, the second alignment electrode RME2, the third alignment electrode RME3, the fourth alignment electrode RME4, the fifth alignment electrode RME5, the sixth alignment electrode RME6, the seventh alignment electrode RME7, and the eighth alignment electrode RME8 may be sequentially disposed.

The first alignment electrode RME1, the second alignment electrode RME2, the third alignment electrode RME3, the fourth alignment electrode RME4, the fifth alignment electrode RME5, the sixth alignment electrode RME6, the seventh alignment electrode RME7, and the eighth alignment electrode RME8 may be applied with different alignment signals AC and GND (see FIG. 16) in a display device manufacturing process according to an embodiment to be described below. A detailed description thereof will be given below.

Each sub-pixel SPXn of a pixel PX may include four alignment electrodes RME that are sequentially arranged. The disposition of the alignment electrode RME in each sub-pixel SPXn of a pixel PX may vary according to the repeated disposition of the alignment electrode RME described above. For example, the disposition of the alignment electrodes RME in each sub-pixel SPXn of two adjacent pixels PX may be different.

For example, the first sub-pixel SPX1 of the pixel PX (hereinafter, referred to as a "first pixel") disposed in an opposite direction of the first direction DR1 in FIG. 4 may include the first alignment electrode RME1, the second alignment electrode RME2, the third alignment electrode RME3, and the fourth alignment electrode RME4, the second sub-pixel SPX2 of the first pixel may include the fifth alignment electrode RME5, the sixth alignment electrode RME6, the seventh alignment electrode RME7, and the eighth alignment electrode RME8, and the third sub-pixel SPX3 of the first pixel may include the first alignment electrode RME1, the second alignment electrode RME2, the third alignment electrode RME3, and the fourth alignment electrode RME4. Referring to FIG. 4, the first sub-pixel SPX1 of the pixel PX (hereinafter referred to as a "second pixel") disposed adjacent to the first pixel in the first direction DR1 may be disposed adjacent to the third sub-pixel SPX3 of the first pixel, which is disposed in an opposite direction of the first direction DR1, and thus may include the fifth alignment electrode RME5, the sixth alignment electrode RME6, the seventh alignment electrode RME7, and the eighth alignment electrode RME8 by the repeated disposition of the above-described alignment electrode RME, the second sub-pixel SPX2 of the second pixel may include the first alignment electrode RME1, the second alignment electrode RME2, the third alignment electrode RME3, and the fourth alignment electrode RME4, and the third sub-pixel SPX3 of the second pixel may include the fifth alignment electrode RME5, the sixth alignment electrode RME6, the seventh alignment electrode RME7, and the eighth alignment electrode RME8.

Hereinafter, for simplicity of description, the sub-pixel SPXn including the first alignment electrode RME1, the second alignment electrode RME2, the third alignment electrode RME3, and the fourth alignment electrode RME4 may be referred to as a "first type sub-pixel SPXna," and the sub-pixel SPXn including the fifth alignment electrode RME5, the sixth alignment electrode RME6, the seventh alignment electrode RME7, and the eighth alignment electrode RME8 may be referred to as a "second type sub-pixel SPXnb." With reference to FIG. 4, the first type sub-pixel SPXna may include the first sub-pixel SPX1 of the first pixel, the third sub-pixel SPX3 of the first pixel, and the second sub-pixel SPX2 of the second pixel, and the second type sub-pixel SPXnb may include the second sub-pixel SPX2 of the first pixel, the first sub-pixel SPX1 of the second pixel, and the third sub-pixel SPX3 of the second pixel. Accordingly, in the above-described disposition of the sub-pixel SPXn, it may be understood that the first type sub-pixel SPXna and the second type sub-pixels SPXnb are disposed adjacent to each other in the display area DA and are alternately and repeatedly disposed in the first direction DR1.

The first alignment electrode RME1 of the first type sub-pixel SPXna may have a shape that generally extends in the second direction DR2. The first alignment electrode RME1 may include a protruding portion RME1*a* protruding in the first direction DR1. The protruding portion RME1*a* may be an identification pattern for identifying the sub-pixel SPXn in which the alignment signal is inverted in a display device manufacturing process to be described below.

The protruding portion RME1*a* may not be disposed in the emission area EMA. This may be not to affect the process of aligning the light emitting element ED in the manufacturing process of the display device 1 to be described below.

In embodiments, the protruding portion RME1*a* may be disposed in the sub-region SA disposed on the another side of the external bank BNL in the second direction DR2, but the disclosure is not limited thereto. For example, the protruding portion RME1*a* may be disposed in the sub-region SA disposed on the side of the external bank BNL in the second direction DR2. FIGS. 4 and 6 illustrate that the protruding portion RME1*a* is disposed in the sub-region SA disposed on the another side of the external bank BNL in the second direction DR2.

Further, in embodiments, the protruding portion RME1*a* may protrude in the first direction DR1, but the disclosure is not limited thereto. For example, the protruding portion RME1*a* may protrude in the second direction DR2. FIGS. 4 and 6 illustrate that the protruding portion RME1*a* protrudes in the first direction DR1.

The first alignment electrode RME1 may be electrically connected to a circuit element layer to be described below through a first electrode contact hole CTD1 (see FIG. 7). The first alignment electrode RME1 may receive the first power voltage described above through the first electrode contact hole CTD1.

The second alignment electrode RME2 of the first type sub-pixel SPXna may be disposed on a side of the first alignment electrode RME1 in the first direction DR1. The second alignment electrode RME2 may have a shape that generally extends in the second direction DR2. The light emitting element ED may be disposed in a space between the second alignment electrode RME2 and the first alignment electrode RME1.

The third alignment electrode RME3 of the first type sub-pixel SPXna may be disposed on a side of the second alignment electrode RME2 in the first direction DR1. The third alignment electrode RME3 may have a shape that generally extends in the second direction DR2. The light emitting element ED may be disposed in a space between the third alignment electrode RME3 and the second alignment electrode RME2.

The fourth alignment electrode RME4 of the first type sub-pixel SPXna may be disposed on a side of the third alignment electrode RME3 in the first direction DR1. The fourth alignment electrode RME4 may have a shape that generally extends in the second direction DR2. The light emitting element ED may be disposed in a space between the fourth alignment electrode RME4 and the third alignment electrode RME3.

The fourth alignment electrode RME4 may be electrically connected to a circuit element layer to be described below through a second electrode contact hole CTS1 (see FIG. 7). The fourth alignment electrode RME4 may receive the second power voltage described above through the second electrode contact hole CTS1.

The fifth alignment electrode RME5 of the second type sub-pixel SPXnb may have a shape that generally extends in the second direction DR2. The fifth alignment electrode RME5 may be disposed on a side of the fourth alignment electrode RME4 in the first direction DR1. Between the fifth alignment electrode RME5 and the fourth alignment electrode RME4, the external bank BNL distinguishing the emission area EMA of the first type sub-pixel SPXna and the emission area EMA of the second type sub-pixel SPXnb may be disposed, and the light emitting element ED may not be disposed.

In embodiments, a distance between the fifth alignment electrode RME5 and the fourth alignment electrode RME4 may be greater than a distance between the first alignment electrode RME1, the second alignment electrode RME2, the third alignment electrode RME3, and the fourth alignment electrode RME4, but the disclosure is not limited thereto.

The fifth alignment electrode RME5 may be electrically connected to a circuit element layer to be described below through a third electrode contact hole CTS2 (see FIG. 8). The fifth alignment electrode RME5 may receive the second power voltage described above through the third electrode contact hole CTS2.

The sixth alignment electrode RME6 of the second type sub-pixel SPXnb may be disposed on a side of the fifth alignment electrode RME5 in the first direction DR1. The sixth alignment electrode RME6 may have a shape that generally extends in the second direction DR2. The light emitting element ED may be disposed in a space between the sixth alignment electrode RME6 and the fifth alignment electrode RME5.

The seventh alignment electrode RME7 of the second type sub-pixel SPXnb may be disposed on a side of the sixth alignment electrode RME6 in the first direction DR1. The seventh alignment electrode RME7 may have a shape that generally extends in the second direction DR2. The light emitting element ED may be disposed in a space between the seventh alignment electrode RME7 and the sixth alignment electrode RME6.

The eighth alignment electrode RME8 of the second type sub-pixel SPXnb may be disposed on a side of the seventh alignment electrode RME7 in the first direction DR1. The eighth alignment electrode RME8 may have a shape that generally extends in the second direction DR2. The light emitting element ED may be disposed in a space between the eighth alignment electrode RME8 and the seventh alignment electrode RME7.

The eighth alignment electrode RME8 may be electrically connected to a circuit element layer to be described below through a fourth electrode contact hole CTD2 (see FIG. 8). The eighth alignment electrode RME8 may receive the first power voltage described above through the fourth electrode contact hole CTD2.

The first electrode contact hole CTD1, the second electrode contact hole CTS1, the fourth electrode contact hole CTD2, and the third electrode contact hole CTS2 may not be disposed in the emission area EMA. In embodiments, the first electrode contact hole CTD1, the second electrode contact hole CTS1, the fourth electrode contact hole CTD2, and the third electrode contact hole CTS2 may be disposed to overlap the external bank BNL, but the disclosure is not limited thereto. For example, the first electrode contact hole CTD1, the second electrode contact hole CTS1, the fourth electrode contact hole CTD2, and the third electrode contact hole CTS2 may be disposed in the sub-region SA. FIGS. 4 and 6 illustrate that the first electrode contact hole CTD1, the second electrode contact hole CTS1, the fourth electrode contact hole CTD2, and the third electrode contact hole CTS2 overlap the external bank BNL in a plan view.

As described above, the second alignment electrode RME2, the third alignment electrode RME3, the fourth alignment electrode RME4, the fifth alignment electrode RME5, the sixth alignment electrode RME6, the seventh alignment electrode RME7, and the eighth alignment electrode RME8 except for the first alignment electrode RME1 including the protruding portion RME1*a* may have substantially same shape in a plan view. Accordingly, the first type sub-pixel SPXna including the first alignment electrode RME1 may be distinguished from the second type sub-pixel SPXnb. For example, the first type sub-pixel SPXna and the second type sub-pixel SPXnb may be distinguished by the protruding portion RME1*a* included in the first alignment electrode RME1 as an identification pattern. This may facilitate orientation alignment measurement of the light emitting element by identifying the sub-pixel SPXn in which the alignment signal is inverted in a display device manufacturing process to be described below. A detailed description thereof will be given below.

As illustrated in FIG. 6, multiple internal banks BP may be disposed under the alignment electrodes RME. The internal banks BP may be disposed in the emission area EMA of the sub-pixel SPXn. The internal banks BP may include a first internal bank BP1, a second internal bank BP2, a third internal bank BP3, a fourth internal bank BP4, a fifth internal bank BP5, a sixth internal bank BP6, a seventh internal bank BP7, and an eighth internal bank BP8 having a rectangular shape extending in the second direction DR2 in plan view. The first internal bank BP1, the second internal bank BP2, the third internal bank BP3, the fourth internal bank BP4, the fifth internal bank BP5, the sixth internal bank BP6, the seventh internal bank BP7, and the eighth internal bank BP8 may be spaced apart from each other in the first direction DR1.

The first internal bank BP1 may be disposed under the first alignment electrode RME1 in the emission area EMA of the first type sub-pixel SPXna, the second internal bank BP2 may be disposed under the second alignment electrode RME2 in the emission area EMA of the first type sub-pixel SPXna, the third internal bank BP3 may be disposed under the third alignment electrode RME3 in the emission area EMA of the first type sub-pixel SPXna, and the fourth internal bank BP4 may be disposed under the fourth alignment electrode RME4 in the emission area EMA of the first type sub-pixel SPXna.

The fifth internal bank BP5 may be disposed under the fifth alignment electrode RME5 in the emission area EMA of the second type sub-pixel SPXnb, the sixth internal bank BP6 may be disposed under the sixth alignment electrode RME6 in the emission area EMA of the second type sub-pixel SPXnb, the seventh internal bank BP7 may be disposed under the seventh alignment electrode RME7 in the emission area EMA of the second type sub-pixel SPXnb, and the eighth internal bank BP8 may be disposed under the eighth alignment electrode RME8 in the emission area EMA of the second type sub-pixel SPXnb.

In embodiments, the alignment electrodes RME may completely cover each internal bank BP disposed under each alignment electrode RME in the emission area EMA, but the disclosure is not limited thereto. For example, the alignment electrodes RME may partially cover each internal bank BP disposed under each alignment electrode RME in the emission area EMA. FIG. 6 illustrates that the alignment electrodes RME completely cover each internal bank BP disposed under each alignment electrode RME in the emission area EMA.

The light emitting elements ED may be disposed on the alignment electrode RME.

Referring to FIG. 5, the light emitting element ED may be a light emitting diode. In an embodiment, the light emitting element ED may be an inorganic light emitting diode that has a nanometer or micrometer size, and is made of an inorganic material. The light emitting element ED may be aligned between two electrodes having polarity in case that an electric field is formed in a specific direction between two electrodes facing each other.

The light emitting element ED according to an embodiment may have a shape elongated in a direction. The light emitting element ED may have a shape of a cylinder, a rod, a wire, a tube, or the like. However, the shape of the light emitting element ED is not limited thereto, and the light emitting element ED may have a polygonal prism shape such as a regular cube, a rectangular parallelepiped, and a hexagonal prism, or may have various shapes such as a shape elongated in a direction and having an outer surface partially inclined.

The light emitting element ED may include a semiconductor layer doped with a conductivity type (e.g., p-type or n-type) dopant. The semiconductor layer may emit light of a specific wavelength band by receiving an electrical signal applied from an external power source. The light emitting element ED may include a first semiconductor layer 31, a second semiconductor layer 32, a light emitting layer 36, an electrode layer 37, and an insulating film 38.

The first semiconductor layer 31 may be an n-type semiconductor. The first semiconductor layer 31 may include a semiconductor material having a chemical formula of $Al_xGa_yIn_{1-x-y}N$ ($0 \le x \le 1$, $0 \le y \le 1$, $0 \le x+y \le 1$). For example, the first semiconductor layer 31 may include AlGaInN, GaN, AlGaN, InGaN, AlN, InN, or a combination thereof doped with an n-type dopant. The n-type dopant doped into the first semiconductor layer 31 may be Si, Ge, Sn, Se, or the like.

The second semiconductor layer 32 may be disposed on the first semiconductor layer 31 with the light emitting layer 36 therebetween. The second semiconductor layer 32 may be a p-type semiconductor, and the second semiconductor layer 32 may include a semiconductor material having a chemical formula of $Al_xGa_yIn_{1-x-y}N$ ($0 \leq x \leq 1$, $0 \leq y \leq 1$, $0 \leq x+y \leq 1$). For example, the second semiconductor layer 32 may include AlGaInN, GaN, AlGaN, InGaN, AlN, InN, or a combination thereof doped with a p-type dopant. The p-type dopant doped into the second semiconductor layer 32 may be Mg, Zn, Ca, Ba, or the like.

Although it is illustrated in the drawing that the first semiconductor layer 31 and the second semiconductor layer 32 are configured as one layer, the disclosure is not limited thereto. Depending on the material of the light emitting layer 36, the first semiconductor layer 31 and the second semiconductor layer 32 may further include additional layers, such as a cladding layer or a tensile strain barrier reducing (TSBR) layer. For example, the light emitting element ED may include another semiconductor layer disposed between the first semiconductor layer 31 and the light emitting layer 36 or between the second semiconductor layer 32 and the light emitting layer 36. The semiconductor layer disposed between the first semiconductor layer 31 and the light emitting layer 36 may include AlGaInN, GaN, AlGaN, InGaN, AlN, InN, SLs, or a combination thereof doped with an n-type dopant, and the semiconductor layer disposed between the second semiconductor layer 32 and the light emitting layer 36 may include AlGaInN, GaN, AlGaN, InGaN, AlN, InN, or a combination thereof doped with a p-type dopant.

The light emitting layer 36 may be disposed between the first semiconductor layer 31 and the second semiconductor layer 32. The light emitting layer 36 may include a material having a single or multiple quantum well structure. In case that the light emitting layer 36 includes a material having a multiple quantum well structure, multiple quantum layers and well layers may be alternately stacked each other. The light emitting layer 36 may emit light by coupling electron-hole pairs according to an electrical signal applied through the first semiconductor layer 31 and the second semiconductor layer 32. The light emitting layer 36 may include a material such as AlGaN, AlGaInN, or InGaN. For example, in case that the light emitting layer 36 has a multiple quantum well structure in which quantum layers and well layers are alternately stacked each other, the quantum layer may include a material such as AlGaN or AlGaInN, and the well layer may include a material such as GaN or AlInN.

The light emitting layer 36 may have a structure in which semiconductor materials having large band gap energy and semiconductor materials having small band gap energy are alternately stacked each other, and may include group III to V semiconductor materials depending on the wavelength band of the emitted light. The light emitted by the light emitting layer 36 is not limited to the light of the blue wavelength band, and the light emitting layer 36 may emit light of a red or green wavelength band in another embodiment.

The electrode layer 37 may be an ohmic connection electrode. However, the disclosure is not limited thereto, and the electrode layer 37 may be a Schottky connection electrode. The light emitting element ED may include at least one electrode layer 37. The light emitting element ED may include one or more electrode layers 37, but the disclosure is not limited thereto, and the electrode layer 37 may be omitted.

In the display device 1, in case that the light emitting element ED is electrically connected to an electrode or a connection electrode, the electrode layer 37 may reduce a resistance between the light emitting element ED and the electrode or connection electrode. The electrode layer 37 may include a conductive metal. For example, the electrode layer 37 may include at least one of aluminum (Al), titanium (Ti), indium (In), gold (Au), silver (Ag), ITO, IZO, and ITZO. With the above-described configuration, both ends of each of the light emitting elements ED may have different polarities.

The insulating film 38 may be arranged to surround the outer surfaces of the semiconductor layers and electrode layers described above. For example, the insulating film 38 may be disposed to surround at least the outer surface of the light emitting layer 36, and may expose both ends of the light emitting element ED in the longitudinal direction. Further, in cross-sectional view, the insulating film 38 may have a top surface, which is rounded in a region adjacent to at least one end of the light emitting element ED.

The insulating film 38 may include at least one materials having insulating property, for example, silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), or titanium oxide ($TiO_x$). It is illustrated in the drawing that the insulating film 38 is formed as a single layer, but the disclosure is not limited thereto. In embodiments, the insulating film 38 may be formed in a multilayer structure having multiple layers stacked each other.

The insulating film 38 may perform a function of protecting the semiconductor layers and the electrode layer of the light emitting element ED. The insulating film 38 may prevent an electrical short circuit that may occur at the light emitting layer 36 in case that an electrode to which an electrical signal is transmitted directly contacts the light emitting element ED. The insulating film 38 may prevent a decrease in luminous efficiency of the light emitting element ED.

Further, the insulating film 38 may have an outer surface surface-treated. The light emitting elements ED may be aligned by spraying an ink in which the light emitting elements ED are dispersed on the electrodes. The surface of the insulating film 38 may be treated to have a hydrophobic property or hydrophilic property in order to keep the light emitting elements ED in the dispersed state without being aggregated with other adjacent light emitting elements ED in the ink.

Referring to FIG. 6, the light emitting element ED may include the first light emitting element ED1, the second light emitting element ED2, the third light emitting element ED3, the fourth light emitting element ED4, the fifth light emitting element ED5, and the sixth light emitting element ED6. The first light emitting element ED1, the second light emitting element ED2, and the third light emitting element ED3 may be disposed in the first type sub-pixel SPXna, and the fourth light emitting element ED4, the fifth light emitting element ED5, and the sixth light emitting element ED6 may be disposed in the second type sub-pixel SPXnb.

For example, in the emission area EMA of the first type sub-pixel SPXna, the first light emitting element ED1 may be disposed in a space between the first alignment electrode RME1 and the second alignment electrode RME2, the second light emitting element ED2 may be disposed in a space between the second alignment electrode RME2 and the third alignment electrode RME3, and the third light emitting element ED3 may be disposed in a space between the third alignment electrode RME3 and the fourth alignment electrode RME4.

In the emission area EMA of the second type sub-pixel SPXnb, the fourth light emitting element ED4 may be disposed in a space between the fifth alignment electrode RME5 and the sixth alignment electrode RME6, the fifth light emitting element ED5 may be disposed in a space between the sixth alignment electrode RME6 and the seventh alignment electrode RME7, and the sixth light emitting element ED6 may be disposed in a space between the seventh alignment electrode RME7 and the eighth alignment electrode RME8.

In the light emitting elements ED illustrated in FIG. 6, for example, in each of the first light emitting element ED1, the second light emitting element ED2, the third light emitting element ED3, the fourth light emitting element ED4, the fifth the light emitting element ED5, and the sixth light emitting element ED6, a hatched portion is illustrated. The hatched portion in each of the light emitting elements ED may be the light emitting layer 36 illustrated in FIG. 5. Hereinafter, for simplicity of description, a portion adjacent to the hatched portion of the light emitting element ED will be referred to as "one end" and the opposite end of one end will be referred to as "the other end." However, the disclosure is not limited thereto, and the light emitting element ED may have more than two ends.

One end and the other end of the light emitting element ED may have different polarities. For example, one end of the light emitting element ED may be a portion adjacent to the second semiconductor layer 32 with respect to the structure of the light emitting element ED illustrated in FIG. 5, and the other end of the light emitting element ED may be a portion adjacent to the first semiconductor layer 31. Accordingly, one ends of the light emitting elements ED may have same polarity, and the other ends of the light emitting elements ED may have same polarity.

In the specification, it may be understood that the orientation of the light emitting element ED is defined according to a relative position of the one end or the other end of the light emitting element ED. For example, while one end of the first light emitting element ED1 may face opposite direction of the first direction DR1 and the other end thereof may face the first direction and on the other hand, one end of the second light emitting element ED2 faces the first direction DR1, and the other end thereof faces the opposite direction of the first direction DR1, so that it may be understood that the first light emitting element ED1 and the second light emitting element ED2 are arranged in opposite orientations. While one end of the first light emitting element ED1 faces the opposite direction of the first direction DR1 and the other end thereof faces the first direction, similarly to the first light emitting element ED1, one end of the third light emitting element ED3 may face the opposite direction of the first direction DR1, and the other end thereof may face the first direction DR1, so that it may be understood that the first light emitting element ED1 and the third light emitting element ED3 are arranged in the same orientation.

As described above, since one end and the other end of the light emitting element ED have different polarities, one end and the other end of the light emitting element ED may be oriented differently depending on the type of the alignment signal applied to the alignment electrode RME.

For example, one end of the first light emitting element ED1 may be disposed on the first alignment electrode RME1 of the first type sub-pixel SPXna, the other end of the first light emitting element ED1 and the other end of the second light emitting element ED2 may be disposed on the second alignment electrode RME2, one end of the second light emitting element ED2 and one end of the third light emitting element ED3 may be disposed on the third alignment electrode RME3, and the other end of the fourth light emitting element ED4 may be disposed on the fourth alignment electrode RME4.

The other end of the fourth light emitting element ED4 may be disposed on the fifth alignment electrode RME5 of the second type sub-pixel SPXnb, one end of the fourth light emitting element ED4 and one end of the fifth light emitting element ED5 may be disposed on the sixth alignment electrode RME6, the other end of the fifth light emitting element ED5 and the other end of the sixth light emitting element ED6 may be disposed on the seventh alignment electrode RME7, and one end of the sixth light emitting element ED6 may be disposed on the eighth alignment electrode RME8.

As described above, the orientation of the light emitting elements ED disposed in the first type sub-pixel SPXna and the orientation of the light emitting elements ED disposed in the second type sub-pixel SPXnb may be symmetrical. In other words, with respect to the emission area EMA of each of the first type sub-pixel SPXna and the second type sub-pixel SPXnb, the first light emitting element ED1 and the fourth light emitting element ED4 may have the same relative position but opposite orientations from each other, the second light emitting element ED2 and the fifth light emitting element ED5 may have the same relative position but opposite orientations from each other, and the third light emitting element ED3 and the sixth light emitting element ED6 may have the same relative position but opposite orientations from each other. This may be to prevent the alignment of the light emitting element ED in the space between the fourth alignment electrode RME4 of the first type sub-pixel SPXna and the fifth alignment electrode RME5 of the second type sub-pixel SPXnb in a method of manufacturing a display device to be described below. A detailed description thereof will be given below.

Referring to FIGS. 4 and 6, the connection electrode CNE may be disposed on the light emitting elements ED. The connection electrode CNE may include a first connection electrode layer CNEL1 and a second connection electrode layer CNEL2. The first connection electrode layer CNEL1 and the second connection electrode layer CNEL2 may be distinguished according to a stacking order. For example, in the display device manufacturing process, the first connection electrode layer CNEL1 may be formed before the second connection electrode layer CNEL2. The stacking relationship of the first connection electrode layer CNLE1 and the second connection electrode layer CNEL2 will be described below.

The first connection electrode layer CNEL1 may include the first connection electrode CNE1 and a third connection electrode CNE3 disposed in the first type sub-pixel SPXna and a sixth connection electrode CNE6 and an eighth connection electrode CNE8 disposed in the second type sub-pixel SPXnb. The second connection electrode layer CNEL2 may include the second connection electrode CNE2 and a fourth connection electrode CNE4 disposed in the first type sub-pixel SPXna and a fifth connection electrode CNE5 and a seventh connection electrode CNE7 disposed in the second type sub-pixel SPXnb.

The first connection electrode CNE1 of the first type sub-pixel SPXna may have a shape that generally extends in the second direction DR2. The first connection electrode CNE1 may be disposed on the first alignment electrode RME1.

A portion of the first connection electrode CNE1 may be connected to the first alignment electrode RME1 through a first contact portion CT1 disposed outside of the emission area EMA, and another portion of the first connection electrode CNE1 may be electrically connected to one end of the first light emitting element ED1 in the emission area EMA. Accordingly, the first connection electrode CNE1 may be supplied with the above-described first power voltage through the first alignment electrode RME1.

The second connection electrode CNE2 of the first type sub-pixel SPXna may have an 'n' shape in plan view. The second connection electrode CNE2 may be disposed on the second alignment electrode RME2 or the third alignment electrode RME3.

The second connection electrode CNE2 may include a first portion CNE2*a* that is disposed on the second alignment electrode RME2 and extends in the second direction DR2, a second portion CNE2*b* that is disposed on the third alignment electrode RME3 and extends in the second direction DR2, and a connection portion CNE2*c* that extends in the first direction DR1 and connects a portion of the first portion CNE2*a* in the opposite direction of the second direction DR2 to a portion of the second portion CNE2*b* in the opposite direction of the second direction DR2.

The first portion CNE2*a* of the second connection electrode CNE2 may be electrically connected to the other end of the first light emitting element ED1, and the second portion CNE2*b* may be electrically connected to one end of the second light emitting element ED2.

The third connection electrode CNE3 of the first type sub-pixel SPXna may have a 'u' shape in plan view. The third connection electrode CNE3 may be disposed on the second alignment electrode RME2 or the third alignment electrode RME3.

The third connection electrode CNE3 may include a first portion CNE3*a* that is disposed on the second alignment electrode RME2 and extends in the second direction DR2, a second portion CNE3*b* that is disposed on the third alignment electrode RME3 and extends in the second direction DR2, and a connection portion CNE3*c* that extends in the first direction DR1 and connects a portion of the first portion CNE3*a* in the second direction DR2 to a portion of the second portion CNE3*b* in the second direction DR2.

The first portion CNE3*a* of the third connection electrode CNE3 may be electrically connected to the other end of the second light emitting element ED2, and the second portion CNE3*b* may be electrically connected to one end of the third light emitting element ED3.

The fourth connection electrode CNE4 of the first type sub-pixel SPXna may have a shape that generally extends in the second direction DR2. The fourth connection electrode CNE4 may be disposed on the fourth alignment electrode RME4.

A portion of the fourth connection electrode CNE4 may be connected to the fourth alignment electrode RME4 through a second contact portion CT2 outside of the emission area EMA, and another portion of the fourth connection electrode CNE4 may be electrically connected to the other end of the third light emitting element ED3 in the emission area EMA. Accordingly, the fourth connection electrode CNE4 may be supplied with the above-described second power voltage through the fourth alignment electrode RME4.

The fifth connection electrode CNE5 of the second type sub-pixel SPXnb may have a shape that generally extends in the second direction DR2. The fifth connection electrode CNE5 may be disposed on the fifth alignment electrode RME5.

A portion of the fifth connection electrode CNE5 may be connected to the fifth alignment electrode RME5 through a third contact portion CT3 outside of the emission area EMA, and another portion of the fifth connection electrode CNE5 may be electrically connected to the other end of the fourth light emitting element ED4 in the emission area EMA. Accordingly, the fifth connection electrode CNE5 may be supplied with the above-described second power voltage through the fifth alignment electrode RME5.

The sixth connection electrode CNE6 of the second type sub-pixel SPXnb may have an 'n' shape in plan view. The sixth connection electrode CNE6 may be disposed on the sixth alignment electrode RME6 or the seventh alignment electrode RME7.

The sixth connection electrode CNE6 may include a first portion CNE6*a* that is disposed on the sixth alignment electrode RME6 and extends in the second direction DR2, a second portion CNE6*b* that is disposed on the seventh alignment electrode RME7 and extends in the second direction DR2, and a connection portion CNE6*c* that extends in the first direction DR1 and connects a portion of the first portion CNE6*a* in the opposite direction of the second direction DR2 to a portion of the second portion CNE6*b* in the opposite direction of the second direction DR2.

The first portion CNE6*a* of the sixth connection electrode CNE6 may be electrically connected to one end of the fourth light emitting element ED4, and the second portion CNE6*b* may be electrically connected to the other end of the fifth light emitting element ED5.

The seventh connection electrode CNE7 of the second type sub-pixel SPXnb may have a 'u' shape in plan view. The seventh connection electrode CNE7 may be disposed on the sixth alignment electrode RME6 or the seventh alignment electrode RME7.

The seventh connection electrode CNE7 may include a first portion CNE7*a* that is disposed on the sixth alignment electrode RME6 and extends in the second direction DR2, a second portion CNE7*b* that is disposed on the seventh alignment electrode RME7 and extends in the second direction DR2, and a connection portion CNE7*c* that extends in the first direction DR1 and connects a portion of the first portion CNE7*a* in the second direction DR2 to a portion of the second portion CNE7*b* in the second direction DR2.

The first portion CNE7*a* of the seventh connection electrode CNE7 may be electrically connected to one end of the fifth light emitting element ED5, and the second portion CNE7*b* may be electrically connected to the other end of the sixth light emitting element ED6.

The eighth connection electrode CNE8 of the second type sub-pixel SPXnb may have a shape that generally extends in the second direction DR2. The eighth connection electrode CNE8 may be disposed on the eighth alignment electrode RME8.

A portion of the eighth connection electrode CNE8 may be connected to the eighth alignment electrode RME8 through a fourth contact portion CT4 outside of the emission area EMA, and another portion of the eighth connection electrode CNE8 may be electrically connected to the other end of the sixth light emitting element ED6 in the emission area EMA. Accordingly, the eighth connection electrode CNE8 may be supplied with the above-described second power voltage through the eighth alignment electrode RME8.

Hereinafter, a stacked structure of elements constituting the display device 1 according to an embodiment will be described.

Figure 7:
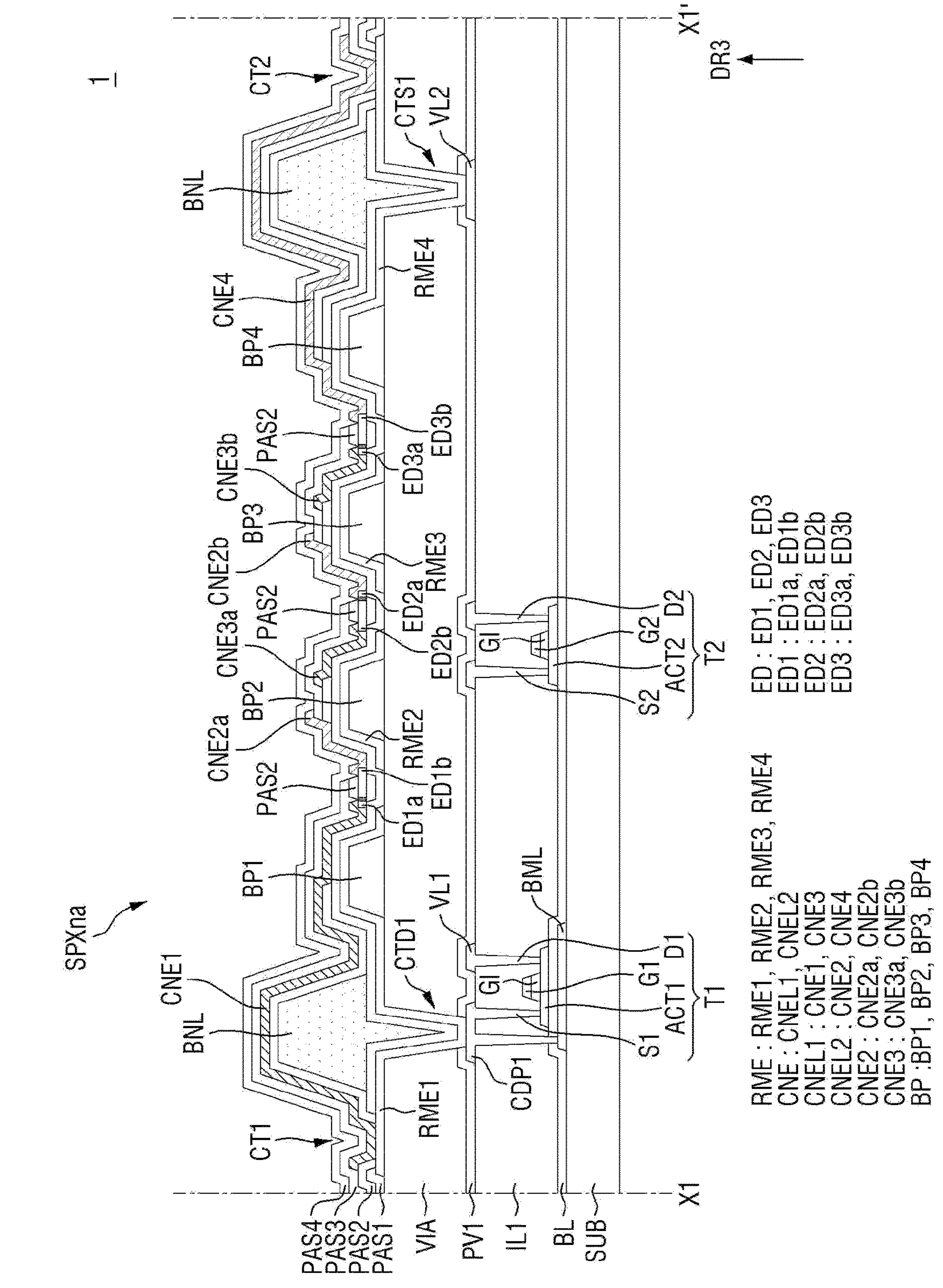
FIG. 7 is a schematic cross-sectional view illustrating a cross section taken along line X1-X1' of FIG. 6.

FIG. 7 is a schematic cross-sectional view illustrating a cross section taken along line X1-X1' of FIG. 6. FIG. 8 is a schematic cross-sectional view illustrating a cross section taken along line X2-X2' of FIG. 6. FIG. 9 is a schematic cross-sectional view illustrating a cross section taken along line X3-X3' of FIG. 6.

Figure 8:
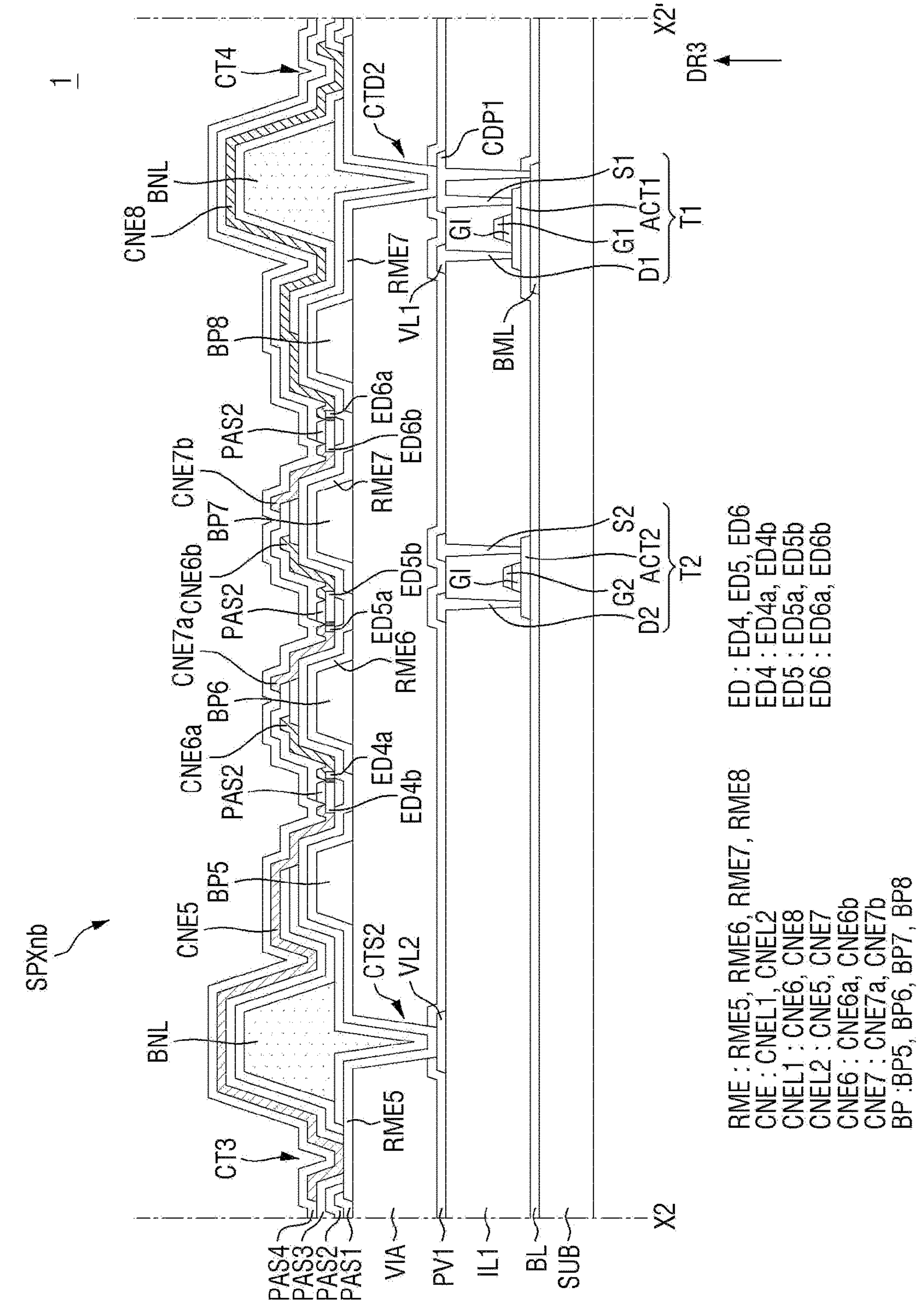
FIG. 8 is a schematic cross-sectional view illustrating a cross section taken along line X2-X2' of FIG. 6.
Figure 9:
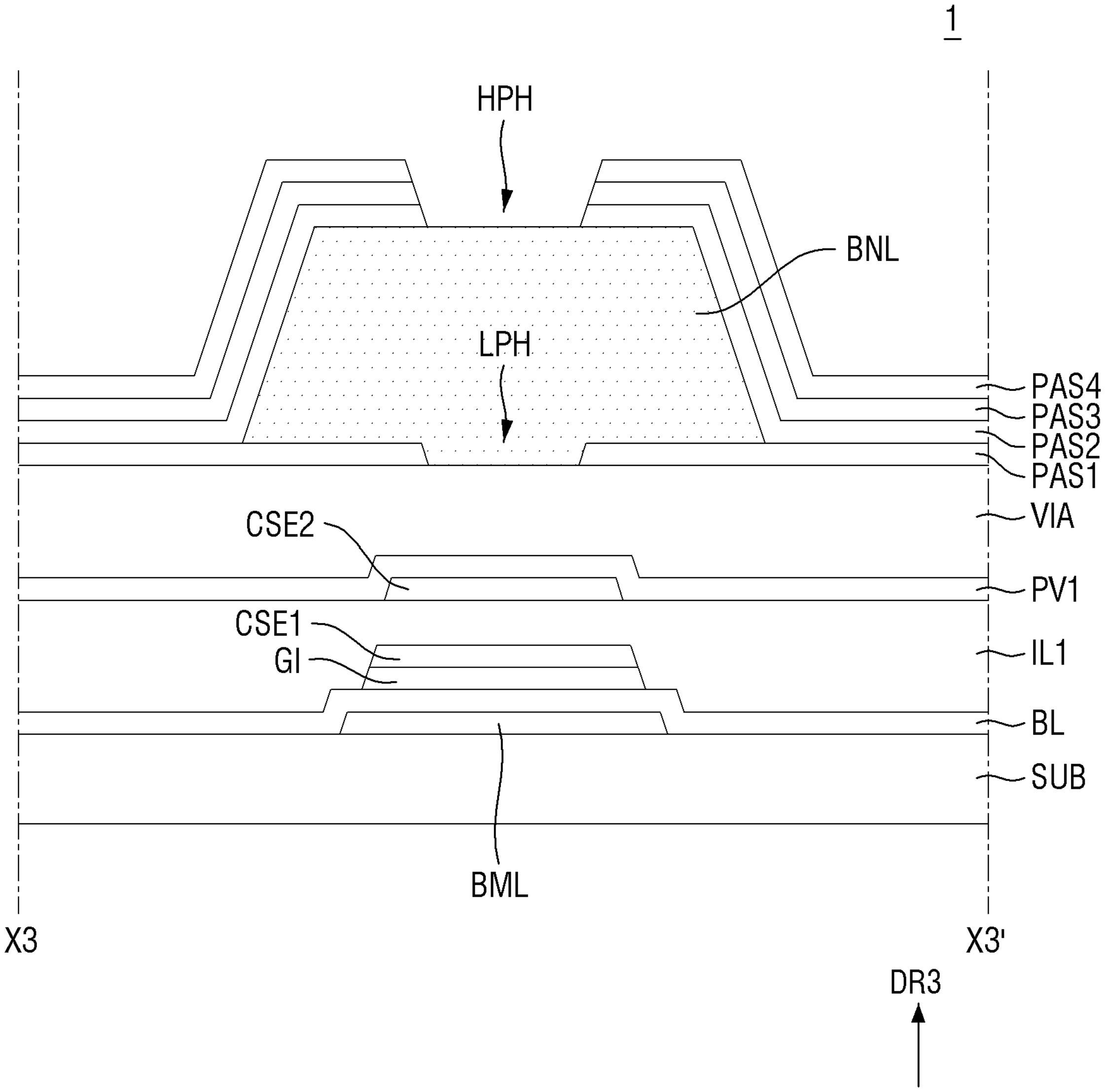
FIG. 9 is a schematic cross-sectional view illustrating a cross section taken along line X3-X3' of FIG. 6.

FIG. 7 illustrates a cross section crossing multiple electrode contact holes CTD1 and CTS1, multiple contact portions CT1 and CT2, the first light emitting element ED1, the second light emitting element ED2, and the third light emitting element ED3, FIG. 8 illustrates a cross section crossing multiple electrode contact holes CTD2 and CTS2, multiple contact portions CT3 and CT4, the fourth light emitting element ED4, the fifth light emitting element ED5, and the sixth light emitting element ED6, and FIG. 9 illustrates a cross section crossing the through hole PH.

A cross-sectional structure of the display device 1 according to an embodiment will be described with reference to FIGS. 7 to 9. The display device 1 may include a substrate SUB, and a semiconductor layer, multiple conductive layers, and multiple insulating layers disposed on the substrate SUB. As described above, the display device 1 may include multiple electrodes RME, the light emitting element ED, and the connection electrode CNE. Each of the semiconductor layer, the conductive layer, and the insulating layer may constitute a circuit element layer of the display device 1.

The substrate SUB may be made of an insulating material such as glass, quartz, or polymer resin. The substrate SUB may be a rigid substrate, or may be a flexible substrate which can be bent, folded, or rolled.

The circuit element layer may be disposed on the substrate SUB. In the circuit element layer, various wires that transmit electrical signals to the light emitting element ED disposed on the substrate SUB may be disposed. The circuit element layer may include a first conductive layer, a semiconductor layer, a second conductive layer, and a third conductive layer as conductive layers as illustrated in FIGS. 7 to 9, and may include a buffer layer BL, a first gate insulating layer GI, a first interlayer insulating layer IL1, a first passivation layer PV1, and the like as insulating layers.

A first conductive layer may be disposed on the substrate SUB. The first conductive layer may include a lower metal layer BML that is disposed to overlap a first active layer ACT1 of a first transistor T1 in a plan view. The lower metal layer BML may prevent light from entering the first active layer ACT1 of the first transistor T1, or may be electrically connected to the first active layer ACT1 to stabilize electrical characteristics of the first transistor T1. However, the lower metal layer BML may be omitted.

The buffer layer BL may be disposed on the lower metal layer BML and the substrate SUB. The buffer layer BL may be formed on the substrate SUB to protect the transistors of the pixel PX from moisture permeating through the substrate SUB susceptible to moisture permeation, and may perform a surface planarization function.

The semiconductor layer may be disposed on the buffer layer BL. The semiconductor layer may include the first active layer ACT1 of the first transistor T1 and a second active layer ACT2 of the second transistor T2. The first active layer ACT1 and the second active layer ACT2 may be disposed to partially overlap a first gate electrode G1 and a second gate electrode G2 of a second conductive layer to be described below, respectively.

The semiconductor layer may include polycrystalline silicon, monocrystalline silicon, an oxide semiconductor, and the like. In another embodiment, the semiconductor layer may include polycrystalline silicon. The oxide semiconductor may be an oxide semiconductor containing indium (In). For example, the oxide semiconductor may be at least one of indium tin oxide (ITO), indium zinc oxide (IZO), indium gallium oxide (IGO), indium zinc tin oxide (IZTO), indium gallium tin oxide (IGTO), indium gallium zinc oxide (IGZO), and indium gallium zinc tin oxide (IGZTO).

Although it is illustrated in the drawing that the first transistor T1 and the second transistor T2 are disposed in the pixel PX of the display device 1, the disclosure is not limited thereto and the display device 1 may include a larger number of transistors.

A first gate insulating layer GI may be disposed on the semiconductor layer in the display area DA. The first gate insulating layer GI may serve as a gate insulating layer of each of the transistors T1 and T2. Although it is illustrated in the drawing that the first gate insulating layer GI is patterned together with the gate electrodes G1 and G2 of the second conductive layer to be described below and partially disposed between the second conductive layer and the active layers ACT1 and ACT2 of the semiconductor layer, the disclosure is not limited thereto. In embodiments, the first gate insulating layer GI may be entirely disposed on the buffer layer BL.

The second conductive layer may be disposed on the first gate insulating layer GI. The second conductive layer may include the first gate electrode G1 of the first transistor T1, the second gate electrode G2 of the second transistor T2, and a first capacitor electrode CSE1 of the storage capacitor Cst (see FIG. 3). The first gate electrode G1 may be disposed to overlap the channel region of the first active layer ACT1 in a third direction DR3 that is a thickness direction, and the second gate electrode G2 may be disposed to overlap the channel region of the second active layer ACT2 in the third direction DR3 that is the thickness direction. The first capacitor electrode CSE1 may overlap the lower metal layer BML in the third direction DR3.

A first interlayer insulating layer IL1 may be disposed on the second conductive layer. The first interlayer insulating layer IL1 may function as an insulating film between the second conductive layer and other layers disposed thereon, and may protect the second conductive layer.

A third conductive layer may be disposed on the first interlayer insulating layer ILL The third conductive layer may include the first voltage line VL1 and the second voltage line VL2 disposed in the display area DA, a first conductive pattern CDP1, source electrodes S1 and S2 and drain electrodes D1 and D2 of each of the transistors T1 and T2, and a second capacitor electrode CSE2 of the storage capacitor Cst (see FIG. 3).

The first voltage line VL1 may be applied with a high potential voltage (or a first power voltage) transmitted to the first alignment electrode RME1, and the second voltage line VL2 may be applied with a low potential voltage (or a second power voltage) transmitted to the second alignment electrode RME2. The first voltage line VL1 may contact a portion of the first active layer ACT1 of the first transistor T1 through a contact hole that penetrates the first interlayer insulating layer ILL The first voltage line VL1 may serve as a first drain electrode D1 of the first transistor T1. The first voltage line VL1 may be connected (e.g., directly connected) to the first alignment electrode RME1, and the second voltage line VL2 may be connected (e.g., directly connected) to the second alignment electrode RME2.

The first conductive pattern CDP1 may contact the first active layer ACT1 of the first transistor T1 through the contact hole penetrating the first interlayer insulating layer ILL The first conductive pattern CDP1 may contact the lower metal layer BML through another contact hole penetrating the first interlayer insulating layer IL1 and the buffer layer BL. The first conductive pattern CDP1 may serve as a first source electrode S1 of the first transistor T1. Further, the first conductive pattern CDP1 may be connected to the first electrode RME1 or the first connection electrode CNE1 to be described below. The first transistor T1 may transmit the first power voltage applied from the first voltage line VL1 to the first electrode RME1 or the first connection electrode CNE1.

The second source electrode S2 and the second drain electrode D2 may contact the second active layer ACT2 of the second transistor T2 through contact holes penetrating the first interlayer insulating layer ILL The second capacitor electrode CSE2 may overlap the first capacitor electrode CSE1 in the third direction DR3 as illustrated in FIG. 9.

A first passivation layer PV1 may be disposed on the third conductive layer. The first passivation layer PV1 may function as an insulating layer between the third conductive layer and other layers and may protect the third conductive layer.

The buffer layer BL, the first gate insulating layer GI, the first interlayer insulating layer IL1, and the first passivation layer PV1 described above may be formed of multiple inorganic layers alternately stacked each other. For example, the buffer layer BL, the first gate insulating layer GI, the first interlayer insulating layer IL1, and the first passivation layer PV1 may be formed as a double layer formed by stacking, or a multilayer formed by alternately stacking, inorganic layers each other, the inorganic layer including at least one of silicon oxide ($SiO_x$), silicon nitride ($SiN_x$), and silicon oxynitride ($SiO_xN_y$).

A via insulating layer VIA may be disposed on the circuit element layer. In an embodiment, the via insulating layer VIA may be disposed on the first passivation layer PV1 of the circuit element layer. The via insulating layer VIA may include an organic insulating material such as polyimide, and may form a flat top surface while a height difference due to various wires in the circuit element layer is compensated.

The internal bank BP may be disposed on the top surface of the via insulating layer VIA. For example, the via insulating layer VIA and the internal bank BP may directly contact each other.

The internal banks BP may be disposed on the via insulating layer VIA. The internal bank BP may have a side surface that is inclined or curved with a certain curvature, and the light emitted from the light emitting element ED may be reflected by the alignment electrode RME disposed on the internal bank BP and be emitted in the third direction DR3. The internal banks BP may include an organic insulating material made of a transparent material such as polyimide, but the disclosure is not limited thereto. For example, the internal banks BP may include a colored dye such as a black pigment.

The internal bank BP may include the first internal bank BP1, the second internal bank BP2, the third internal bank BP3, and the fourth internal bank BP4 disposed in the emission area EMA of the first type sub-pixel SPXna and the fifth internal bank BP5, the sixth internal bank BP6, the seventh internal bank BP7, and the eighth internal bank BP8 disposed in the emission area EMA of the second type sub-pixel SPXnb.

The alignment electrodes RME may be disposed on the internal bank BP and the via insulating layer VIA.

In the first type sub-pixel SPXna, as illustrated in FIG. 7, the first alignment electrode RME1 may be disposed on the first internal bank BP1 and extend in a direction toward the second internal bank BP2, the second alignment electrode RME2 may be disposed on the second internal bank BP2 and extend in a direction toward the first internal bank BP1 and a direction toward the third internal bank BP3, the third alignment electrode RME3 may be disposed on the third internal bank BP3 and extend in a direction toward the second internal bank BP2 and a direction toward the fourth internal bank BP4, and the fourth alignment electrode RME4 may be disposed on the fourth internal bank BP4 and extend in a direction toward the third internal bank BP3.

A distance between the first alignment electrode RME1 and the second alignment electrode RME2, the second alignment electrode RME2 and the third alignment electrode RME3, and the third alignment electrode RME3 and the fourth alignment electrode RME4 may be narrower than a distance between the first internal bank BP1 and the second internal bank BP2, the second internal bank BP2 and the third internal bank BP3, and the third internal bank BP3 and the fourth internal bank BP4 in a cross-sectional view. The first alignment electrode RME1, the second alignment electrode RME2, the third alignment electrode RME3, and the fourth alignment electrode RME4 may each have at least a portion directly disposed on the via insulating layer VIA and be disposed on a same plane.

The first alignment electrode RME1 may contact the first conductive pattern CDP1 through the first electrode contact hole CTD1 penetrating the via insulating layer VIA and the first passivation layer PV1. The fourth alignment electrode RME4 may contact the second voltage line VL2 through the second electrode contact hole CTS1 penetrating the via insulating layer VIA and the first passivation layer PV1.

In the second type sub-pixel SPXnb, as illustrated in FIG. 8, the fifth alignment electrode RME5 may be disposed on the fifth internal bank BP5 and extend in a direction toward the sixth internal bank BP6, the sixth alignment electrode RME6 may be disposed on the sixth internal bank BP6 and extend in a direction toward the fifth internal bank BP5 and a direction toward the seventh internal bank BP7, the seventh alignment electrode RME7 may be disposed on the seventh internal bank BP7 and extend in a direction toward the sixth internal bank BP6 and a direction toward the eighth internal bank BP8, and the eighth alignment electrode RME8 may be disposed on the eighth internal bank BP8 and extend in a direction toward the seventh internal bank BP7.

A distance between the fifth alignment electrode RME5 and the sixth alignment electrode RME6, the sixth alignment electrode RME6 and the seventh alignment electrode RME7, and the seventh alignment electrode RME7 and the eighth alignment electrode RME8 may be narrower than a distance between the fifth internal bank BP5 and the sixth internal bank BP6, the sixth internal bank BP6 and the seventh internal bank BP7, and the seventh internal bank BP7 and the eighth internal bank BP8 in a cross-sectional view. The fifth alignment electrode RME5, the sixth alignment electrode RME6, the seventh alignment electrode RME7, and the eighth alignment electrode RME8 may each have at least a portion directly disposed on the via insulating layer VIA and be disposed on a same plane.

The fifth alignment electrode RME5 may contact the second voltage line VL2 through the third electrode contact hole CTS2 penetrating the via insulating layer VIA and the first passivation layer PV1. The eighth alignment electrode RME8 may contact the first conductive pattern CDP1 through the fourth electrode contact hole CTD2 penetrating the via insulating layer VIA and the first passivation layer PV1.

The alignment electrode RME may reflect light emitted from the light emitting element ED. For example, the light emitting elements ED may be disposed between the internal banks BP to emit light in both end directions, and the emitted light may be directed to the alignment electrodes RME disposed on the internal banks BP. Accordingly, the light emitted from the light emitting element ED may be reflected by the alignment electrode RME to be emitted in the third direction DR3.

The alignment electrodes RME may include a conductive material having high reflectivity. For example, the alignment electrodes RME may include a metal such as silver (Ag), copper (Cu), or aluminum (Al), or an alloy including aluminum (Al), nickel (Ni), lanthanum (La), or the like. In another example, the electrodes RME may have a structure in which metal layer including titanium (Ti), molybdenum (Mo), and niobium (Nb) and the alloy are stacked each other. In embodiments, the alignment electrodes RME may be formed as a double layer or a multilayer formed by stacking at least one metal layer made of an alloy including aluminum (Al) and titanium (Ti), molybdenum (Mo), and niobium (Nb) each other.

However, the disclosure is not limited thereto, and each alignment electrode RME may further include a transparent conductive material. For example, each alignment electrode RME may include a material such as ITO, IZO, and ITZO. In embodiments, each of the alignment electrodes RME may have a structure in which at least one transparent conductive material and at least one metal layer having high reflectivity are stacked each other, or may be formed as one layer including them. For example, each alignment electrode RME may have a stacked structure of ITO/Ag/ITO, ITO/Ag/IZO, ITO/Ag/ITZO/IZO, or the like. The alignment electrodes RME may be electrically connected to the light emitting element ED, and may reflect lights emitted from the light emitting element ED to an upward direction of the substrate SUB.

The first insulating layer PAS1 may be disposed on the via insulating layer VIA and the alignment electrodes RME in the entire display area DA. The first insulating layer PAS1 may include an insulating material to protect the alignment electrodes RME and insulate alignment electrodes RME different from each other. As the first insulating layer PAS1 is disposed to cover the alignment electrodes RME before the external bank BNL is formed, in a process of forming the external bank BNL, the alignment electrode RME may be prevented from being damaged. The first insulating layer PAS1 may prevent the light emitting element ED disposed thereon from being damaged by direct contacting other members.

In an embodiment, the first insulating layer PAS1 may have stepped portions such that the top surface thereof is partially depressed between the alignment electrodes RME spaced apart in the first direction DR1. The light emitting element ED may be disposed on the top surface of the first insulating layer PAS1 where the stepped portions are formed, and thus a space may remain between the light emitting element ED and the first insulating layer PAS1.

The first insulating layer PAS1 may include contact portions CT1, CT2, CT3, and CT4. Each of the contact portions may be disposed to overlap different alignment electrodes RME. For example, the contact portions may include the first contact portion CT1 disposed to overlap the first alignment electrode RME1 and the second contact portion CT2 disposed to overlap the fourth alignment electrode RME4 in the first type sub-pixel SPXna and may include the third contact portion CT3 disposed to overlap the fifth alignment electrode RME5 and the fourth contact portion CT4 disposed to overlap the eighth alignment electrode RME8 in the second type sub-pixel SPXnb. The first contact portion CT1 and the second contact portion CT2 may penetrate the first insulating layer PAS1 to expose a part of the top surface of the first alignment electrode RME1 or the fourth alignment electrode RME4, and the third contact portion CT3 and the fourth contact portion CT4 may expose parts of the top surfaces of the fifth alignment electrode RME5 and the eighth alignment electrode RME8. Each of the first contact portion CT1, the second contact portion CT2, the third contact portion CT3, and the fourth contact portion CT4 may further penetrate some of the other insulating layers disposed on the first insulating layer PAS1. The alignment electrode RME exposed by each of the contact portions may contact the connection electrode CNE. The light emitting elements ED may be electrically connected to the circuit element layers under the alignment electrode RME and the via insulating layer VIA by contacting the connection electrodes CNE, and may emit light of a specific wavelength band by being applied with an electrical signal.

As illustrated in FIG. 9, the first insulating layer PAS1 may include a lower through hole LPH exposing the top surface of the via insulating layer VIA by penetrating the first insulating layer PAS1 at a portion in which the first capacitor electrode CSE1 and the second capacitor electrode CSE2 overlap in the third direction DR3. The lower through hole LPH may be a part of the through hole PH and may serve to discharge out-gas generated from the above-described circuit element layer.

The external bank BNL may be disposed on the first insulating layer PAS1. The external bank BNL may include portions extending in the first direction DR1 and the second direction DR2, and may surround the sub-pixels SPXn in a plan view. The external bank BNL may surround and divide each sub-pixel SPXn, and may surround the outermost portion of the display area DA and divide the display area DA and the non-display area NDA in a plan view.

The external bank BNL may have a height similar to the height of the internal bank BP. In embodiments, the height of a top surface of the external bank BNL may be greater than the height of the internal bank BP, and a thickness thereof may be equal to or greater than the thickness of the internal bank BP. Accordingly, the external bank BNL may effectively prevent ink from overflowing into the adjacent pixels PX in the inkjet printing process during the manufacturing process of the display device 1. The external bank BNL may include an organic insulating material made of a transparent material such as polyimide in the same manner as the internal bank BP, but the disclosure is not limited thereto. For example, the external bank BNL may include a colored dye such as a black pigment.

The second insulating layer PAS2 may be disposed on the light emitting elements ED, the first insulating layer PAS1, and the external bank BNL. The second insulating layer PAS2 may include a pattern portion disposed on the light emitting elements ED extending in the first direction DR1 between the internal banks BP. The pattern portion may surround a portion of the outer surface of the light emitting element ED, and may not cover both sides or both ends of the light emitting element ED. The pattern portion may be in a linear or island-like pattern in each pixel PX in plan view. The pattern portion of the second insulating layer PAS2 may protect the light emitting element ED and fix the light emitting elements ED during a manufacturing process of the display device 1. Further, the second insulating layer PAS2 may fill the space between the light emitting element ED and the first insulating layer PAS1 thereunder. The second insulating layer PAS2 may include contact portions CT1, CT2, CT3, and CT4. Each of the contact portions may be disposed to overlap different alignment electrodes RME. For example, the contact portions may include the first contact portion CT1 disposed to overlap the first alignment electrode RME1 and the second contact portion CT2 disposed to overlap the fourth alignment electrode RME4 in the first type sub-pixel SPXna and may include the third contact portion CT3 disposed to overlap the fifth alignment electrode RME5 and the fourth contact portion CT4 disposed to overlap the eighth alignment electrode RME8 in the second type sub-pixel SPXnb in a plan view. The first contact portion CT1 and the second contact portion CT2 may penetrate the second insulating layer PAS2 to expose a part of the top surface of the first alignment electrode RME1 or the fourth alignment electrode RME4, and the third contact portion CT3 and the fourth contact portion CT4 may expose parts of the top surfaces of the fifth alignment electrode RME5 and the eighth alignment electrode RME8. Each of the first contact portion CT1, the second contact portion CT2, the third contact portion CT3, and the fourth contact portion CT4 may further penetrate some of the other insulating layers disposed on the second insulating layer PAS2. The alignment electrode RME exposed by each of the contact portions may contact the connection electrode CNE. The light emitting elements ED may be electrically connected to the circuit element layers under the alignment electrode RME and the via insulating layer VIA by contacting the connection electrodes CNE, and may emit light of a specific wavelength band by being applied with an electrical signal.

As illustrated in FIG. 9, the second insulating layer PAS2 may include an upper through hole HPH that is disposed on the external bank BNL and penetrates the second insulating layer PAS2 at a portion overlapping the lower through hole LPH of the first insulating layer PAS1 in a plan view. The upper through hole HPH may further penetrate some of the other insulating layers disposed on the second insulating layer PAS2. The upper through hole HPH may be a part of the through hole PH and may serve to discharge out-gas generated from the above-described circuit element layer.

The first connection electrode layer CNEL1 of the connection electrode CNE may be disposed on the second insulating layer PAS2. In the first type sub-pixel SPXna, the first connection electrode CNE1 and the third connection electrode CNE3 of the first connection electrode layer CNEL1 may be disposed on the second insulating layer PAS2 contacting the light emitting elements ED, and in the second type sub-pixel SPXnb, the sixth connection electrode CNE6 and the eighth connection electrode CNE8 of the first connection electrode layer CNEL1 may be disposed on the second insulating layer PAS2 contacting the light emitting elements ED.

The first connection electrode CNE1 may partially overlap the first alignment electrode RME1 in the first type sub-pixel SPXna and may contact one end ED1*a* of the first light emitting element ED1. As illustrated in FIG. 7, the first connection electrode CNE1 may partially overlap the first alignment electrode RME1 in a plan view and may extend from the emission area EMA over the external bank BNL. The first connection electrode CNE1 may contact the first alignment electrode RME1 through the first contact portion CT1 penetrating the first insulating layer PAS1 and the second insulating layer PAS2. Accordingly, the first connection electrode CNE1 may be electrically connected to the first transistor T1 to be applied with the first power voltage.

The third connection electrode CNE3 may partially overlap the second alignment electrode RME2 and the third alignment electrode RME3 in the first type sub-pixel SPXna in a plan view. The first portion CNE3*a* of the third connection electrode CNE3 may partially overlap the second alignment electrode RME2 and contact the other end ED2*b* of the second light emitting element ED2, and the second portion CNE3*b* may partially overlap the third alignment electrode RME3 and contact one end ED3*a* of the third light emitting element ED3.

The sixth connection electrode CNE6 may partially overlap the sixth alignment electrode RME6 and the seventh alignment electrode RME7 in the second type sub-pixel SPXnb in a plan view. The first portion CNE6*a* of the sixth connection electrode CNE6 may partially overlap the sixth alignment electrode RME6 and contact one end ED4*a* of the fourth light emitting element ED4, and the second portion CNE6*b* may partially overlap the seventh alignment electrode RME7 and contact the other end ED5*b* of the fifth light emitting element ED5.

The eighth connection electrode CNE8 may partially overlap the eighth alignment electrode RME8 in the second type sub-pixel SPXnb and may contact one end ED6*a* of the sixth light emitting element ED6. As illustrated in FIG. 8, the eighth connection electrode CNE8 may partially overlap the eighth alignment electrode RME8 in plan view and may extend from the emission area EMA over the external bank BNL. The eighth connection electrode CNE8 may contact the eighth alignment electrode RME8 through the fourth contact portion CT4 penetrating the first insulating layer PAS1 and the second insulating layer PAS2. Accordingly, the eighth connection electrode CNE8 may be electrically connected to the first transistor T1 to be applied with the first power voltage.

The third insulating layer PAS3 may be disposed on the second insulating layer PAS2, the first connection electrode layer CNEL1, and the external bank BNL. The third insulating layer PAS3 may not cover one end of the light emitting element ED. For example, the third insulating layer PAS3 may not cover ends of the light emitting elements ED with which the first connection electrode layer CNEL1 does not contact.

The third insulating layer PAS3 may include contact portions CT1, CT2, CT3, and CT4. Each of contact portions may be disposed to overlap different alignment electrodes RME. For example, the contact portions may include the first contact portion CT1 disposed to overlap the first alignment electrode RME1 and the second contact portion CT2 disposed to overlap the fourth alignment electrode RME4 in the first type sub-pixel SPXna and may include the third contact portion CT3 disposed to overlap the fifth alignment electrode RME5 and the fourth contact portion CT4 disposed to overlap the eighth alignment electrode RME8 in the second type sub-pixel SPXnb in a plan view. The first contact portion CT1 and the second contact portion CT2 may penetrate the third insulating layer PAS3 to expose a part of the top surface of the first alignment electrode RME1 or the fourth alignment electrode RME4, and the third contact portion CT3 and the fourth contact portion CT4 may expose parts of the top surfaces of the fifth alignment electrode RME5 and the eighth alignment electrode RME8. The alignment electrode RME exposed by each of the contact portions may contact the connection electrode CNE. The light emitting elements ED may be electrically connected to the circuit element layers under the alignment electrode RME and the via insulating layer VIA by contacting the connection electrodes CNE, and may emit light of a specific wavelength band by being applied with an electrical signal.

As illustrated in FIG. 9, the third insulating layer PAS3 may include the upper through hole HPH that is disposed on the external bank BNL and penetrates the third insulating layer PAS3 at a portion overlapping the lower through hole LPH of the first insulating layer PAS1 in a plan view. The upper through hole HPH may further penetrate some of the other insulating layers disposed on the third insulating layer PAS3. The upper through hole HPH may be a part of the through hole PH and may serve to discharge out-gas generated from the above-described circuit element layer.

The second connection electrode layer CNEL2 of the connection electrode CNE may be disposed on the third insulating layer PAS3. In the first type sub-pixel SPXna, the second connection electrode CNE2 and the fourth connection electrode CNE4 of the second connection electrode layer CNEL2 may be disposed on the third insulating layer PAS3 and contact the light emitting elements ED, and in the second type sub-pixel SPXnb, the fifth connection electrode CNE5 and the seventh connection electrode CNE7 of the second connection electrode layer CNEL2 may be disposed on the third insulating layer PAS3 and contact the light emitting elements ED.

The second connection electrode CNE2 may partially overlap the second alignment electrode RME2 and the third alignment electrode RME3 in the first type sub-pixel SPXna in a plan view. The first portion CNE2*a* of the second connection electrode CNE2 may partially overlap the second alignment electrode RME2 and contact the other end ED1*b* of the first light emitting element ED1, and the second portion CNE2*b* may partially overlap the third alignment electrode RME3 and contact one end ED2*a* of the second light emitting element ED2.

The fourth connection electrode CNE4 may partially overlap the fourth alignment electrode RME4 in the first type sub-pixel SPXna in a plan view and may contact the other end ED4*b* of the fourth light emitting element ED4. As illustrated in FIG. 7, the fourth connection electrode CNE4 may partially overlap the fourth alignment electrode RME4 and may extend from the emission area EMA over the external bank BNL. The fourth connection electrode CNE4 may contact the third alignment electrode RME3 through the second contact portion CT2 penetrating the first insulating layer PAS1, the second insulating layer PAS2, and the third insulating layer PAS3. Accordingly, the fourth connection electrode CNE4 may be electrically connected to the second power line VL2 to be applied with the second power voltage.

The fifth connection electrode CNE5 may partially overlap the fifth alignment electrode RME5 in the second type sub-pixel SPXnb in a plan view and may contact the other end ED4*b* of the fourth light emitting element ED4. As illustrated in FIG. 8, the fifth connection electrode CNE5 may partially overlap the fifth alignment electrode RME5 in a plan view and may extend from the emission area EMA over the external bank BNL. The fifth connection electrode CNE5 may contact the fifth alignment electrode RME5 through the third contact portion CT3 penetrating the first insulating layer PAS1, the second insulating layer PAS2, and the third insulating layer PAS3. Accordingly, the fifth connection electrode CNE5 may be electrically connected to the second voltage line VL2 to be applied with the second power voltage.

The seventh connection electrode CNE7 may partially overlap the sixth alignment electrode RME6 and the seventh alignment electrode RME7 in the second type sub-pixel SPXnb in a plan view. The first portion CNE7*a* of the seventh connection electrode CNE7 may partially overlap the sixth alignment electrode RME6 in a plan view and contact one end ED5*a* of the fifth light emitting element ED5, and the second portion CNE7*b* may partially overlap the seventh alignment electrode RME7 in a plan view and contact the other end ED6*b* of the sixth light emitting element ED6.

The connection electrodes CNE may include a conductive material. For example, the connection electrodes CNE may include ITO, IZO, ITZO, aluminum (Al), or the like. For example, the connection electrodes CNE may include a transparent conductive material, and light emitted from the light emitting element ED may pass through the connection electrodes CNE to be emitted.

Due to the above-described connection relationship between the connection electrodes CNE and the light emitting elements ED, in the first type sub-pixel SPXna, the first light emitting element ED1, the second light emitting element ED2, and the third light emitting element ED3 may be connected in series, and in the second type sub-pixel SPXnb, the fourth light emitting element ED4, the fifth light emitting element ED5, and the sixth light emitting element ED6 may be connected in series. Accordingly, the luminance of each sub-pixel SPXn may increase.

The fourth insulating layer PAS4 may be disposed on the second connection electrode layer CNEL2 and the third insulating layer PAS3. The fourth insulating layer PAS4 may be disposed on the entire surface of the display area DA and may serve to protect the elements constituting the sub-pixel SPXn from the outside.

As illustrated in FIG. 9, the fourth insulating layer PAS4 may include the upper through hole HPH that is disposed on the external bank BNL and penetrates the fourth insulating layer PAS4 at a portion overlapping the lower through hole LPH of the first insulating layer PAS1 in a plan view. The upper through hole HPH may be a part of the through hole PH and may serve to discharge out-gas generated from the above-described circuit element layer.

Each of the first insulating layer PAS1, the second insulating layer PAS2, the third insulating layer PAS3, and the fourth insulating layer PAS4 described above may include an inorganic insulating material or an organic insulating material. In an embodiment, each of the first insulating layer PAS1, the second insulating layer PAS2, the third insulating layer PAS3, and the fourth insulating layer PAS4 may include at least one of silicon oxide ($SiO_x$), silicon nitride ($SiN_x$), and silicon oxynitride ($SiO_xN_y$). The first insulating layer PAS1, the second insulating layer PAS2, the third insulating layer PAS3, and the fourth insulating layer PAS4 may be made of a same material or different materials. In another embodiment, some of the insulating layers may be made of a same material and another of the insulating layers may be made of different materials.

Figure 10:
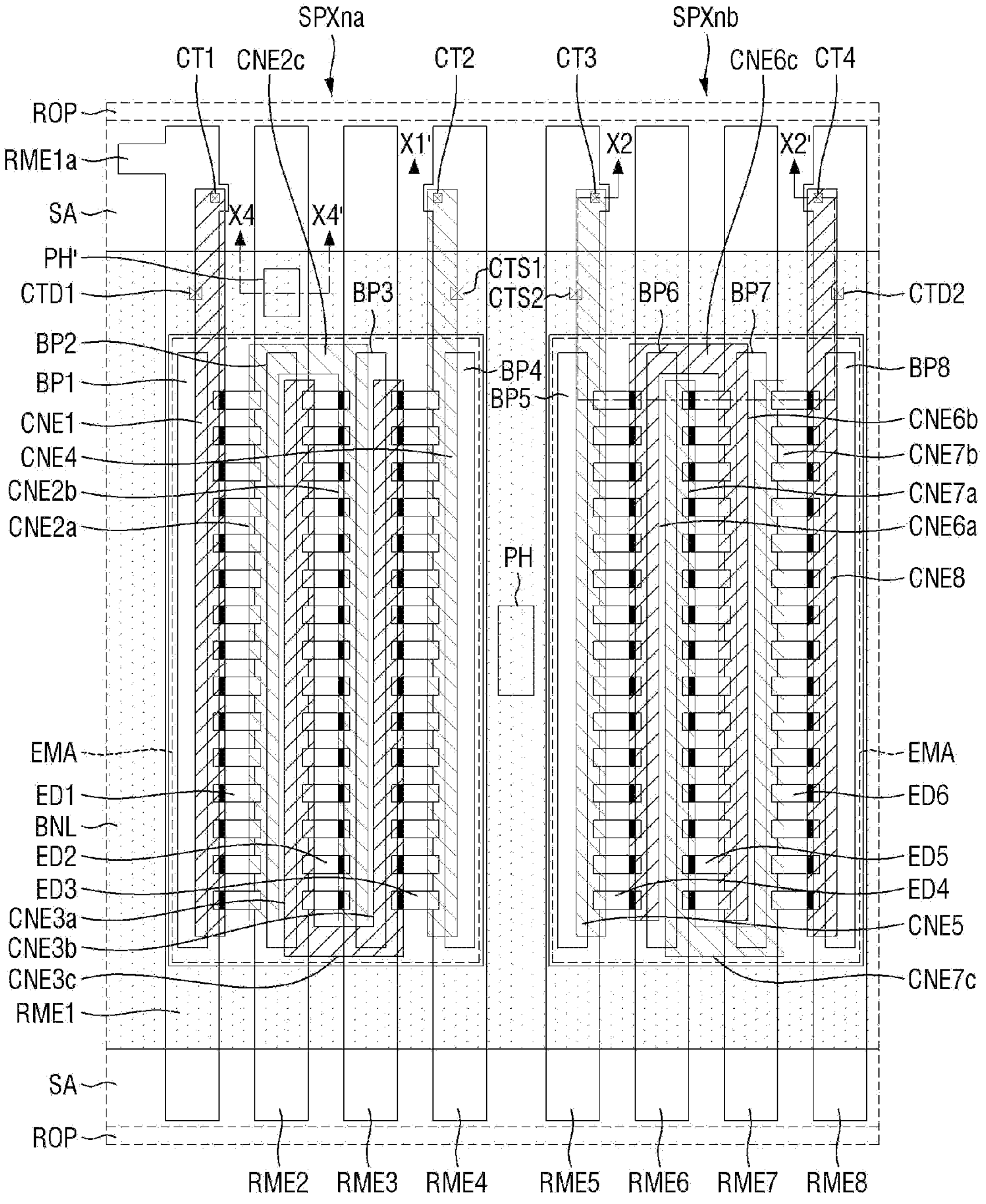
FIG. 10 is a plan view illustrating a pixel structure of a display device according to an embodiment.
Figure 11:
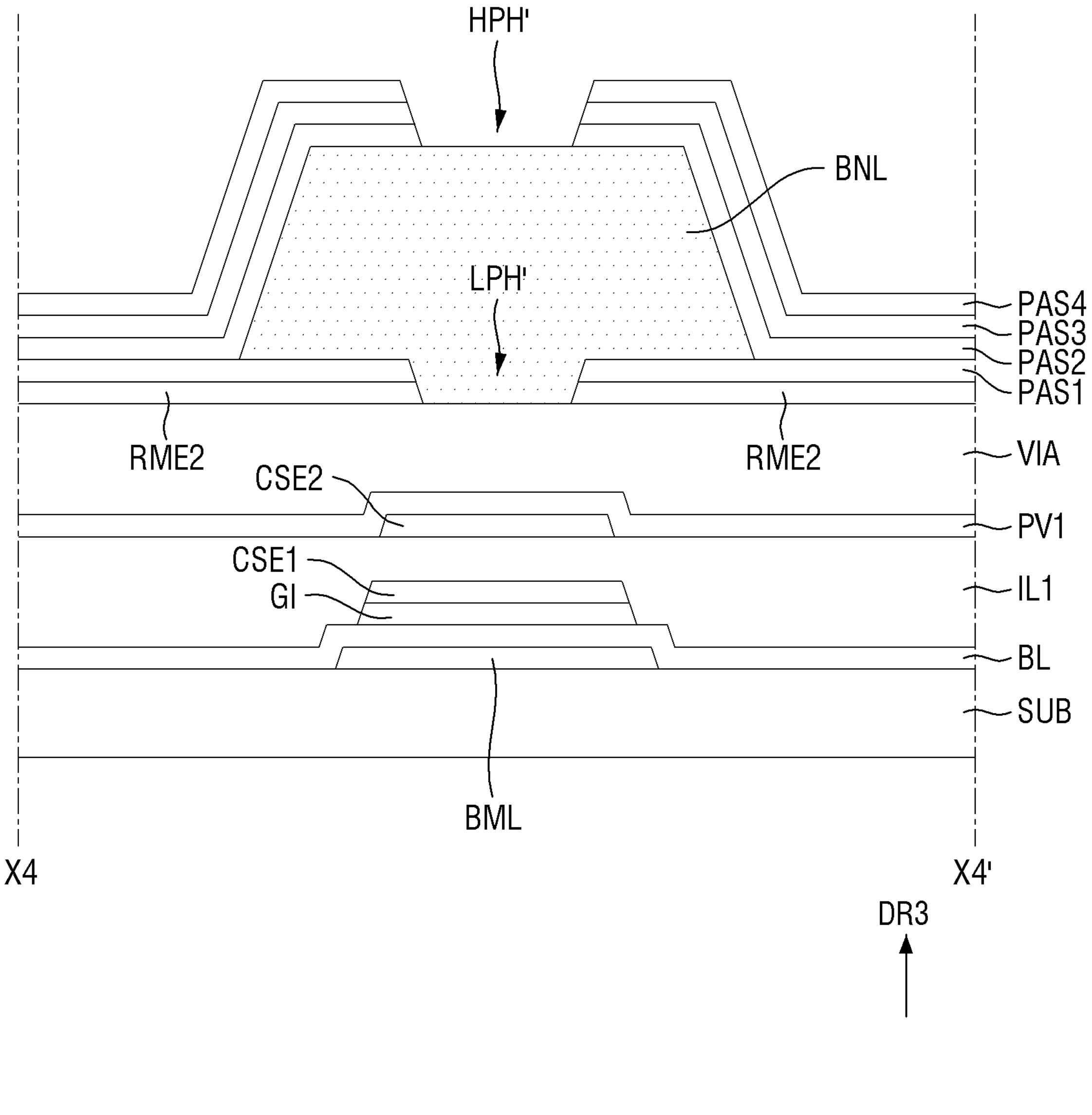
FIG. 11 is a schematic cross-sectional view illustrating a cross section taken along line X4-X4' of FIG. 10.

FIG. 10 is a plan view illustrating a pixel structure of a display device according to an embodiment. FIG. 11 is a schematic cross-sectional view illustrating a cross section taken along line X4-X4' of FIG. 10.

Referring to FIGS. 10 and 11, in the display device 1 according to an embodiment, the position of a through hole overlapping the external bank BNL may vary depending on the type of the sub-pixel SPXn. For example, the display device 1 according to an embodiment may include the first through hole PH' positioned at a portion in which the second alignment electrode RME2 and the external bank BNL overlap in the first type sub-pixel SPXna in a plan view, and the through hole PH that is substantially the same as the through hole PH described with reference to FIG. 6 in the second type sub-pixel SPXnb.

As illustrated in FIG. 11, the first through hole PH' in the first type sub-pixel SPXna may include a first lower through hole LPH' and a first upper through hole HPH'. Since the first upper through hole HPH' is substantially the same as the upper through hole HPH described with reference to FIG. 9, a detailed description thereof will be omitted.

The first lower through hole LPH' may further penetrate the second alignment electrode RME2. In other words, the second alignment electrode RME2 may include the first lower through hole LPH' penetrating the second alignment electrode RME2 near a portion overlapping the first capacitor electrode CES1 and the second capacitor electrode CES2 in the third direction DR3. Accordingly, the first through hole PH' may serve to discharge out-gas generated from the above-described circuit element layer.

Hereinafter, a process of manufacturing the display device 1 according to an embodiment will be described.

FIGS. 12 to 21 are schematic diagrams illustrating processes of manufacturing a display device according to an embodiment.

Figure 12:
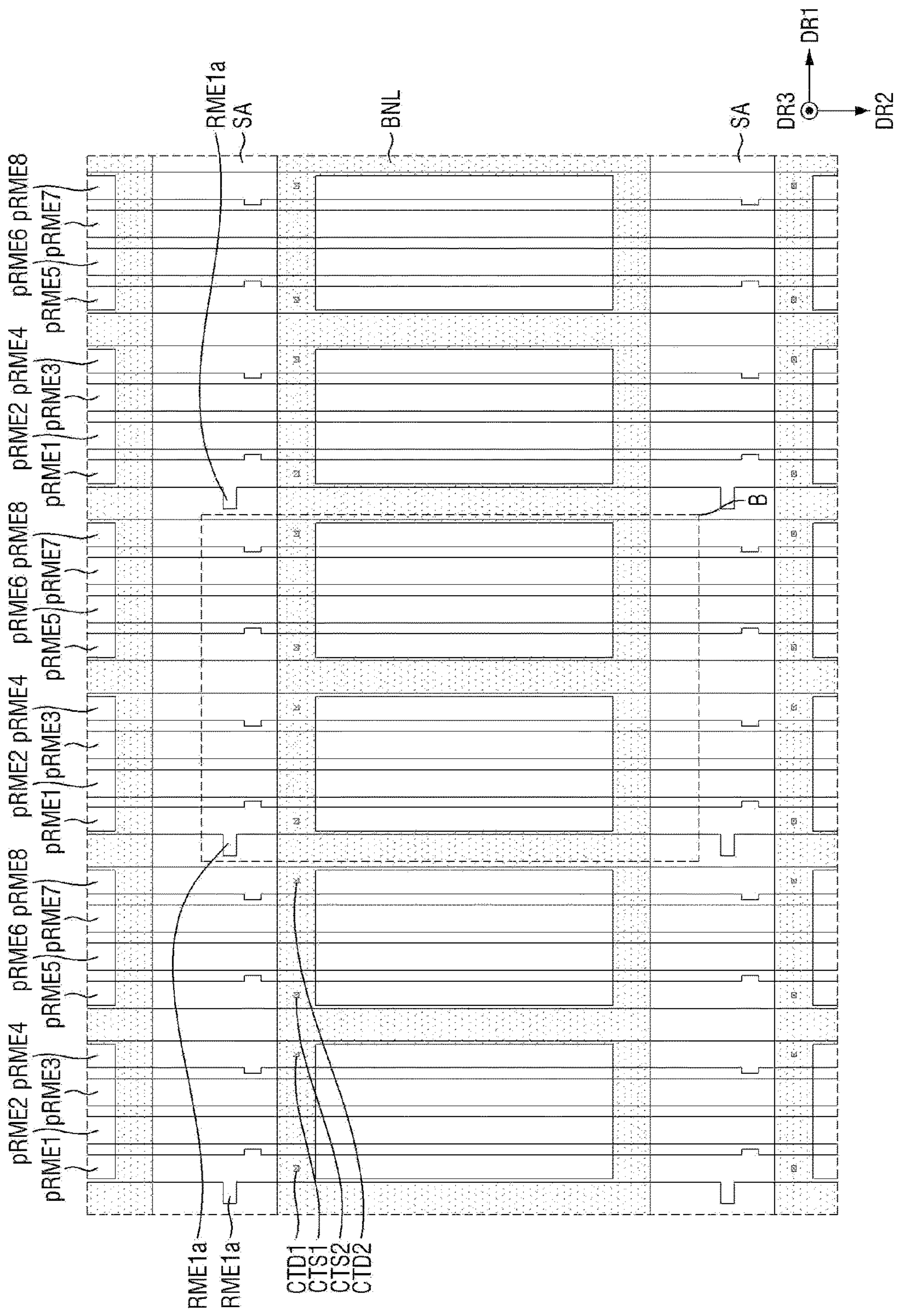
FIGS. 12 to 21 are schematic diagrams illustrating processes of manufacturing a display device according to an embodiment.
Figure 13:
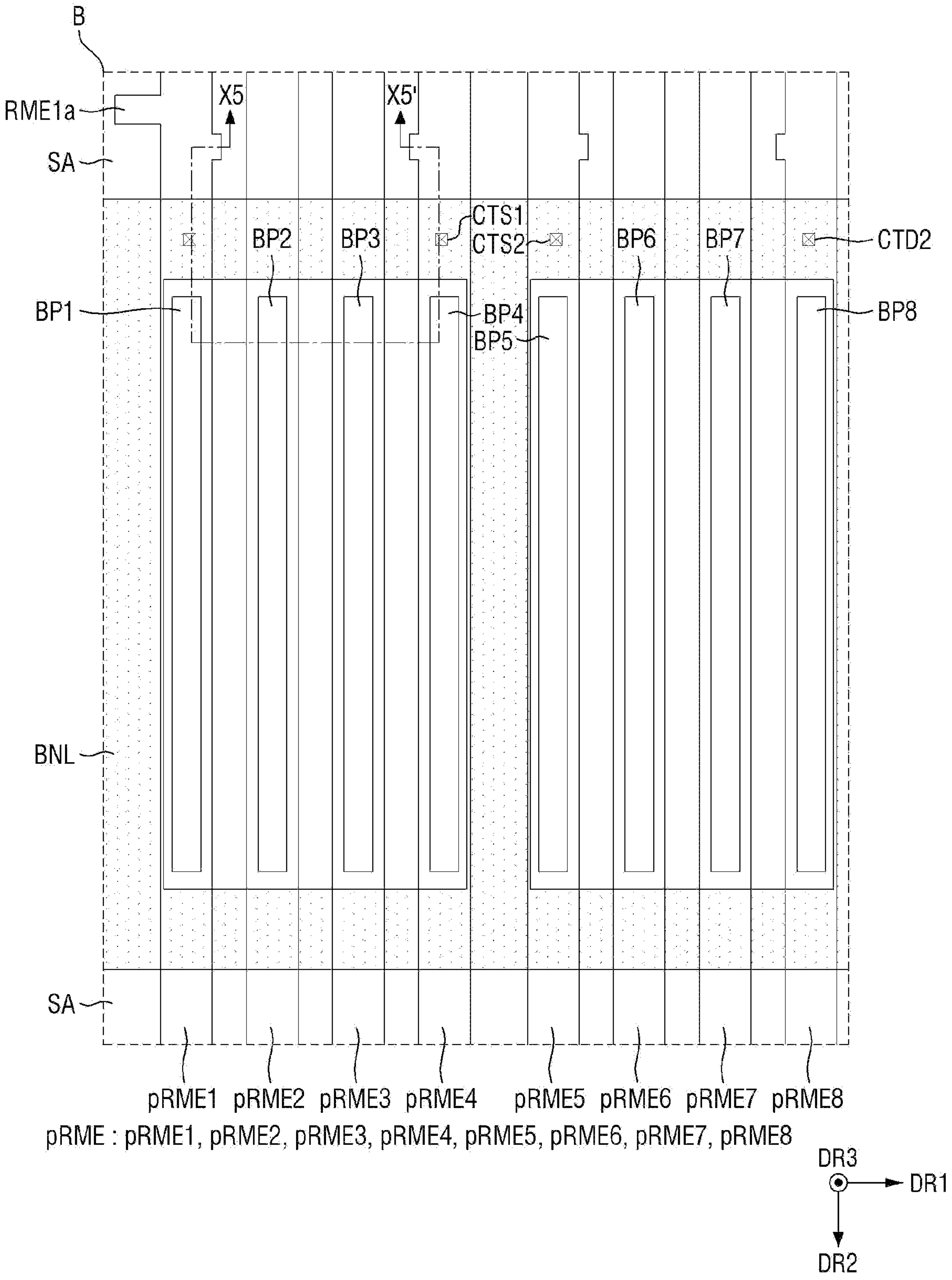
Figure 14:
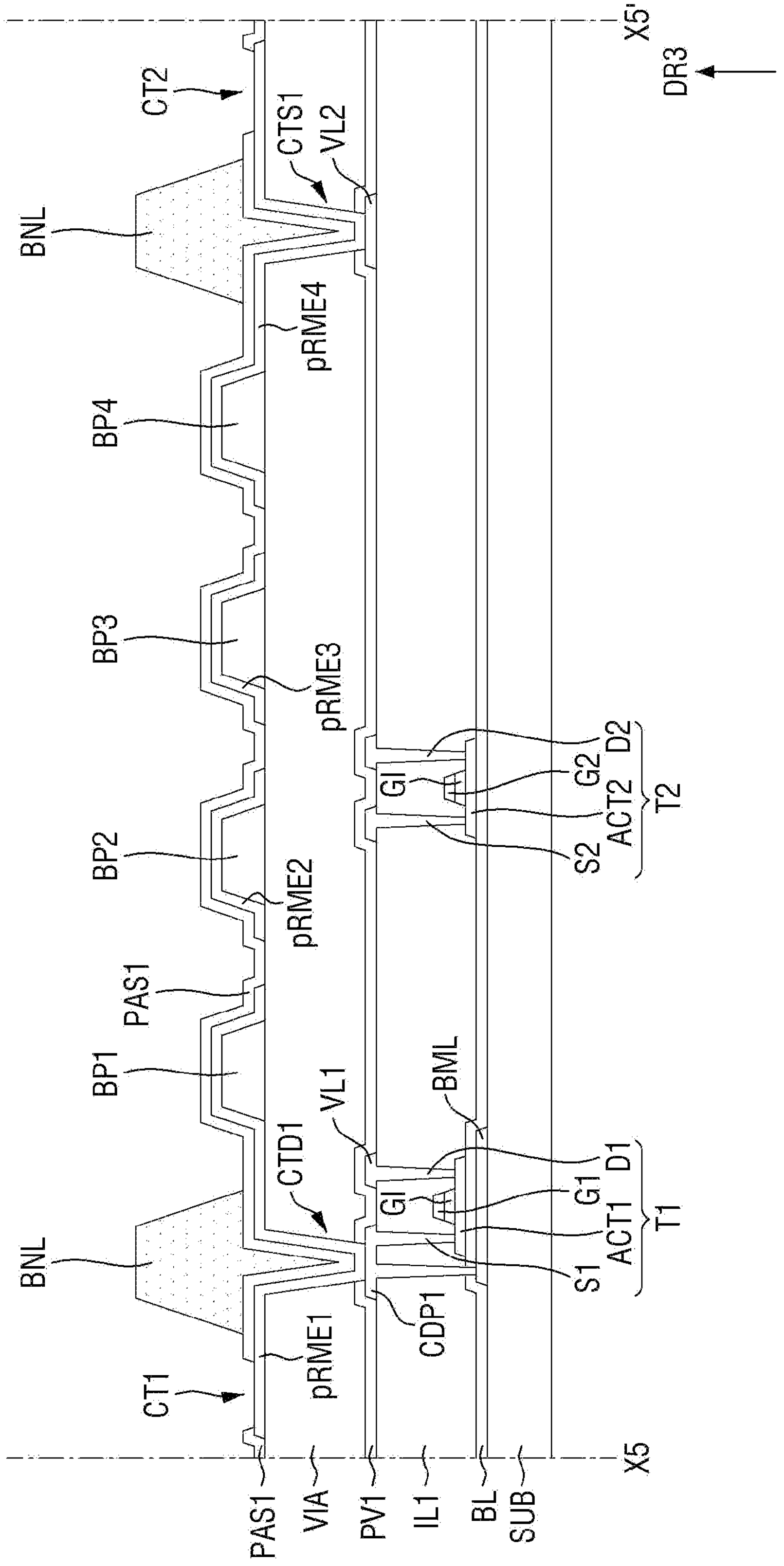
Figure 15:
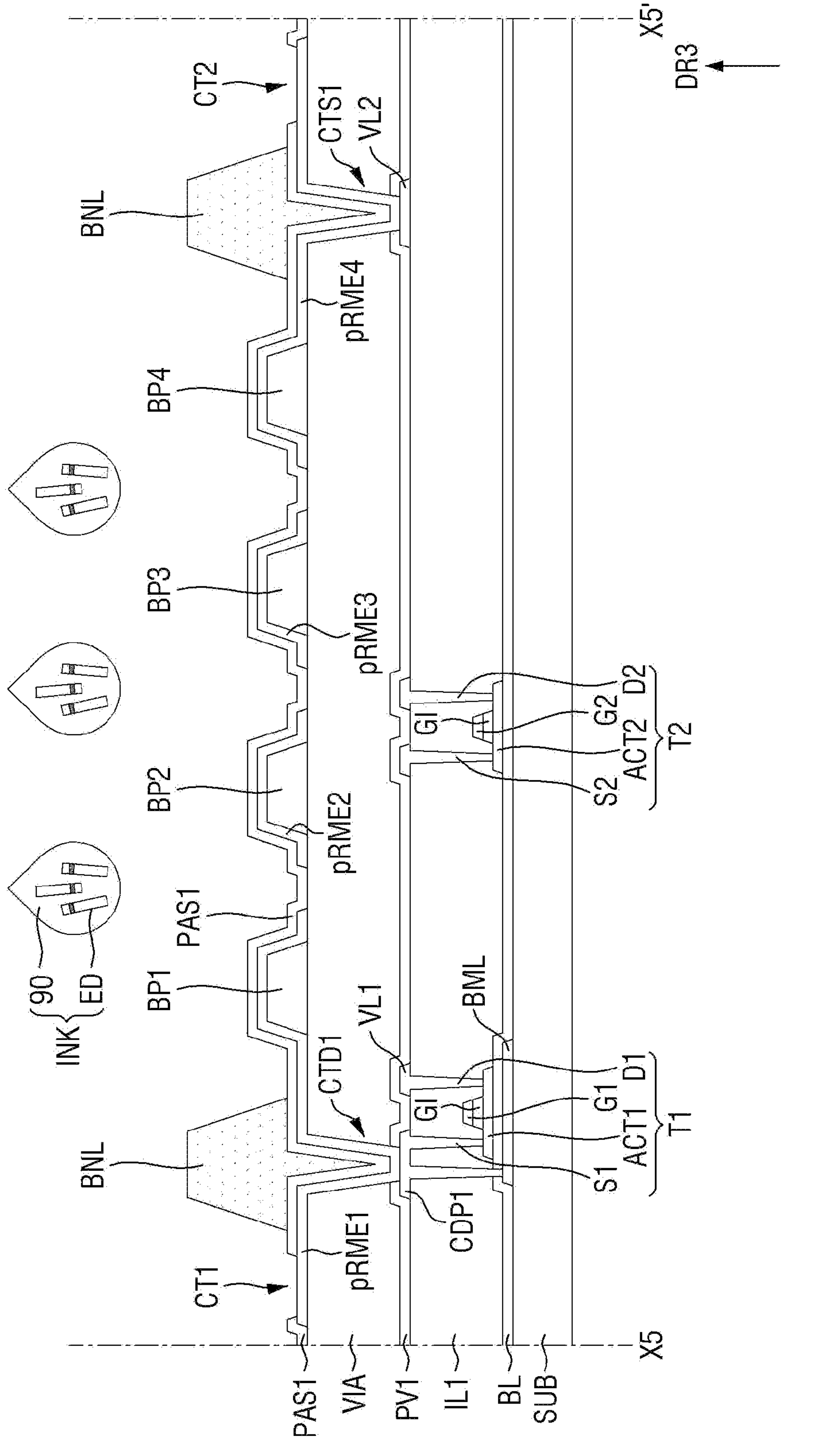
Figure 16:
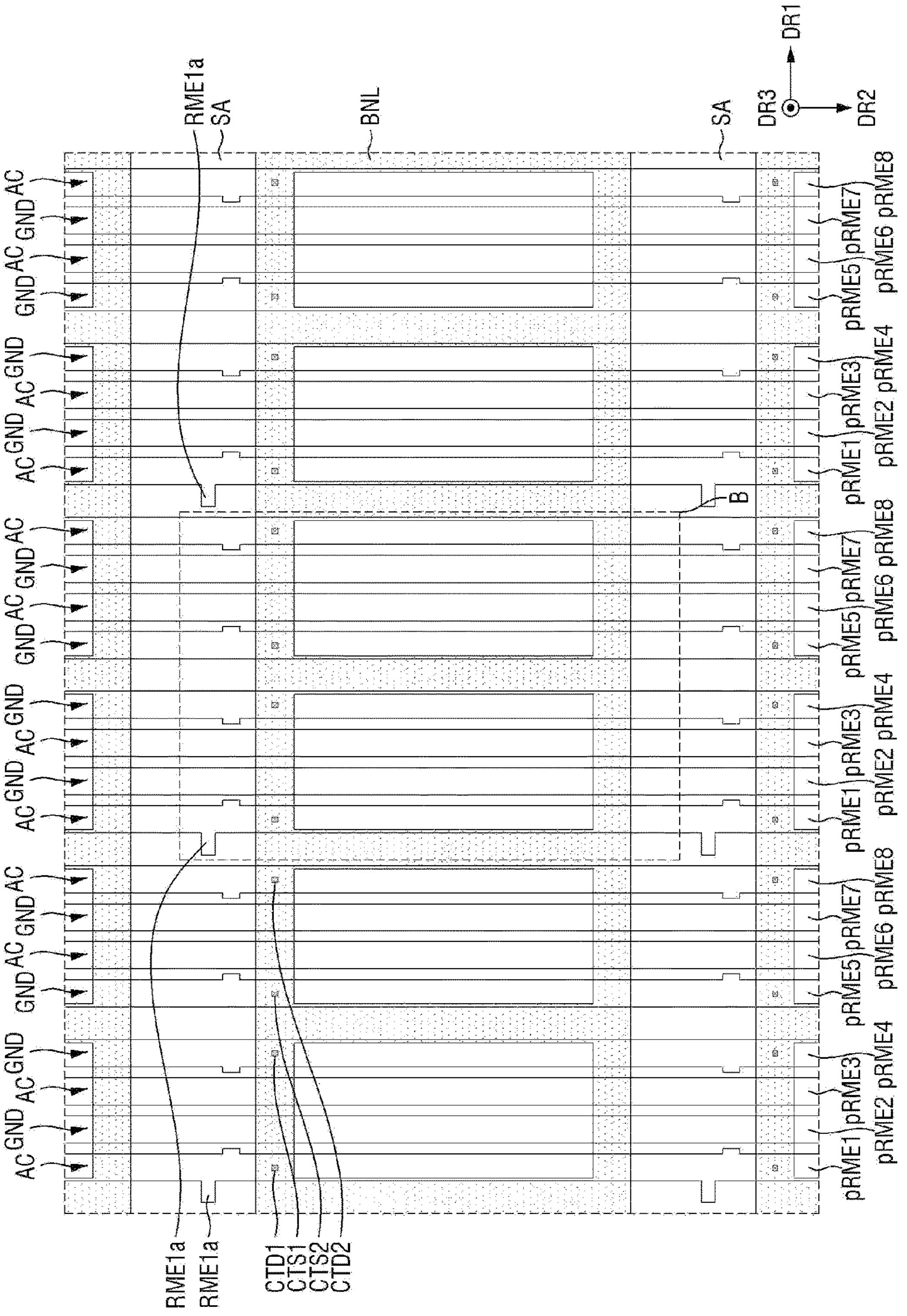
Figure 17:
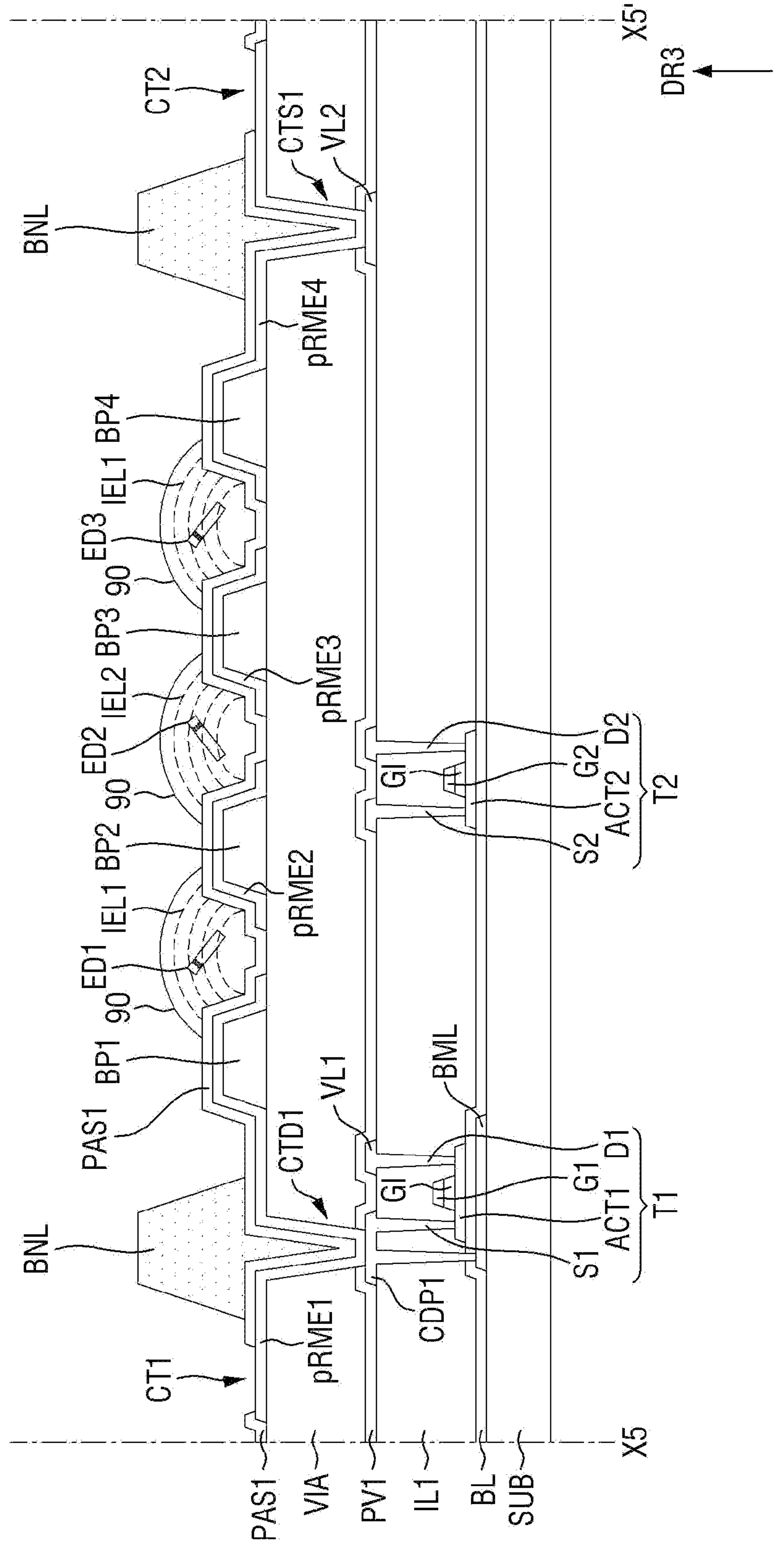
Figure 18:
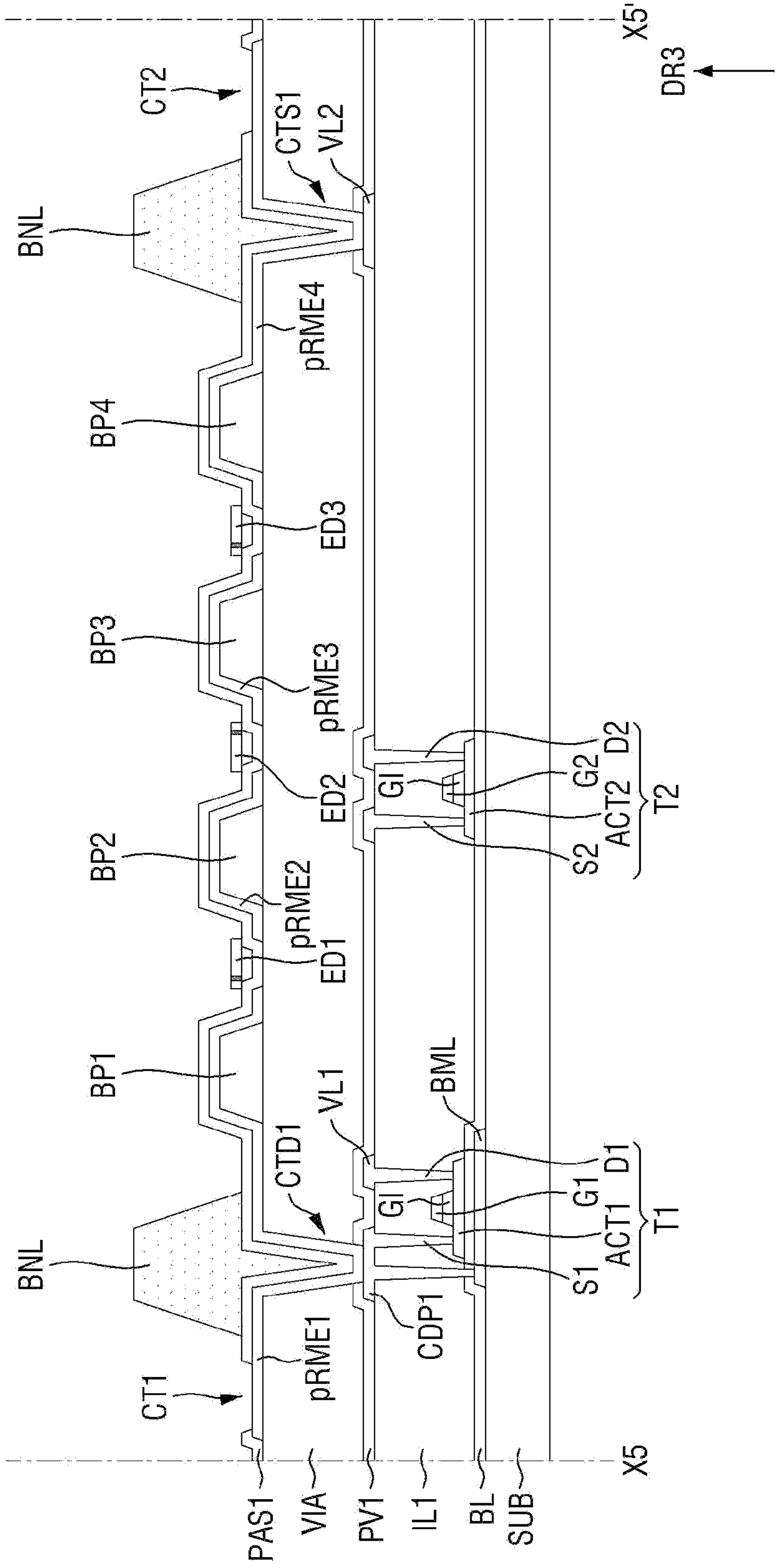
Figure 19:
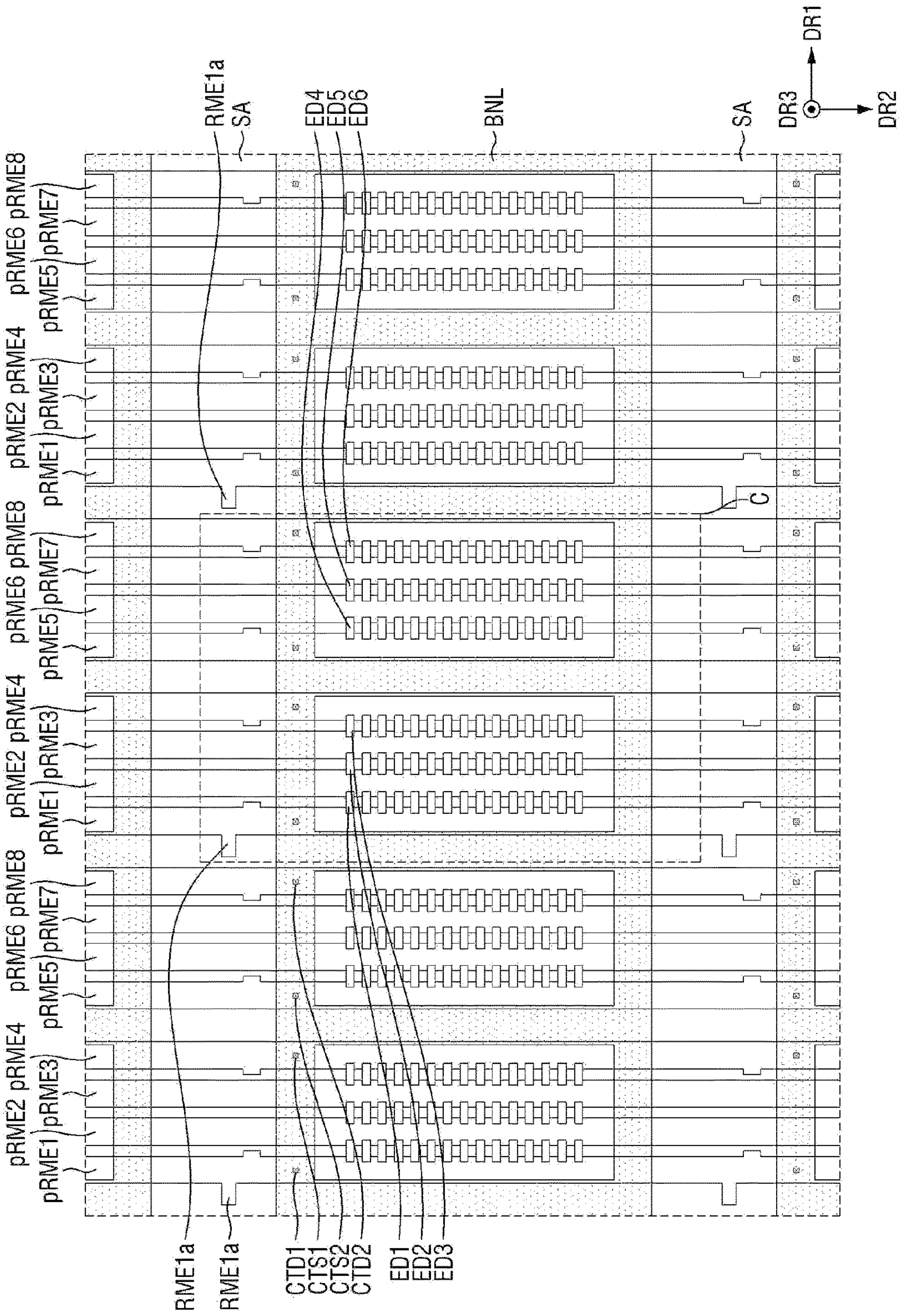
Figure 20:
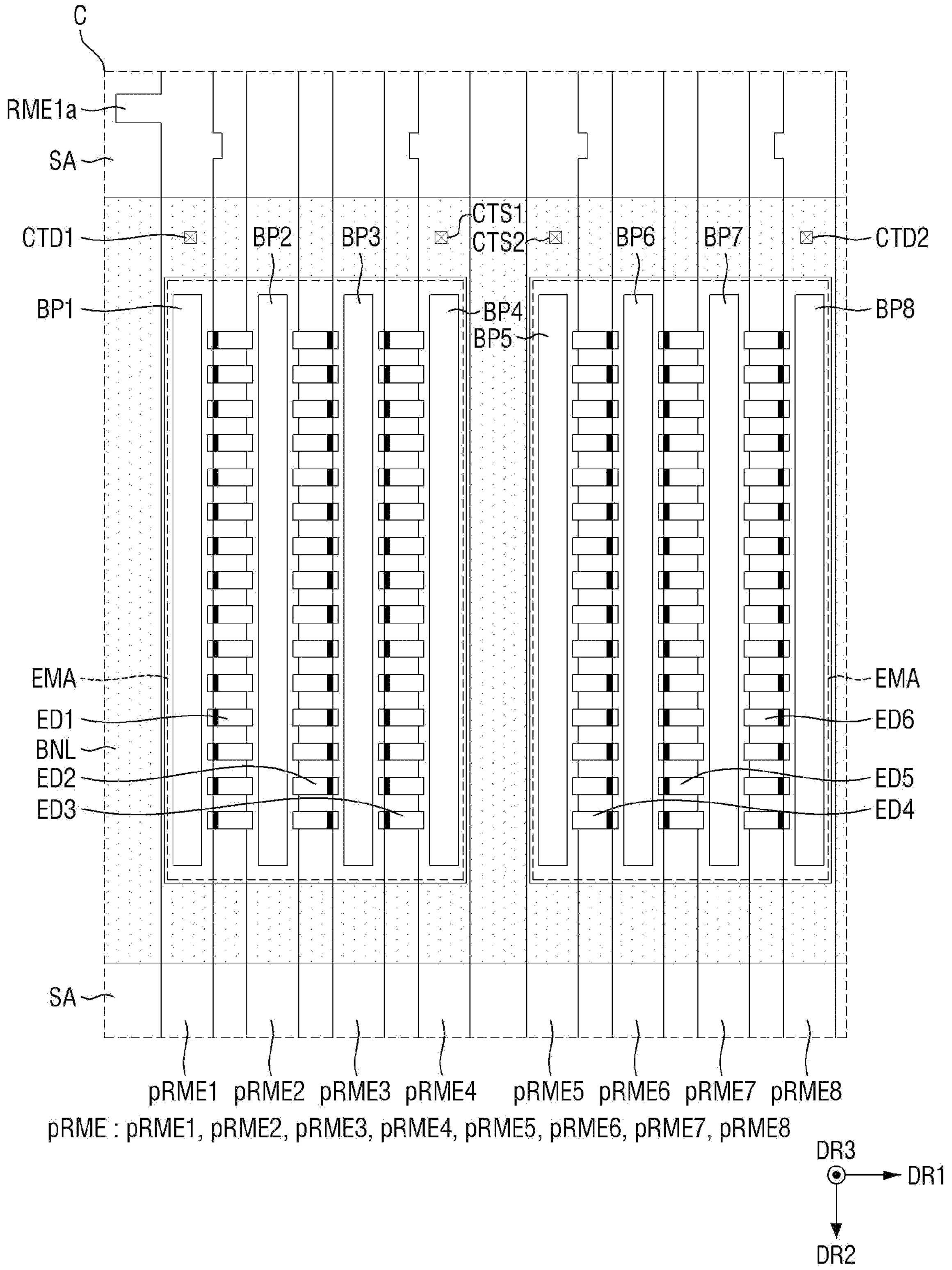
Figure 21:
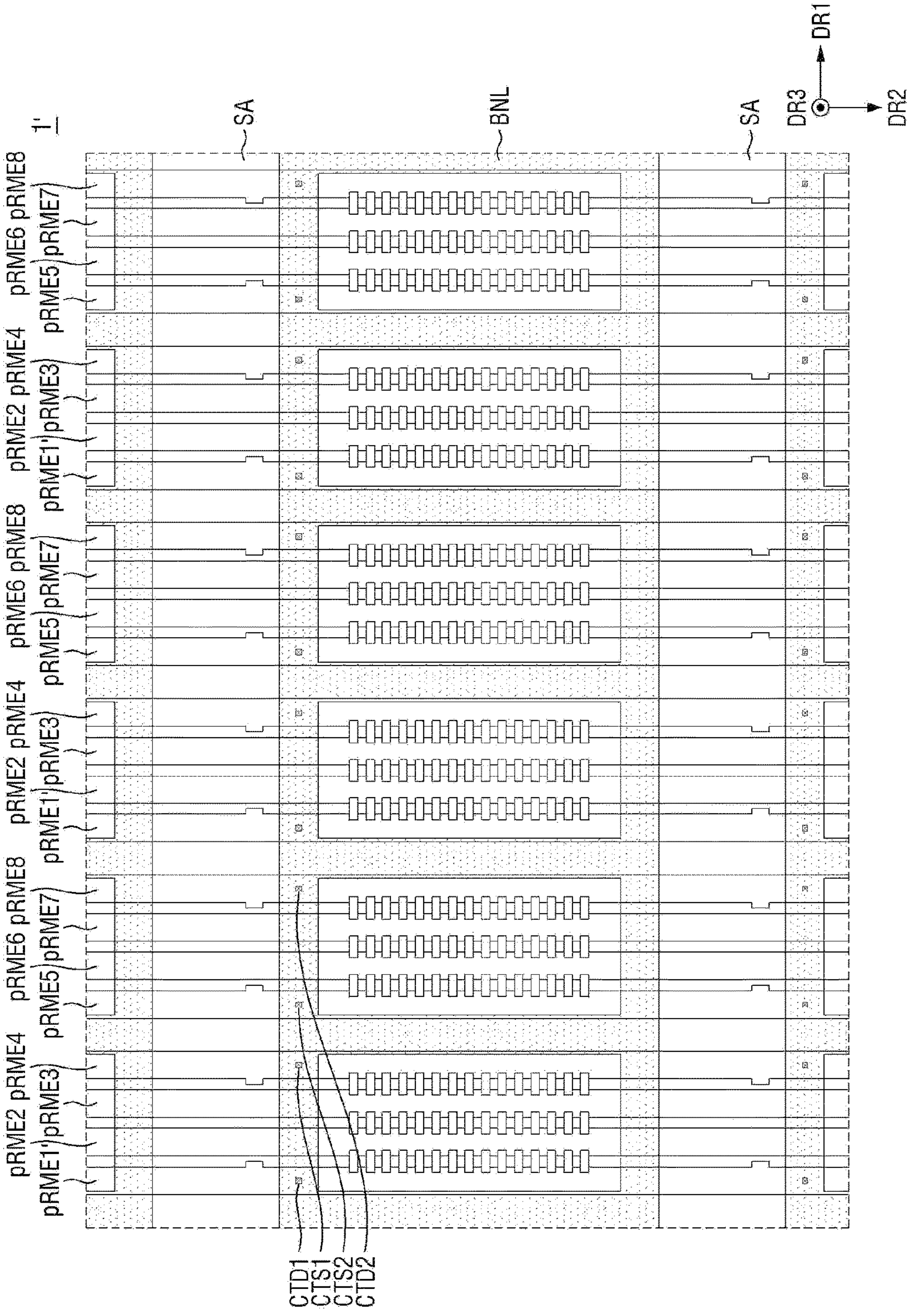

FIG. 12 is a plan view illustrating a planar shape of an alignment electrode pattern pRME disposed on the display device 1 according to an embodiment, FIG. 13 is an enlarged view of area B of FIG. 12, FIG. 14 is a schematic cross-sectional view illustrating a cross section taken along line X5-X5' of FIG. 13, and FIG. 15 is a schematic cross-sectional view illustrating that ink INK is ejected onto the alignment electrode pattern pRME. FIG. 16 is a plan view illustrating an application of an alignment signal to the alignment electrode pattern pRME disposed on the display device 1 according to an embodiment. FIG. 17 is a schematic cross-sectional view illustrating a process in which an electric field is formed in the ejected ink INK to align the light emitting elements ED. FIG. 18 is a schematic cross-sectional view illustrating a state in which the light emitting elements ED are aligned. FIG. 19 is a plan view illustrating a structure in which the light emitting element ED is arranged on the alignment electrode pattern pRME disposed on the display device 1. FIG. 20 is an enlarged view of area C of FIG. 19. FIG. 21 is a plan view illustrating a planar shape of the alignment electrode pattern pRME of a display device 1' according to a comparative embodiment.

FIGS. 12 to 15 illustrate a process of disposing the light emitting element ED on the alignment electrode pattern pRME of the display device 1 according to an embodiment, FIGS. 16 to 18 illustrate a process of aligning the light emitting element ED disposed on the alignment electrode pattern pRME, FIGS. 19 and 20 illustrate a process of inspecting the aligned light emitting element ED, and FIG. 21 illustrate that there is no separate identification pattern to distinguish the types of sub-pixels in the display device 1' according to the comparative embodiment.

First, referring to FIGS. 12 to 15, the circuit element layer, the via insulating layer VIA, the internal bank BP, the alignment electrode pattern pRME, the first insulating layer PAS1, and the external banks BNL described above may be sequentially stacked on the substrate SUB, and the ink INK in which the light emitting element ED is dispersed in a solvent 90 may be sprayed to a space between the internal banks BP.

A process of sequentially stacking the circuit element layer, the via insulating layer VIA, the internal bank BP, the alignment electrode pattern pRME, the first insulating layer PAS1, and the external bank BNL described above on the substrate SUB is available in the art, and a detailed description thereof will be omitted.

The alignment electrode pattern pRME may be the alignment electrodes RME connected to each other without being separated by the above-described separation portion ROP. For example, the alignment electrode pattern pRME may be formed as the alignment electrode RME by a process of forming the separation portion ROP, and may correspond to the alignment electrode RME. As described below, the alignment signals AC and GND may be applied to the alignment electrode pattern pRME to align the light emitting elements ED.

The alignment electrode pattern pRME may include a first alignment electrode pattern pRME1 corresponding to the first alignment electrode RME1, a second alignment electrode pattern pRME2 corresponding to the second alignment electrode RME2, a third alignment electrode pattern pRME3 corresponding to the third alignment electrode RME3, a fourth alignment electrode pattern pRME4 corresponding to the fourth alignment electrode RME4, a fifth alignment electrode pattern pRME5 corresponding to the fifth alignment electrode RME5, a sixth alignment electrode pattern pRME6 corresponding to the sixth alignment electrode RME6, a seventh alignment electrode pattern pRME7 corresponding to the seventh alignment electrode RME7, and an eighth alignment electrode pattern pRME8 corresponding to the eighth alignment electrode RME8. In an embodiment, the first alignment electrode pattern pRME1 may include the protruding portion RME1*a* similarly to the first alignment electrode RME1, and other alignment electrode patterns pRME may not include the protruding portion RME1*a*. Since the disposition, structure, and the like of the alignment electrode pattern pRME are substantially the same as those of the alignment electrode RME, a detailed description thereof will be omitted.

The process of disposing the ink INK in which the light emitting element ED is dispersed in the solvent 90 to the space between the internal banks BP may be performed using, for example, an ink-jet printing apparatus. The ink INK may be sprayed on the emission area EMA defined by the external bank BNL, and may not be sprayed to the remaining areas.

Referring to FIGS. 16 to 18, an alignment signal may be applied to the alignment electrode pattern pRME to align the light emitting elements ED disposed in the space between the internal banks BP. In an embodiment, the process of aligning the light emitting elements ED may be performed using a dielectrophoresis (DEP) force generated by an electric field generated by alignment signals having different potential values.

The alignment signal may include a first alignment signal AC having a potential value substantially equal to the above-described first power voltage and a second alignment signal GND having a potential value substantially equal to the above-described second power voltage.

Electric fields IEL1 and IEL2 may be generated by applying alignment signals having different potential values to each of the neighboring alignment electrode patterns pRME. The electric field may include the first electric field IEL1 and the second electric field IEL2 according to an application position of the first alignment signal AC and the second alignment signal GND. For example, the first electric field IEL1 may be generated in case that the first alignment signal AC is applied to an alignment electrode pattern pRME disposed in an opposite direction of the first direction DR1 with reference to FIG. 16 and in case that the second alignment signal GND is applied to another alignment electrode pattern pRME disposed adjacent to the alignment electrode pattern pRME on one side in the first direction DR1. The second electric field IEL2 may be generated in case that the second alignment signal GND is applied to an alignment electrode pattern pRME disposed in an opposite direction of the first direction DR1 with reference to FIG. 16 and in case that the first alignment signal AC is applied to another alignment electrode pattern pRME disposed adjacent to the alignment electrode pattern pRME on one side in the first direction DR1.

In an embodiment, one end of the light emitting element ED, for example, a portion including the p-type semiconductor may be oriented to be disposed on the alignment electrode pattern pRME to which the first alignment signal AC is applied, and the other end, for example, a portion including the n-type semiconductor may be oriented to be disposed on the alignment electrode pattern pRME to which the second alignment signal GND is applied. Accordingly, the orientation of the light emitting element ED to which the first electric field IEL1 acts may be opposite to the orientation of the light emitting element ED to which the second electric field IEL2 acts.

For example, as illustrated in FIGS. 16 and 17, in case that the first alignment signal AC is applied to the first alignment electrode pattern pRME1, the second alignment signal GND is applied to the second alignment electrode pattern pRME2, the first alignment signal AC is applied to the third alignment electrode pattern pRME3, and the second alignment signal GND is applied to the fourth alignment electrode pattern pRME4, the first electric field IEL1 may be formed between the first internal bank BP and the second internal bank BP, the second electric field IEL2 may be formed between the second internal bank BP2 and the third internal bank BP3, and the first electric field IEL1 may be formed between the third internal bank BP3 and the fourth internal bank BP4, so that the orientation of the light emitting element ED may be determined. For example, as illustrated in FIG. 18, one end of the first light emitting element ED1 may be disposed on the first alignment electrode pattern pRME1, the other end of the first light emitting element ED1 may be disposed on the second alignment electrode pattern pRME2, the other end of the second light emitting element ED2 may be disposed on the second alignment electrode pattern pRME2, one end of the second light emitting element ED2 may be disposed on the third alignment electrode pattern pRME3, one end of the third light emitting element ED3 may be disposed on the third alignment electrode pattern pRME3, and the other end of the third light emitting element ED3 may be disposed on the fourth alignment electrode pattern pRME4.

In case that the same alignment signal is applied to each of the neighboring alignment electrode patterns pRME, an electric field may not be generated. For example, in case that the same alignment signal, for example, the second alignment signal GND, is applied to the fourth alignment electrode pattern pRME4 and the fifth alignment electrode pattern pRME5, an electric field may not be formed between the fourth alignment electrode pattern pRME4 and the fifth alignment electrode pattern pRME5, so that the light emitting elements ED may not be aligned.

Accordingly, among the sequentially arranged alignment electrode patterns pRME, in case that the first alignment electrode pattern pRME1, the second alignment electrode pattern pRME2, the third alignment electrode pattern pRME3, and the fourth alignment electrode pattern pRME4 are referred to as a "first unit" and the fifth alignment electrode pattern pRME5, the sixth alignment electrode pattern pRME6, the seventh alignment electrode pattern pRME7, and the eighth alignment electrode pattern pRME8 are referred to as a "second unit," the deterioration of the luminous efficiency of the pixel PX, which occurs in case that the light emitting element ED is aligned in a portion other than the emission area EMA, may be prevented by inverting the alignment signal applied to the first unit and the alignment signal applied to the second unit. In the same manner that the first type sub-pixel SPXna and the second type sub-pixel SPXnb described above are alternately and repeatedly disposed, the first unit and the second unit may be alternately and repeatedly disposed.

For example, in case that the first alignment signal AC is applied to the first alignment electrode pattern pRME1, the second alignment signal GND is applied to the second alignment electrode pattern pRME2, the first alignment signal AC is applied to the third alignment electrode pattern pRME3, the second alignment signal GND is applied to the fourth alignment electrode pattern pRME4, the second alignment signal GND is applied to the fifth alignment electrode pattern pRME5, the first alignment signal AC is applied to the sixth alignment electrode pattern pRME6, the second alignment signal GND is applied to the seventh alignment electrode pattern pRME7, and the first alignment signal AC is applied to the eighth alignment electrode pattern pRME8, the same first alignment signal AC may be applied to the first alignment electrode pattern pRME1 and the adjacent eighth alignment electrode pattern pRME8, so that the light emitting element ED may not be aligned because an electric field is not formed between the first alignment electrode pattern pRME1 and the eighth alignment electrode pattern pRME8, and the same second alignment signal GND may be applied to the fourth alignment electrode pattern pRME4 and the adjacent fifth alignment electrode pattern pRME5, so that the light emitting element ED may not be aligned because an electric field is not formed between the fourth alignment electrode pattern pRME4 and the fifth alignment electrode pattern pRME5.

Referring to FIGS. 19 and 20, the orientation of the light emitting elements ED arranged on the first unit and the second unit may be inspected using the protruding portion RME1*a* included in the first alignment electrode pattern pRME1 as an identification pattern.

For example, the orientation of the light emitting elements ED arranged in the first unit and the second unit may be changed by the light emitting element ED alignment process described above in conjunction with FIGS. 12 to 18, and in case that the orientation of the light emitting element ED is incorrectly aligned, the lighting efficiency of the pixel PX may decrease, so that it is necessary to distinguish the first unit and the second unit in order to readily inspect whether the light emitting element ED is aligned with the correct orientation. Accordingly, the first unit and the second unit may be distinguished by using the protruding portion RME1*a* of the first alignment electrode pattern pRME1 as the identification pattern. The first unit may become the alignment electrode RME disposed in the first type sub-pixel SPXna through a subsequent process, and the second unit may become the alignment electrode RME disposed in the second type sub-pixel SPXnb through a subsequent process.

In case that there is no identification pattern for identifying the first unit and the second unit as illustrated in FIG. 21, it may not be possible to identify a portion the first unit starts, so that it may be difficult to inspect whether the orientation of the light emitting elements ED is correctly aligned, and thus element reliability of the display device 1 may be lowered.

Accordingly, in case that the first alignment electrode pattern pRME1 includes the protruding portion RME1*a*, the portion in which the alignment signal is inverted, for example, the portion in which the first unit starts, may be identified by the protruding portion RME1*a*, so that whether the orientations of the light emitting elements ED are correctly aligned may be readily inspected, and thus element reliability of the display device 1 may be improved.

The protruding portion RME1*a* may not be disposed in the emission area EMA. This may prevent a case where the alignment of the light emitting element ED of the ink INK disposed in the emission area EMA is affected in case that the protruding portion RME1*a* is disposed in the emission area EMA.

Hereinafter, other embodiments of the display device 1 will be described. In the following embodiments, description of the same components as those of the above-described embodiment, which are denoted by like reference numerals, will be omitted or simplified, and differences will be described.

Figure 22:
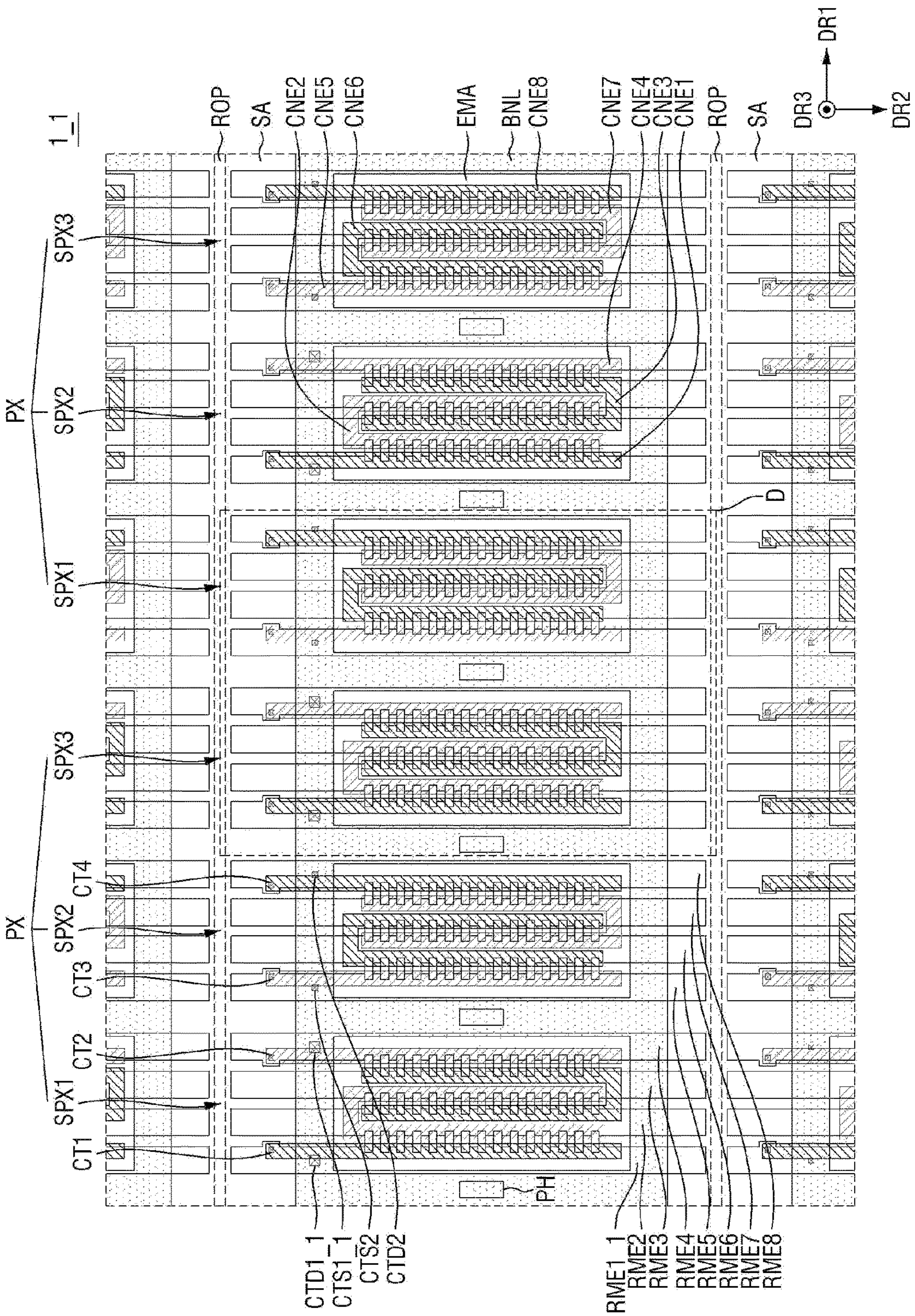
FIG. 22 is a plan view illustrating a pixel structure of a display device according to an embodiment.
Figure 23:
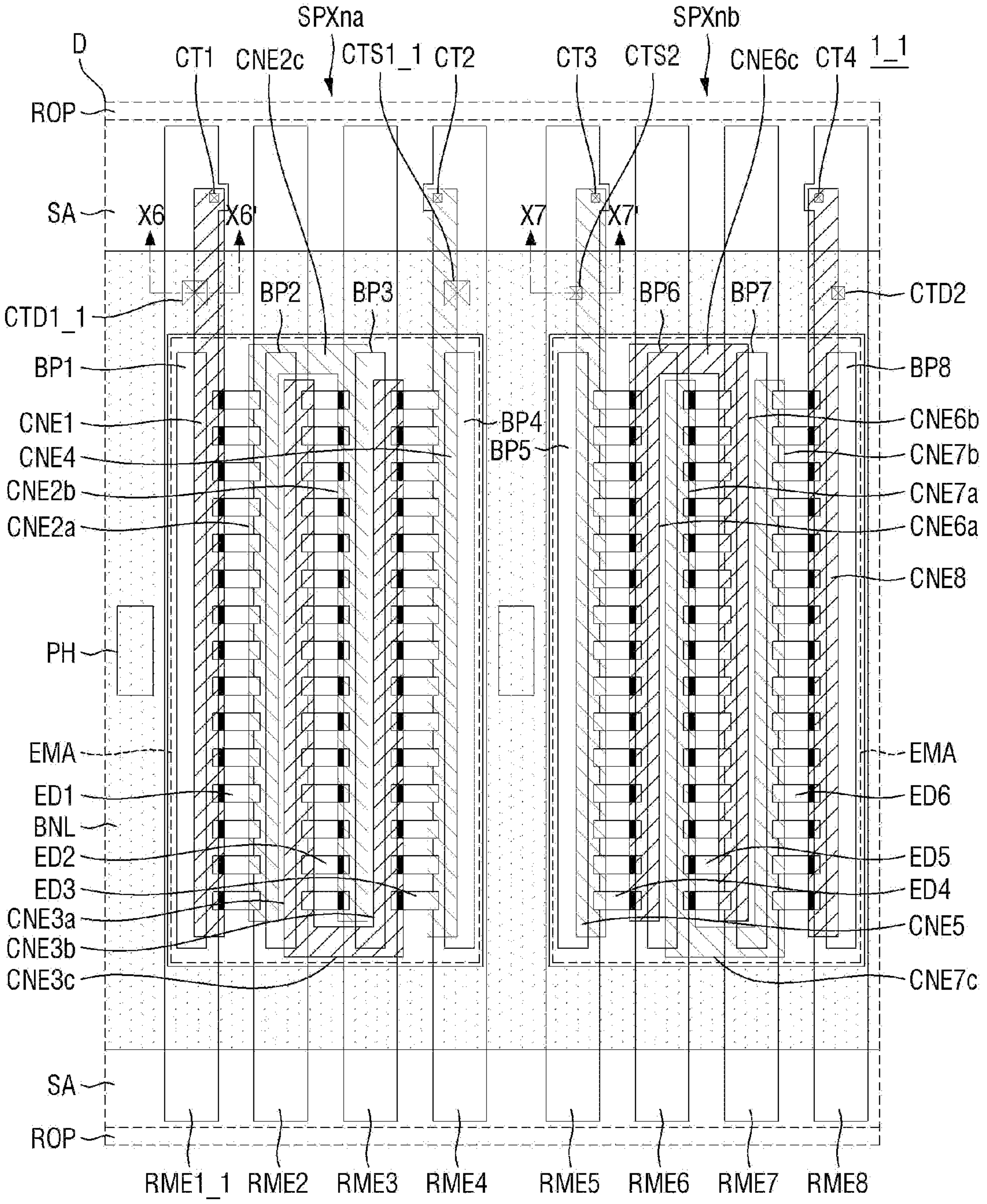
FIG. 23 is an enlarged view of area D of FIG. 22.
Figure 24:
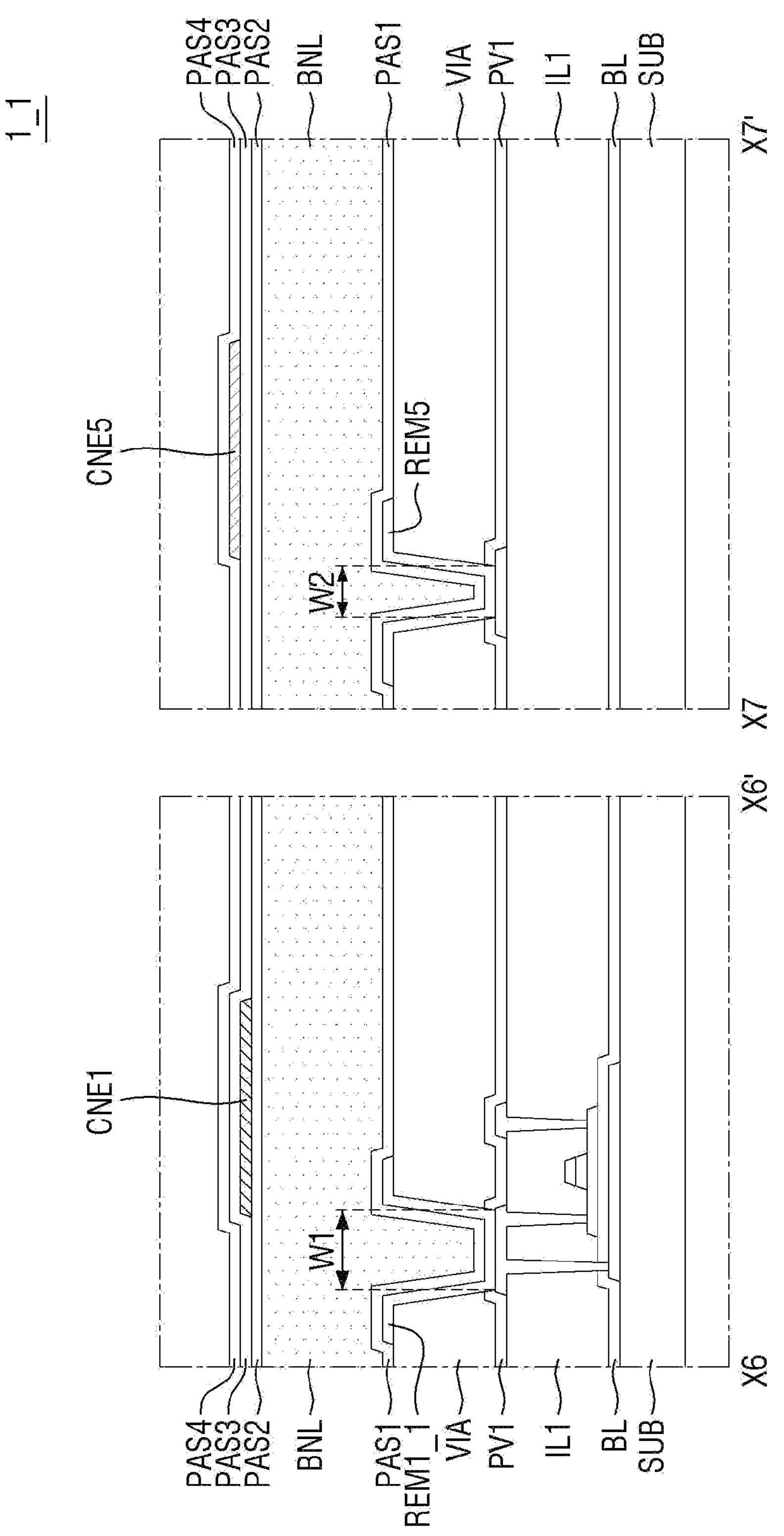
FIG. 24 is a schematic cross-sectional view illustrating a cross section taken along lines X6-X6' and X7-X7' of FIG. 23.

FIG. 22 is a plan view illustrating a pixel structure of a display device according to an embodiment. FIG. 23 is an enlarged view of area D of FIG. 22. FIG. 24 is a schematic cross-sectional view illustrating a cross section taken along lines X6-X6' and X7-X7' of FIG. 23.

Referring to FIGS. 22 to 24, according to an embodiment, in a display device 1_1, the size of each of a first electrode contact hole CTD1_1 and a second electrode contact hole CTS1_1 may be greater than the size of each of the third electrode contact hole CTS2 and the fourth electrode contact hole CTD2 in a plan view and thus the first type sub-pixel SPXna and the second type sub-pixel SPXnb may be distinguished. For example, the size of each of the first electrode contact hole CTD1_1 and the second electrode contact hole CTS1_1 may be used as an identification pattern for distinguishing the first type sub-pixel SPXna from the second type sub-pixel SPXnb.

Compared to the first alignment electrode RME1 described above in connection with FIG. 6, the protruding portion RME1*a* may be omitted in the first alignment electrode RME1_1 according to the embodiment. The first electrode contact hole CTD1_1 and the second electrode contact hole CTS1_1 according to the embodiment may differ from the first electrode contact hole CTD1 and the second electrode contact hole CTS1 of FIG. 6 in that the sizes of the first electrode contact hole CTD1_1 and the second electrode contact hole CTS1_1 are greater, and other configurations may be substantially the same.

In an embodiment, as illustrated in FIG. 24, a width W1 of the first electrode contact hole CTD1_1 may be greater than a width W2 of the third electrode contact hole CTS2 in a direction. Accordingly, since the first type sub-pixel SPXna in which the first electrode contact hole CTD1_1 is disposed and the second type sub-pixel SPXnb in which the third electrode contact hole CTS2 is disposed may be distinguished, and as described in connection with FIGS. 12 to 21, a portion in which the alignment signal is inverted may be identified, it may be possible to readily inspect whether the orientation of the light emitting elements ED is correctly aligned, and thus element reliability of the display device 1_1 may be improved.

In embodiments, although FIGS. 22 to 24 illustrate that the sizes of the first electrode contact hole CTD1_1 and the second electrode contact hole CTS1_1 are substantially the same and the sizes of the third electrode contact hole CTS2 and the fourth electrode contact hole CTD2 are substantially the same, the disclosure is not limited thereto. The size of the electrode contact holes is not limited thereto as long as the first type sub-pixel SPXna and the second type sub-pixel SPXnb may be distinguished.

In embodiments, in case that the electrode contact holes are disposed to overlap the external bank BNL, the external bank BNL may be formed of an organic insulating material made of a transparent material such as polyimide to increase visibility of the electrode contact holes, but the disclosure is not limited thereto.

Figure 25:
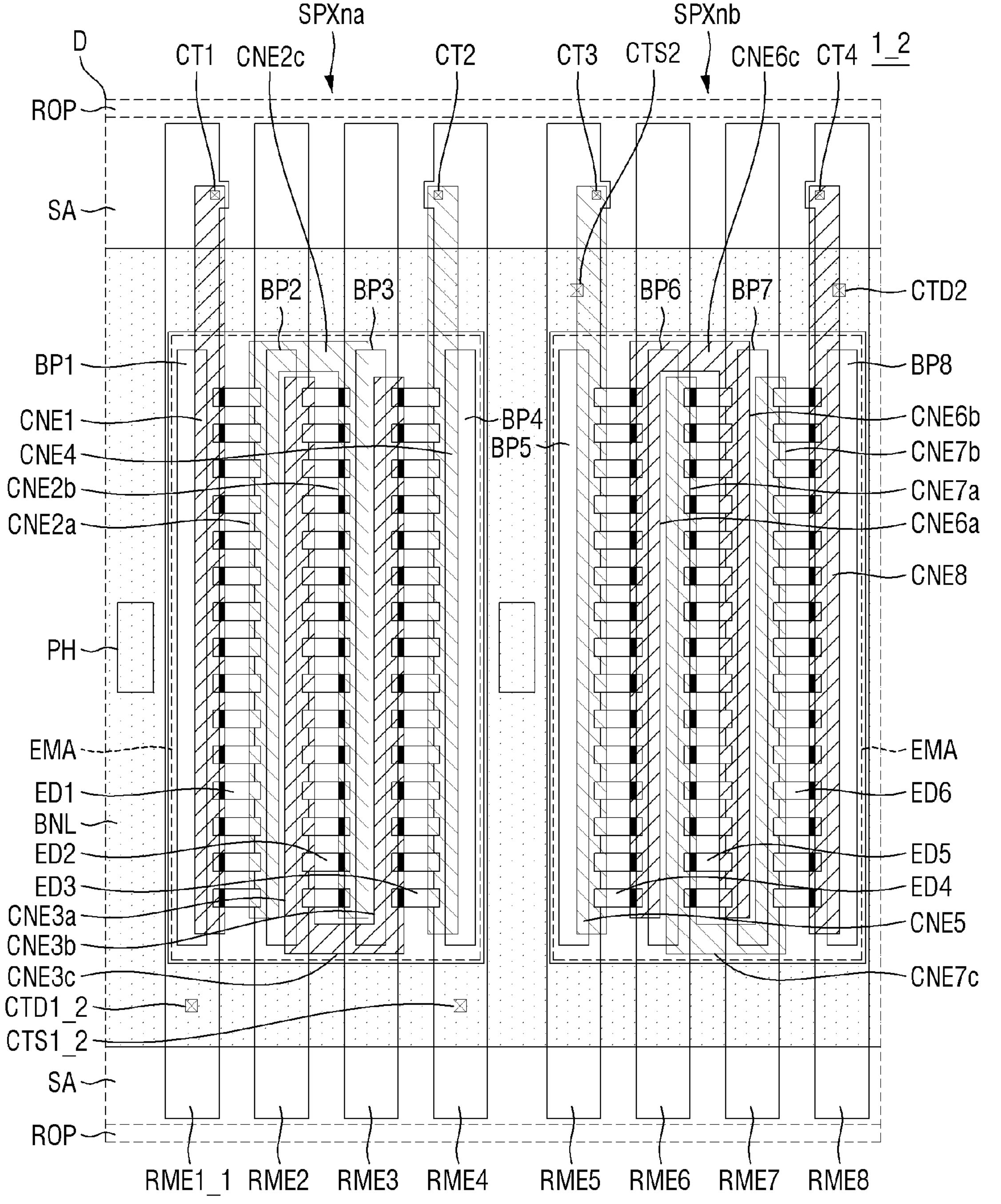
FIG. 25 is a plan view illustrating a pixel structure of a display device according to an embodiment.

FIG. 25 is a plan view illustrating a pixel structure of a display device according to an embodiment.

Referring to FIG. 25, according to an embodiment, in a display device 1_2, the first type sub-pixel SPXna and the second type sub-pixel SPXnb may be distinguished by changing the position of the electrode contact hole. In an embodiment, the position of each of a first electrode contact hole CTD1_2, a second electrode contact hole CTS1_2, a third electrode contact hole CTS2, and a fourth electrode contact hole CTD2 may be used as an identification pattern for distinguishing the first type sub-pixel SPXna from the second type sub-pixel SPXnb.

Compared to the first alignment electrode RME1 described above in connection with FIG. 6, the protruding portion RME1*a* may be omitted in the first alignment electrode RME1_1 according to the embodiment. The first electrode contact hole CTD1_2 and the second electrode contact hole CTS1_2 according to the embodiment may differ from the first electrode contact hole CTD1 and the second electrode contact hole CTS1 of FIG. 6 in that the positions thereof are different, and other configurations may be substantially the same.

For example, the first electrode contact hole CTD1_2 and the second electrode contact hole CTS1_2 may be disposed adjacent to the emission area EMA of the first type sub-pixel SPXna in the second direction DR2, and the third electrode contact hole CTS2 and the fourth electrode contact hole CTD2 may be disposed adjacent to the emission area EMA of the second type sub-pixel SPXnb in an opposite direction of the second direction DR2, so that the first type sub-pixel SPXna and the second type sub-pixel SPXnb may be distinguished. However, as long as the first type sub-pixel SPXna and the second type sub-pixel SPXnb may be distinguished, the positions of the electrode contact holes are not limited thereto.

Figure 26:
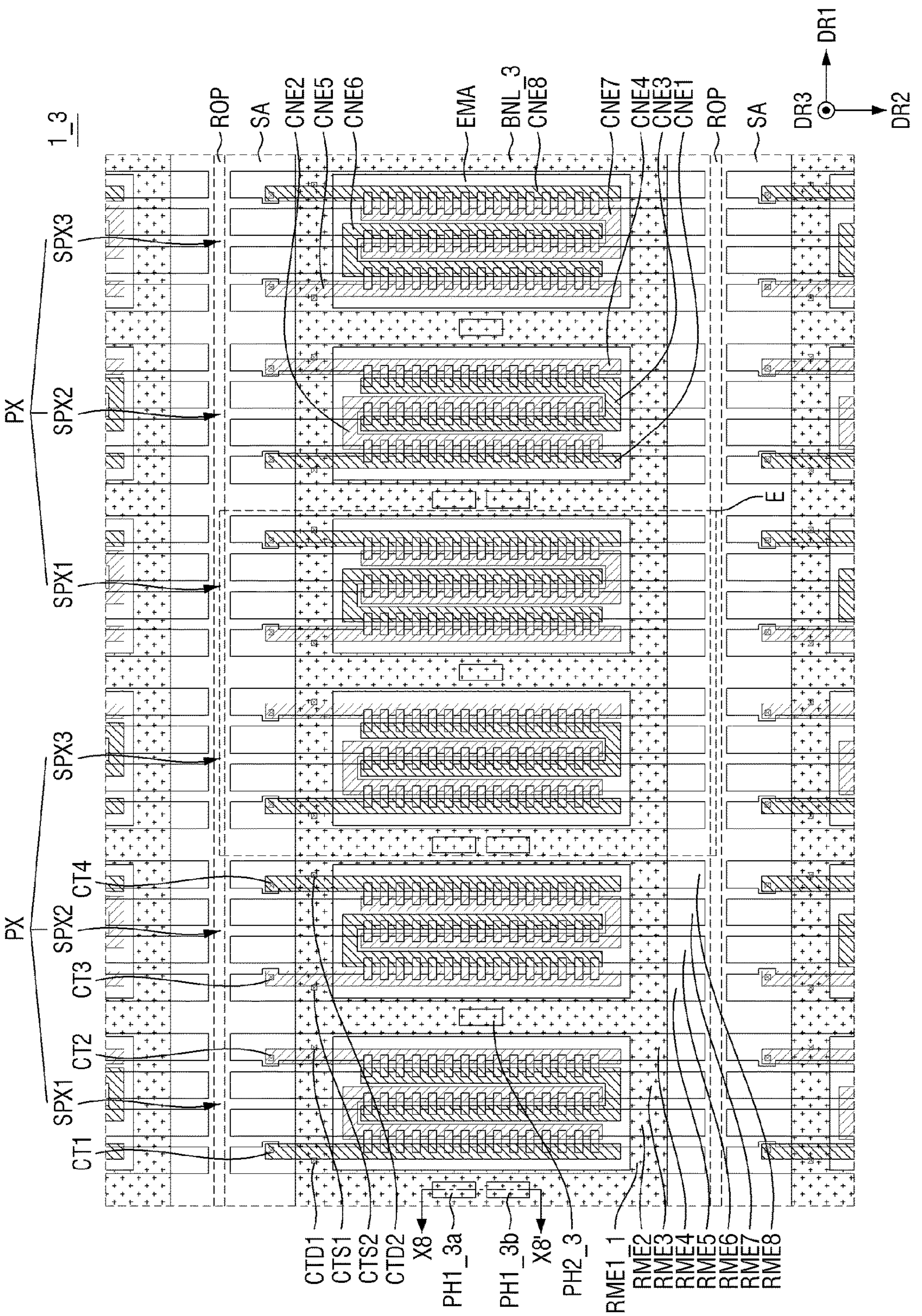
FIG. 26 is a plan view illustrating a pixel structure of a display device according to an embodiment.
Figure 27:
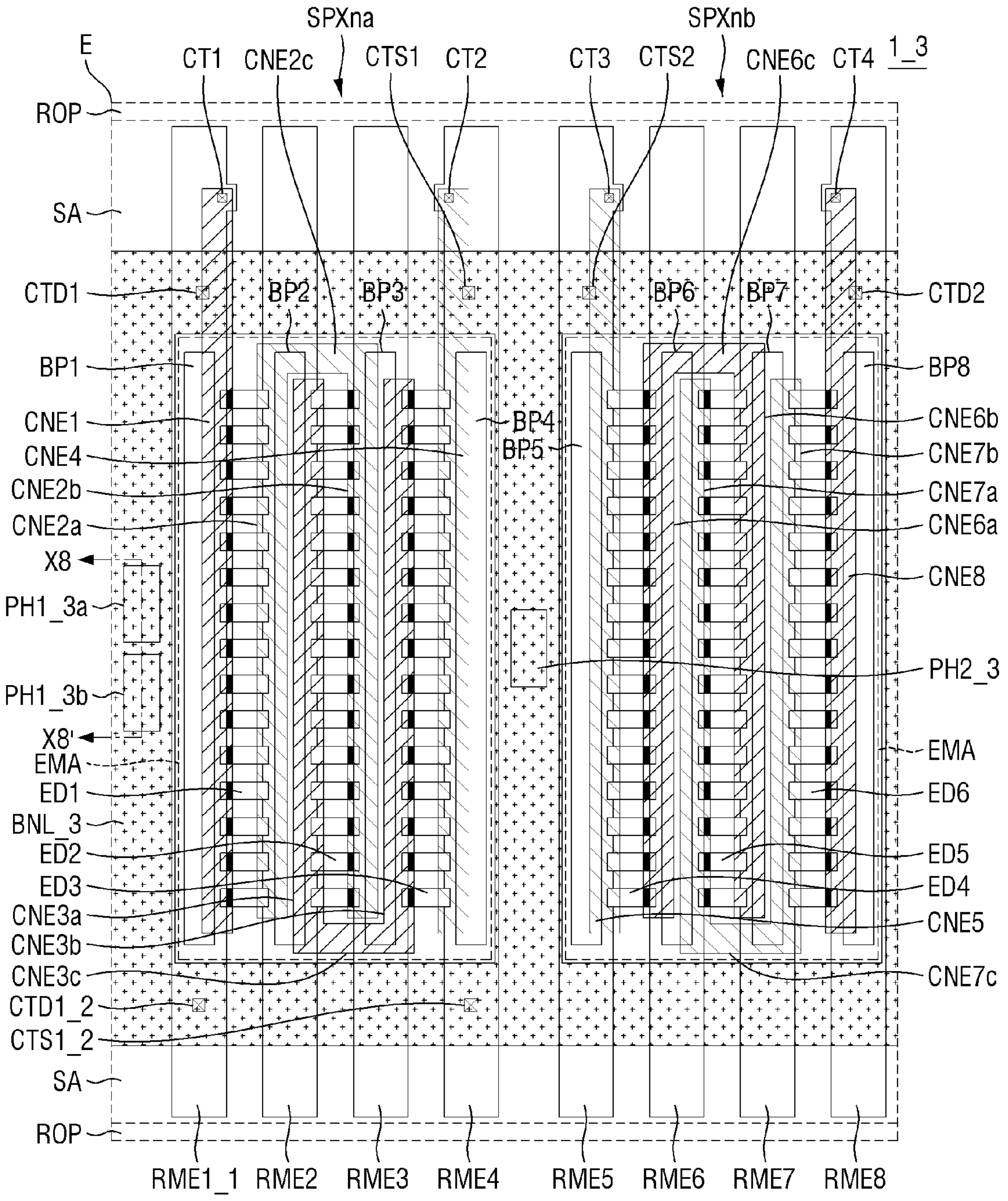
FIG. 27 is an enlarged view of area E of FIG. 26.
Figure 28:
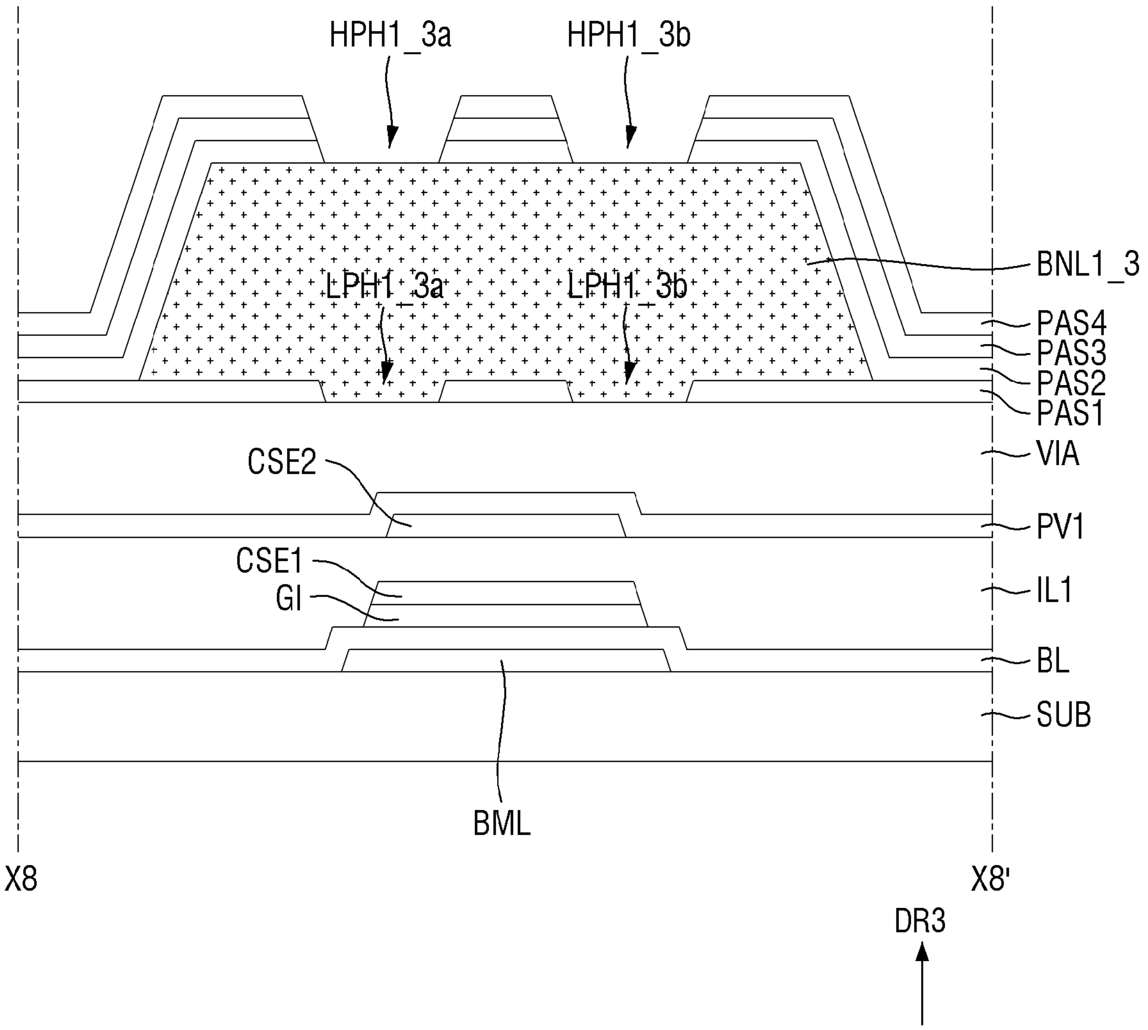
FIG. 28 is a schematic cross-sectional view illustrating a cross section taken along line X8-X8' of FIG. 26.

FIG. 26 is a plan view illustrating a pixel structure of a display device according to an embodiment. FIG. 27 is an enlarged view of area E of FIG. 26. FIG. 28 is a schematic cross-sectional view illustrating a cross section taken along line X8-X8' of FIG. 26.

Referring to FIGS. 26 to 28, according to an embodiment, in a display device 1_3, the number of through holes PH1_3*a* and PH1_3*b* disposed in the first type sub-pixel SPXna may be different from the number of through holes PH2_3 disposed in the second type sub-pixel SPXnb, and thus the first type sub-pixel SPXna and the second type sub-pixel SPXnb may be distinguished. In an embodiment, the number of through holes disposed in the first type sub-pixel SPXna may be used as an identification pattern for distinguishing the first type sub-pixel SPXna from the second type sub-pixel SPXnb.

For example, the first type sub-pixel SPXna according to the embodiment may include the first through hole PH1_3*a* and the second through hole PH1_3*b*, and the second type sub-pixel SPXnb may include the third through hole PH2_3, so that the first type sub-pixel SPXna and the second type sub-pixel SPXnb may be distinguished. The first through hole PH1_3*a*, the second through hole PH1_3*b*, and the third through hole PH2_3 may have substantially the same structure as the through hole PH of FIG. 6.

In an embodiment, the first through hole PH1_3*a* may include a first lower through hole LPH1_3*a* formed in the first insulating layer PAS1 and a first upper through hole HPH1_3*a* formed in the second insulating layer PAS2, the third insulating layer PAS3, and the fourth insulating layer PAS4, and the second through hole PH1_3*b* may include a second lower through hole LPH1_3*b* formed in the first insulating layer PAS1 and a second upper through hole HPH1_3*b* formed in second insulating layer PAS2, the third insulating layer PAS3, and the fourth insulating layer PAS4.

In embodiments, the number of through holes disposed in the first type sub-pixel SPXna may be two and the number of through holes disposed in the second type sub-pixel SPXnb may be one. However, as long as the first type sub-pixel SPXna and the second type sub-pixel SPXnb may be distinguished, the number of through holes is not limited thereto.

Since the first through hole PH1_3*a*, the second through hole PH1_3*b*, and the third through hole PH2_3 are disposed to overlap the external bank BNL_3 in a plan view, the external bank BNL_3 may be formed of an organic insulating material made of a transparent material such as polyimide to increase visibility thereof. Compared to the first alignment electrode RME1 described above in connection with FIG. 6, the protruding portion RME1*a* may be omitted in the first alignment electrode RME1_1 according to the embodiment.

Figure 29:
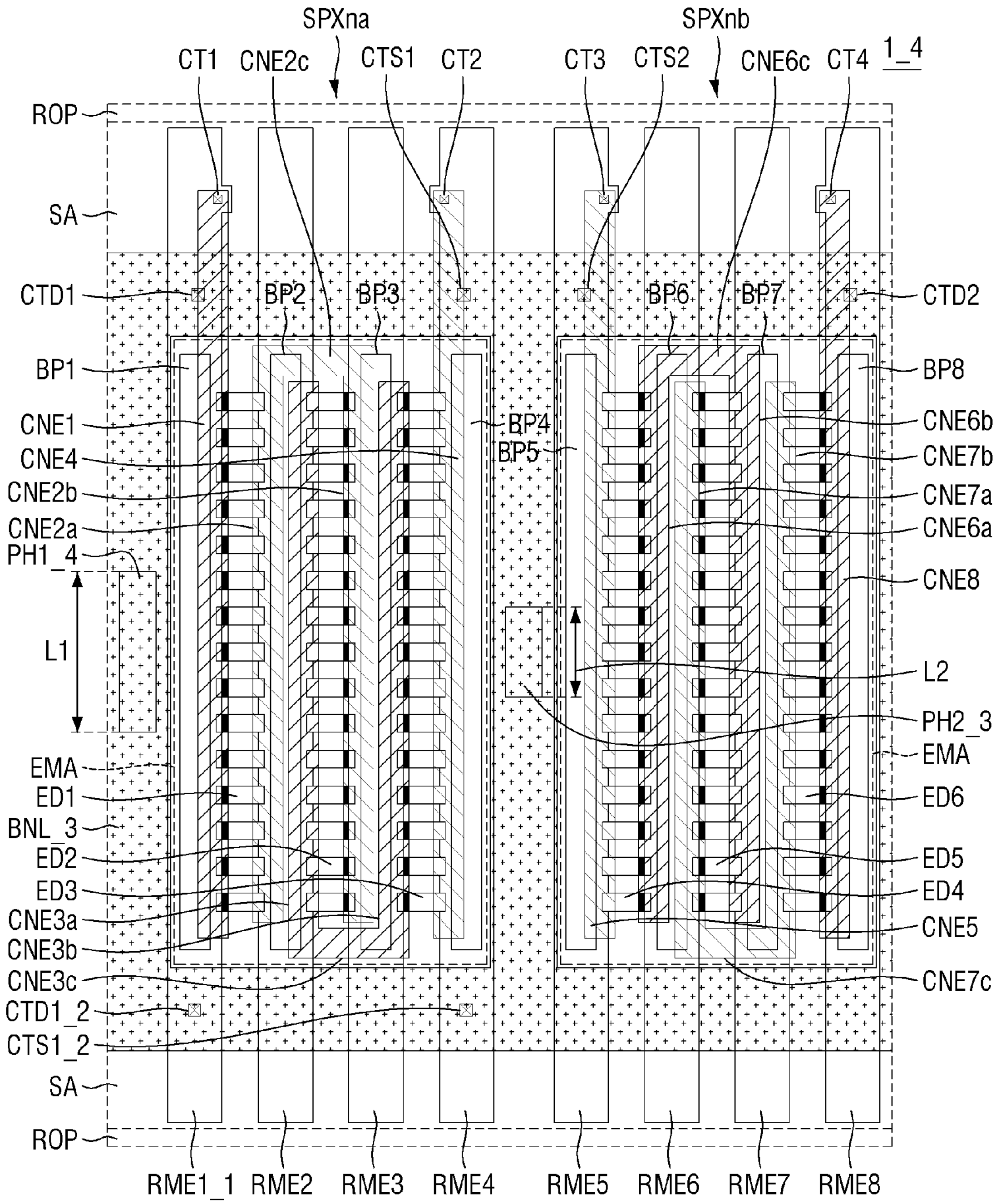
FIG. 29 is a plan view illustrating a pixel structure of a display device according to an embodiment.

FIG. 29 is a plan view illustrating a pixel structure of a display device according to an embodiment.

Referring to FIG. 29, according to an embodiment, in a display device 1_4, the size of a first through hole PH1_4 disposed in the first type sub-pixel SPXna may be different from the size of the third through hole PH2_3 disposed in the second type sub-pixel SPXnb, and thus the first type sub-pixel SPXna and the second type sub-pixel SPXnb may be distinguished. For example, the size of each of the first through hole PH1_4 and the third through hole PH2_3 may be used as an identification pattern for distinguishing the first type sub-pixel SPXna from the second type sub-pixel SPXnb.

For example, the width L1 of the first through hole PH1_4 disposed in the first type sub-pixel SPXna in the second direction DR2 may be greater than the width L2 of the third through hole PH2_3 disposed in the second type sub-pixel SPXnb in the second direction DR2, so that the first type sub-pixel SPXna and the second type sub-pixel SPXnb may be distinguished. The first through hole PH1_4 may have substantially the same structure as the through hole PH of FIG. 6.

However, as long as the first type sub-pixel SPXna and the second type sub-pixel SPXnb may be distinguished, the width L1 of the first through hole PH1_4 in the second direction DR2 and the width L2 of the third through hole PH2_3 in the second direction DR2 are not limited thereto.

In an embodiment, the first through hole PH1_4 and the third through hole PH2_3 may be disposed to overlap the external bank BNL_3 in a plan view, similarly as described in connection with FIGS. 26 to 28. In an embodiment to increase the visibility thereof, the external bank BNL_3 may be formed of an organic insulating material made of a transparent material such as polyimide. Compared to the first alignment electrode RME1 described above in connection with FIG. 6, the protruding portion RME1*a* may be omitted in the first alignment electrode RME1_1 according to the embodiment.

Figure 30:
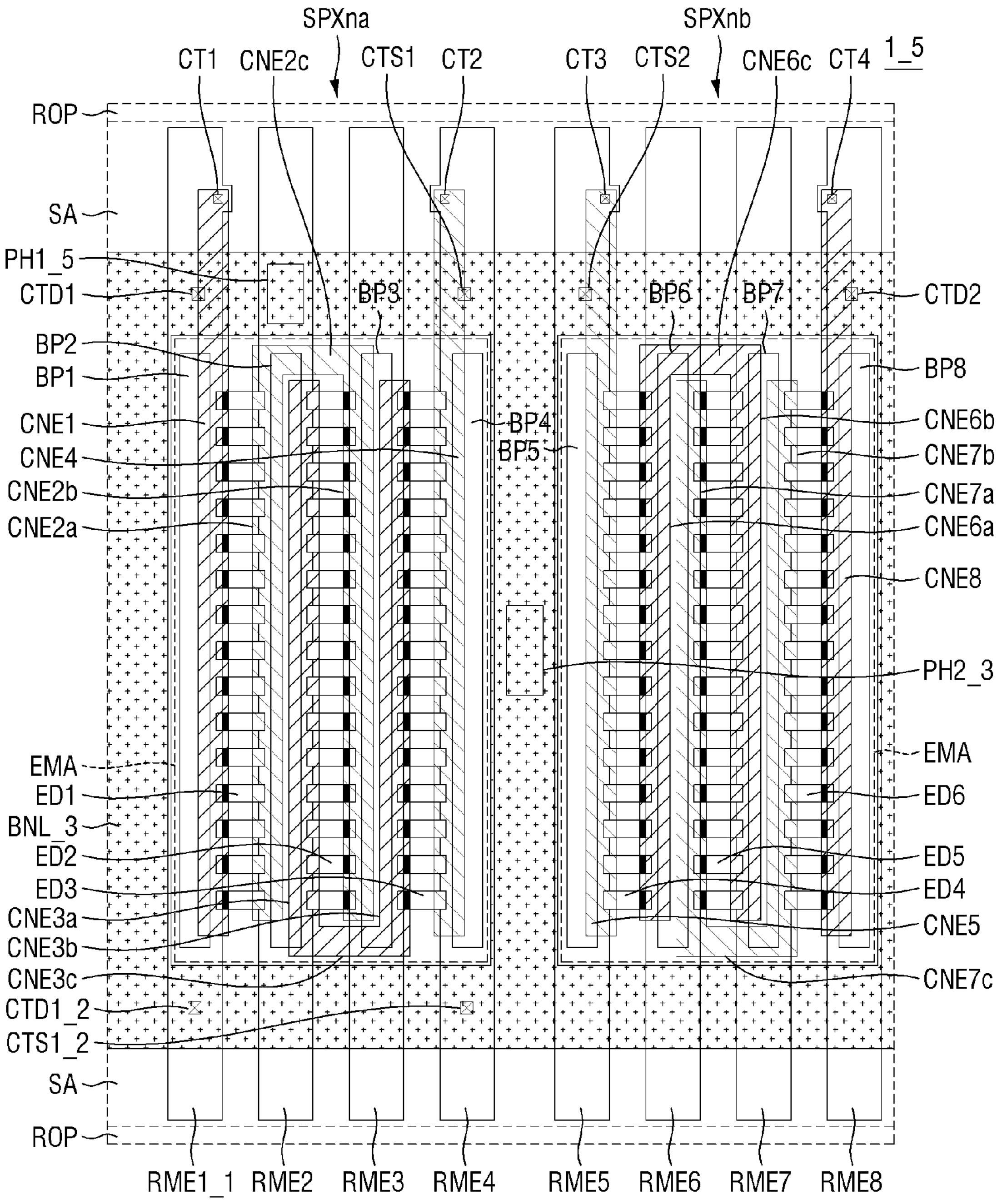
FIG. 30 is a plan view illustrating a pixel structure of a display device according to an embodiment.

FIG. 30 is a plan view illustrating a pixel structure of a display device according to an embodiment.

Referring to FIG. 30, according to an embodiment, in a display device 1_5, a position of a first through hole PH1_5 disposed in the first type sub-pixel SPXna may be different from a position of the third through hole PH2_3 disposed in the second type sub-pixel SPXnb in a plan view, and thus the first type sub-pixel SPXna and the second type sub-pixel SPXnb may be distinguished. For example, a position of the first through hole PH1_5 and a position of the third through hole PH2_3 may be used as an identification pattern for distinguishing the first type sub-pixel SPXna from the second type sub-pixel SPXnb.

For example, the first through hole PH1_5 may be positioned adjacent to the first type sub-pixel SPXna in an opposite direction of the second direction DR2 and overlap the second alignment electrode RME2 in a plan view, and the third through hole PH2_3 may be positioned adjacent to the second type sub-pixel SPXnb in an opposite direction of the first direction DR1 and may not overlap the alignment electrodes RME1_1 in a plan view, so that the first type sub-pixel SPXna and the second type sub-pixel SPXnb may be distinguished. However, as long as the first type sub-pixel SPXna and the second type sub-pixel SPXnb may be distinguished, the positions of the first through hole PH1_5 and the third through hole PH2_3 are not limited thereto.

Since the first through hole PH1_5 has substantially the same configuration and position as a first through hole PH' described above in connection with FIGS. 10 and 11, a detailed description thereof will be omitted.

The first through hole PH1_5 and the third through hole PH2_3 may be disposed to overlap the external bank BNL_3, so similarly as described in connection with FIGS. 26 to 28, in order to increase the visibility thereof, the external bank BNL_3 may be formed of an organic insulating material made of a transparent material such as polyimide. Compared to the first alignment electrode RME1 described above in connection with FIG. 6, the protruding portion RME1*a* may be omitted in the first alignment electrode RME1_1 according to the embodiment.

Figure 31:
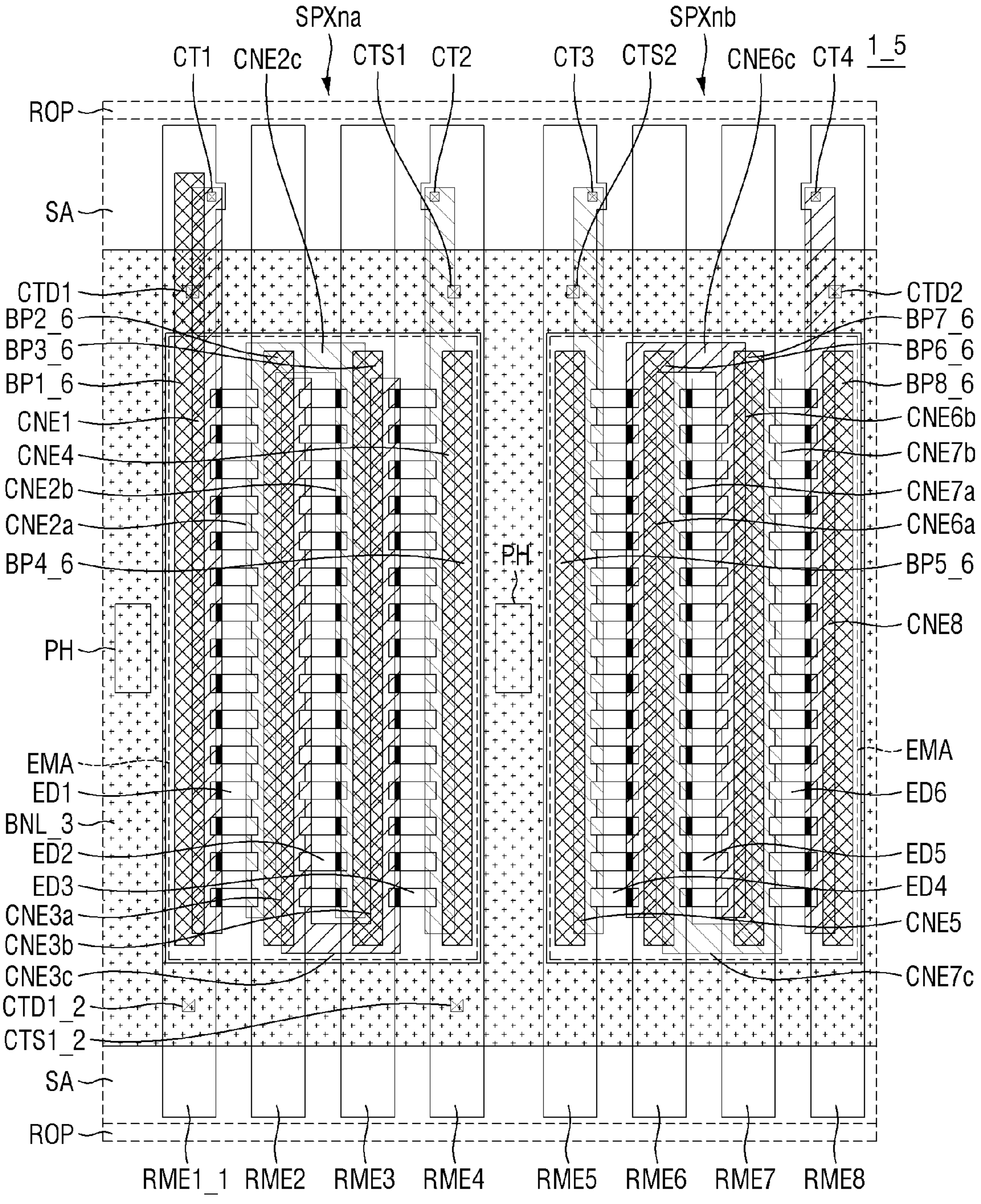
FIG. 31 is a plan view illustrating a pixel structure of a display device according to an embodiment.

FIG. 31 is a plan view illustrating a pixel structure of a display device according to an embodiment.

Referring to FIG. 31, according to an embodiment, in a display device 1_6, the first type sub-pixel SPXna and the second type sub-pixel SPXnb may be distinguished by using the size of the internal bank BP in a plan view. For example, the size of a first internal bank BP1_6 may be used as an identification pattern for distinguishing the first type sub-pixel SPXna from the second type sub-pixel SPXnb.

The internal bank BP_6 according to the embodiment, similarly as described above in connection with FIG. 6, may include the first internal bank BP1_6, a second internal bank BP2_6, a third internal bank BP3_6, a fourth internal bank BP4_6, a fifth internal bank BP5_6, a sixth internal bank BP6_6, a seventh internal bank BP7_6, and an eighth internal bank BP8_6. Compared to the first alignment electrode RME1 described above in connection with FIG. 6, the protruding portion RME1*a* may be omitted in the first alignment electrode RME1_1 according to the embodiment.

Compared to the first internal bank BP1 of the display device 1 according to the embodiment of FIG. 6, there is a difference in that the first internal bank BP1_6 may extend beyond the external bank BNL_3 in the second direction DR2, and other configurations are substantially the same or similar.

Each of the second internal bank BP2_6, the third internal bank BP3_6, the fourth internal bank BP4_6, the fifth internal bank BP5_6, the sixth internal bank BP6_6, the seventh internal bank BP7_6, and the eighth internal bank BP8_6 may be substantially the same as or similar to the configuration of each of the second internal bank BP2, the third internal bank BP3, the fourth internal bank BP4, the fifth internal bank BP5, the sixth internal bank BP6, the seventh internal bank BP7, and the eighth internal bank BP8 of the display device 1 of FIG. 6.

Since the first internal bank BP1_6 is disposed only in the first type sub-pixel SPXna, the first type sub-pixel SPXna and the second type sub-pixel SPXnb may be distinguished using the first internal bank BP1_6 as an identification pattern.

To increase the visibility of the first internal bank BP1_6, the external bank BNL-3 may be formed of an organic insulating material made of a transparent material such as polyimide, and the internal bank BP_6 may include a colored dye such as a black pigment.

In embodiments, all of the first internal bank BP1_6, the second internal bank BP2_6, the third internal bank BP3_6, the fourth internal bank BP4_6, the fifth internal bank BP5_6, the sixth internal bank BP6_6, the seventh internal bank BP7_6, and the eighth internal bank BP8_6 may include a colored dye including a black pigment, but as long as the first type sub-pixel SPXna and the second type sub-pixel SPXnb may be distinguished, the disclosure is not limited thereto.

Figure 32:
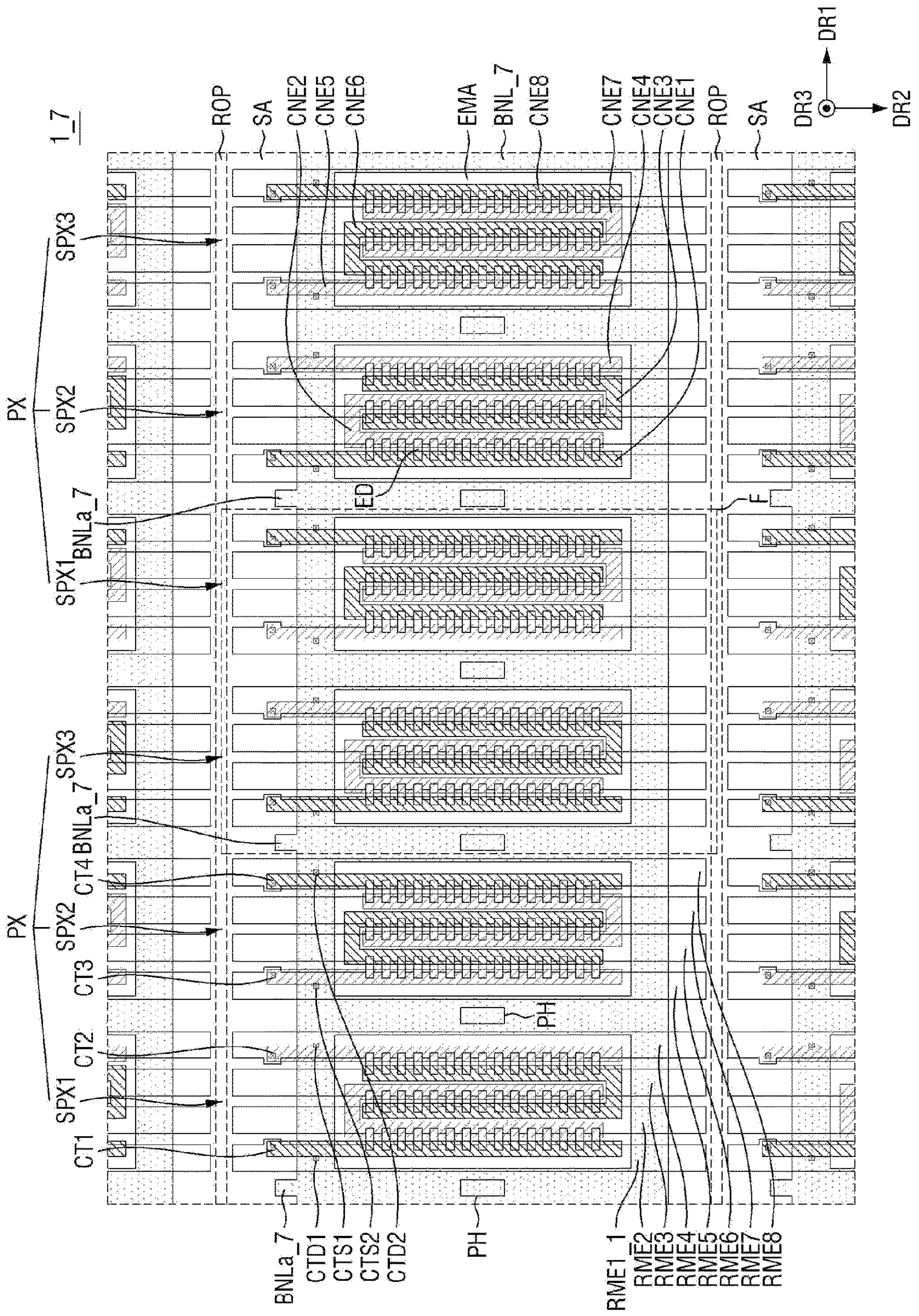
FIG. 32 is a plan view illustrating a pixel structure of a display device according to an embodiment.
Figure 33:
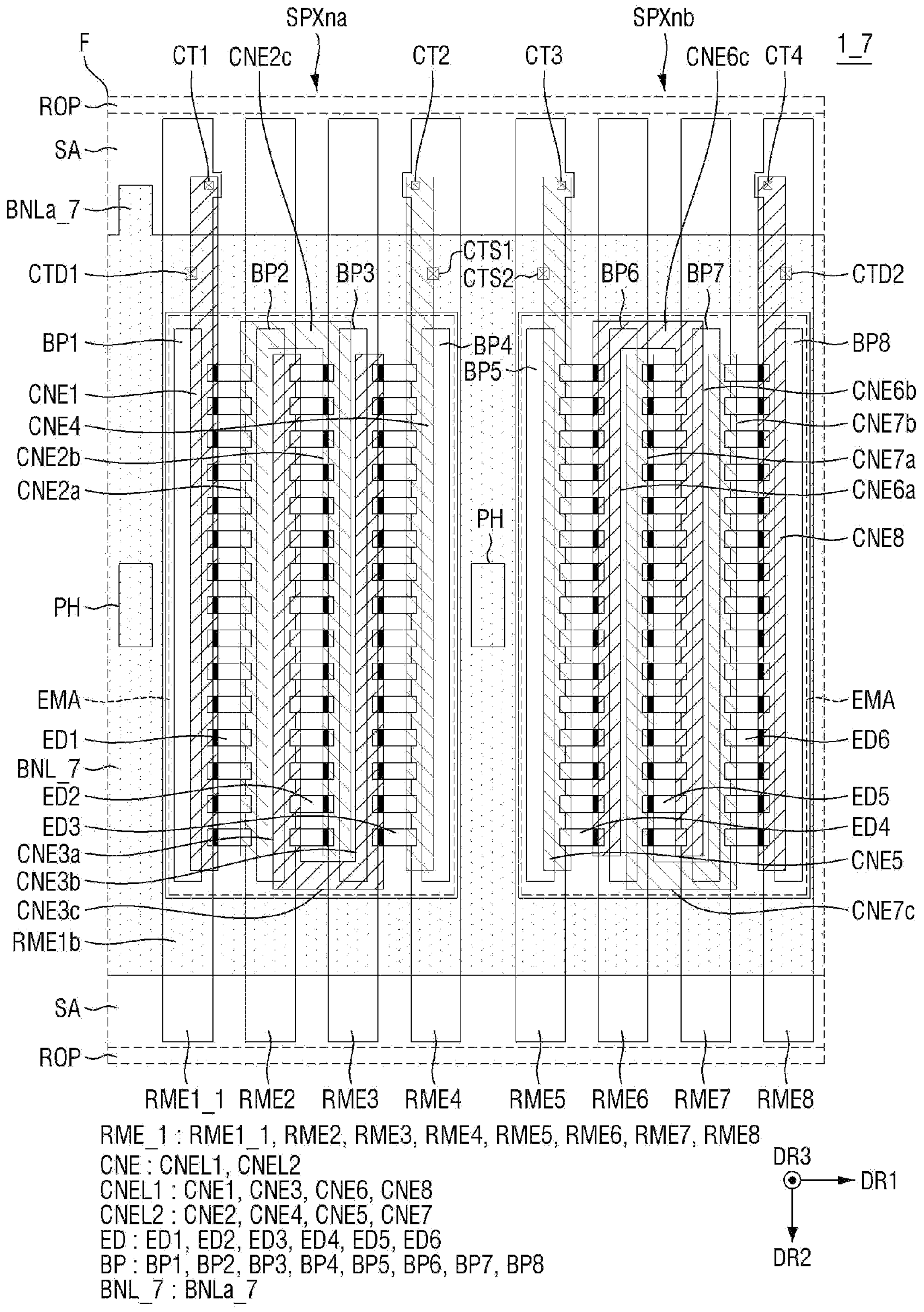
FIG. 33 is an enlarged view of area F of FIG. 32.

FIG. 32 is a plan view illustrating a pixel structure of a display device according to an embodiment. FIG. 33 is an enlarged view of area F of FIG. 32.

Referring to FIGS. 32 and 33, according to an embodiment, in a display device 1_7, a separate pattern may be formed in an external bank BNL_7, and the first type sub-pixel SPXna and the second type sub-pixel SPXnb may be distinguished. For example, a protruding portion BNLa_7 of the external bank BNL_7 may be used as an identification pattern for distinguishing the first type sub-pixel SPXna from the second type sub-pixel SPXnb.

Compared to the first alignment electrode RME1 described above in connection with FIG. 6, the protruding portion RME1*a* may be omitted in the first alignment electrode RME1_1 according to the embodiment. The external bank BNL_7 according to the embodiment may include the protruding portion BNLa_7 positioned in the first type sub-pixel SPXna.

The protruding portion BNLa_7 may protrude from the external bank BNL_7 in an opposite direction of the second direction DR2 in the first type sub-pixel SPXna. Since the first type sub-pixel SPXna includes the protruding portion BNLa_7 and the second type sub-pixel SPXnb does not include the protruding portion BNLa_7, the first type sub-pixel SPXna and the second type sub-pixel SPXnb may be distinguished.

The external bank BNL_7 may include a colored dye such as a black pigment in order to facilitate the recognition of the protruding portion BNLa_7.

Figure 34:
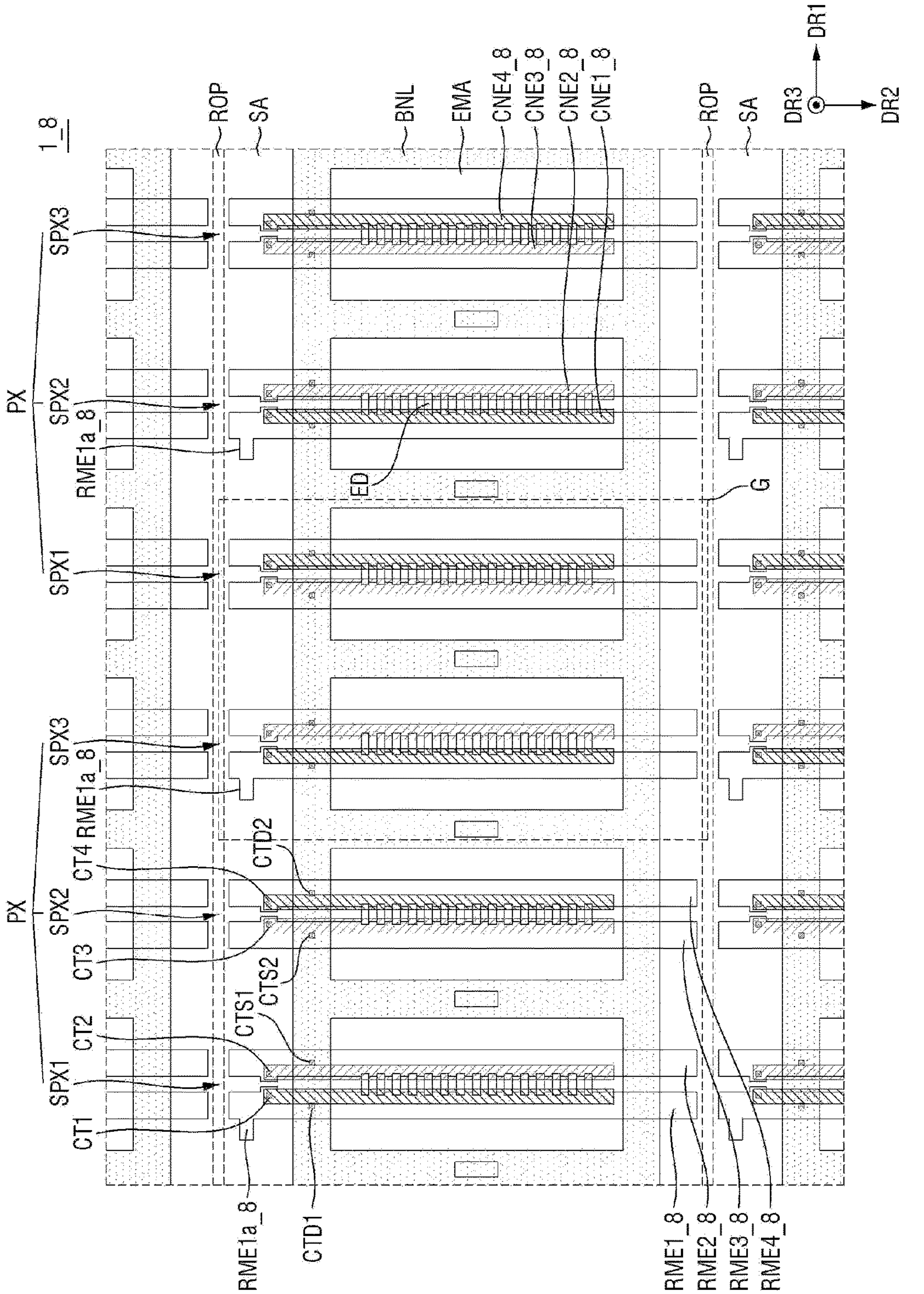
FIG. 34 is a plan view illustrating a pixel structure of a display device according to an embodiment.
Figure 35:
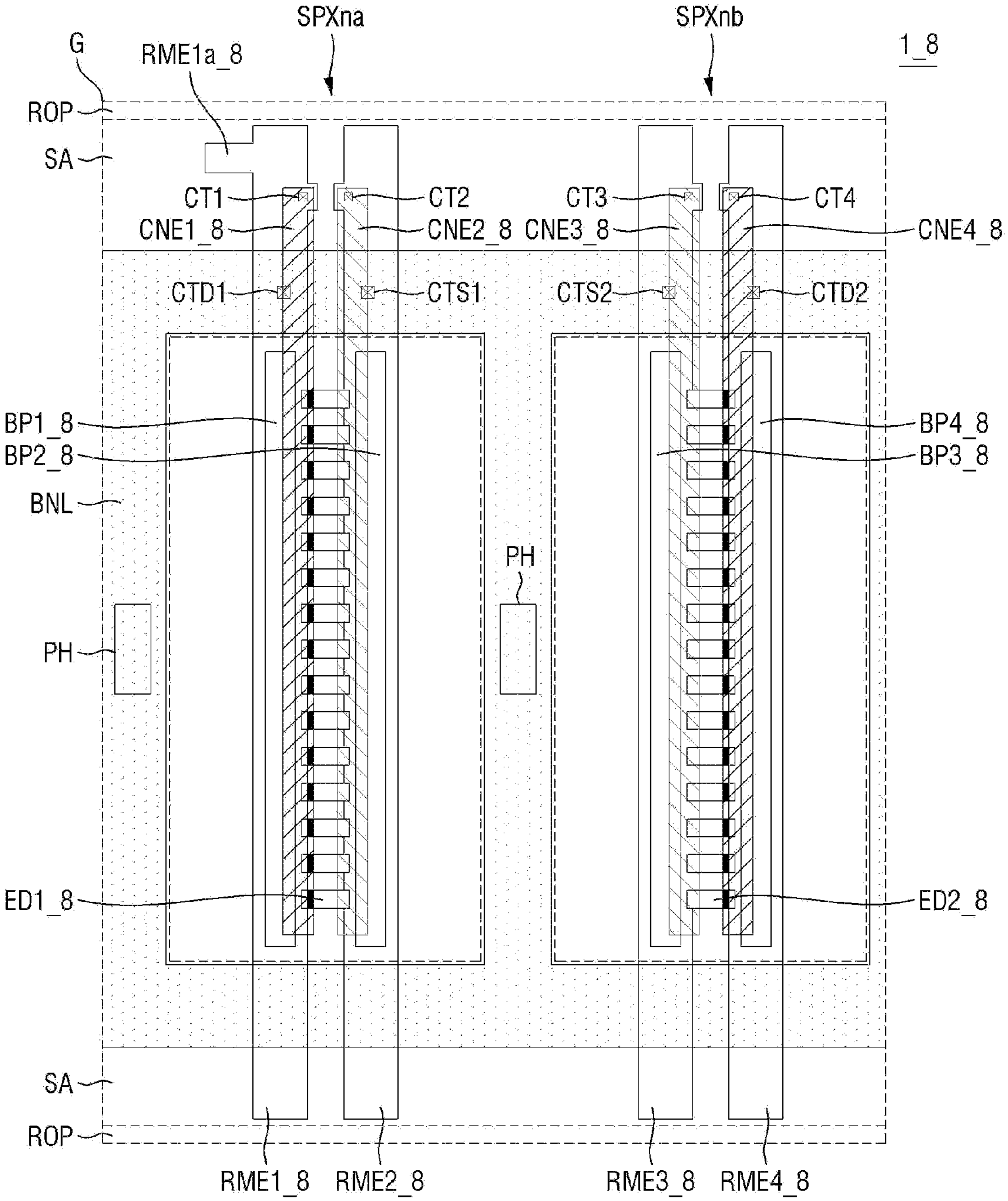
FIG. 35 is an enlarged view of area G of FIG. 34.

FIG. 34 is a plan view illustrating a pixel structure of a display device according to an embodiment. FIG. 35 is an enlarged view of area G of FIG. 34.

Referring to FIGS. 34 and 35, a display device 1_8 according to the embodiment may differ from the display device 1 according to the embodiment of FIG. 4 in that the light emitting elements ED are not connected in series in multiple numbers, and other configurations may be substantially the same or similar.

The alignment electrode of the display device 1_8 according to the embodiment may include a first alignment electrode RME1_8, a second alignment electrode RME2_8, a third alignment electrode RME3_8, and a fourth alignment electrode RME4_8 sequentially arranged in the first direction DR1. The first alignment electrode RME1_8, the second alignment electrode RME2_8, the third alignment electrode RME3_8, and the fourth alignment electrode RME4_8 may be spaced apart from each other in the first direction DR1.

The first alignment electrode RME1_8, the second alignment electrode RME2_8, the third alignment electrode RME3_8, and the fourth alignment electrode RME4_8 may be repeatedly disposed as one unit. For example, on a side of the fourth alignment electrode RME4_8 in the first direction DR1, the first alignment electrode RME1_8, the second alignment electrode RME2_8, the third alignment electrode RME3_8, and the fourth alignment electrode RME4_8 may be sequentially disposed.

Each of the sub-pixels SPXn of a pixel PX may include two alignment electrodes RME_8 that are sequentially arranged. The disposition of the alignment electrode RME_8 included in each of the sub-pixels SPXn of a pixel PX may vary according to the repeated disposition of the alignment electrode RME_8 described above. For example, the disposition of the alignment electrode RME_8 included in each of the sub-pixels SPXn of the two neighboring pixels PX may be different.

The first type sub-pixel SPXna may include the first alignment electrode RME1_8 and the second alignment electrode RME2_8, and the second type sub-pixel SPXnb may include the third alignment electrode RME3_8 and the fourth alignment electrode RME4_8.

The first alignment electrode RME1_8 of the first type sub-pixel SPXna may have substantially the same structure as the first alignment electrode RME1 of the display device 1 of FIG. 4. For example, the first alignment electrode RME1_8 may generally extend in the second direction DR2 and include a protruding portion RME1_8*a* protruding in an opposite direction of the first direction DR1.

The first alignment electrode RME1_8 may be electrically connected to the above-described circuit element layer through the first electrode contact hole CTD1. The first alignment electrode RME1_8 may receive the first power voltage described above through the first electrode contact hole CTD1.

The second alignment electrode RME2_8 of the first type sub-pixel SPXna may generally extend in the second direction DR2. A first light emitting element ED1_8 may be disposed in a space between the second alignment electrode RME2_8 and the first alignment electrode RME1_8.

The second alignment electrode RME2_8 may be electrically connected to the above-described circuit element layer through the second electrode contact hole CTS1. The second alignment electrode RME2_8 may receive the second power voltage described above through the second electrode contact hole CTS1.

The third alignment electrode RME3_8 of the second type sub-pixel SPXnb may generally extend in the second direction DR2.

The third alignment electrode RME3_8 may be electrically connected to the above-described circuit element layer through the third electrode contact hole CTS2. The third alignment electrode RME3_8 may receive the above-described second power voltage through the third electrode contact hole CTS2.

The fourth alignment electrode RME4_8 of the second type sub-pixel SPXnb may generally extend in the second direction DR2. A second light emitting element ED2_8 may be disposed in a space between the fourth alignment electrode RME4_8 and the third alignment electrode RME3_8.

The fourth alignment electrode RME4_8 may be electrically connected to the above-described circuit element layer through the fourth electrode contact hole CTD2. The fourth alignment electrode RME4_8 may receive the first power voltage described above through the fourth electrode contact hole CTD2.

A light emitting element ED_8 may include the first light emitting element ED1_8 disposed in a space between the first alignment electrode RME1_8 and the second alignment electrode RME2_8 and the second light emitting element ED2_8 disposed in a space between the third alignment electrode RME3_8 and the fourth alignment electrode RME4_8.

One end of the first light emitting element ED1_8 may be disposed on the first alignment electrode RME1_8, and the other end thereof may be disposed on the second alignment electrode RME2_8. One end of the second light emitting element ED2_8 may be disposed on the third alignment electrode RME3_8, and the other end thereof may be disposed on the fourth alignment electrode RME4_8.

As illustrated in FIG. 35, multiple internal banks BP_8 may be disposed under the alignment electrode RME_8. The internal banks BP_8 may be disposed in the emission area EMA. Each of the internal banks BP_8 may include a first internal bank BP1_8, a second internal bank BP2_8, a third internal bank BP3_8, and a fourth internal bank BP4_8 having a rectangular planar shape extending in the second direction DR2 in a plan view. The first internal bank BP1_8, the second internal bank BP2_8, the third internal bank BP3_8, and the fourth internal bank BP4_8 may be spaced apart from each other in the first direction DR1.

The first internal bank BP1_8 may be disposed under the first alignment electrode RME1_8 in the emission area EMA of the first type sub-pixel SPXna, the second internal bank BP2_8 may be disposed under the second alignment electrode RME2_8 in the emission area EMA of the first type sub-pixel SPXna, the third internal bank BP3_8 may be disposed under the third alignment electrode RME3_8 in the emission area EMA of the second type sub-pixel SPXnb, and the fourth internal bank BP4_8 may be disposed under the fourth alignment electrode RME4_8 in the emission area EMA of the second type sub-pixel SPXnb.

The connection electrode CNE_8 may be disposed on the light emitting elements ED_8. The connection electrode CNE_8 may include a first connection electrode layer CNEL1_8 and a second connection electrode layer CNEL2_8. The first connection electrode layer CNEL1_8 and the second connection electrode layer CNEL2_8 may be distinguished according to a stacking order.

The first connection electrode layer CNEL1_8 may include a first connection electrode CNE1_8 disposed in the first type sub-pixel SPXna and a third connection electrode CNE3_8 disposed in the second type sub-pixel SPXnb. The second connection electrode layer CNEL2_8 may include a second connection electrode CNE2_8 disposed in the first type sub-pixel SPXna and a fourth connection electrode CNE4_8 disposed in the second type sub-pixel SPXnb.

The first connection electrode CNE1_8 of the first type sub-pixel SPXna may have a shape that generally extends in the second direction DR2. The first connection electrode CNE1_8 may be disposed on the first alignment electrode RME1_8.

A portion of the first connection electrode CNE1_8 may be connected to the first alignment electrode RME1_8 through the first contact portion CT1 disposed outside of the emission area EMA, and another portion of the first connection electrode CNE1_8 may be electrically connected to one end of the first light emitting element ED1_8 in the emission area EMA. Accordingly, the first connection electrode CNE1_8 may be supplied with the above-described first power voltage through the first alignment electrode RME1_8.

The second connection electrode CNE2_8 of the first type sub-pixel SPXna may have a shape that generally extends in the second direction DR2. The second connection electrode CNE2_8 may be disposed on the second alignment electrode RME2_8.

A portion of the second connection electrode CNE2_8 may be connected to the second alignment electrode RME2_8 through the second contact portion CT2 disposed outside of the emission area EMA, and another portion of the second connection electrode CNE2_8 may be electrically connected to the other end of the first light emitting element ED1_8 in the emission area EMA. Accordingly, the second connection electrode CNE2_8 may be supplied with the above-described second power voltage through the second alignment electrode RME2_8.

The third connection electrode CNE3_8 of the second type sub-pixel SPXnb may have a shape that generally extends in the second direction DR2. The third connection electrode CNE3_8 may be disposed on the third alignment electrode RME3_8.

A portion of the third connection electrode CNE3_8 may be connected to the third alignment electrode RME3_8 through the third contact portion CT3 disposed outside of the emission area EMA, and another portion of the third connection electrode CNE3_8 may be electrically connected to the other end of the second light emitting element ED2_8 in the emission area EMA. Accordingly, the third connection electrode CNE3_8 may be supplied with the above-described second power voltage through the third alignment electrode RME3_8.

The fourth connection electrode CNE4_8 of the second type sub-pixel SPXnb may have a shape that generally extends in the second direction DR2. The fourth connection electrode CNE4_8 may be disposed on the fourth alignment electrode RME4_8.

A portion of the fourth connection electrode CNE4_8 may be connected to the fourth alignment electrode RME4_8 through the fourth contact portion CT4 disposed outside of the emission area EMA, and another portion of the fourth connection electrode CNE4_8 may be electrically connected to one end of the second light emitting element ED2_8 in the emission area EMA. Accordingly, the fourth connection electrode CNE4_8 may be supplied with the above-described first power voltage through the fourth alignment electrode RME4_8.

With the configuration as described above, the display device 1_8 according to the embodiment may distinguish the first type sub-pixel SPXna from the second type sub-pixel SPXnb by using a protruding portion RME1*a*_8 included in the first alignment electrode RME1_8 as an identification pattern.

FIGS. 34 and 35 illustrate that the light emitting elements ED are arranged in one column, but the number of columns in which the light emitting elements ED are arranged is not limited thereto as long as the same alignment signal is applied to the alignment electrodes in which the first type sub-pixel SPXna and the second type sub-pixel SPXnb are adjacent to each other. For example, the number of columns in which the light emitting elements ED are arranged may be an odd number.

In FIGS. 34 and 35, the protruding portion RME1*a*_8 included in the first alignment electrode RME1_8 may be used as an identification pattern for distinguishing the first type sub-pixel SPXna from the second type sub-pixel SPXnb, but the disclosure is not limited thereto. For example, embodiments described above in conjunction with FIGS. 22 to 33 may be used as an identification pattern for distinguishing the first type sub-pixel SPXna from the second type sub-pixel SPXnb.

The above description is an example of technical features of the disclosure, and those skilled in the art to which the disclosure pertains will be able to make various modifications and variations. Thus, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:

a display area where an image is displayed;

a non-display area disposed adjacent to the display area;

a first sub-pixel disposed in the display area; and a second sub-pixel disposed adjacent to the first sub-pixel in the display area, wherein each of the first sub-pixel and the second sub-pixel comprises:

a plurality of alignment electrodes spaced apart from each other in a first direction and extending through the respective first sub-pixel and second sub-pixel in a second direction crossing the first direction; and a plurality of light emitting elements disposed between adjacent ones of the plurality of alignment electrodes, each of the plurality of light emitting elements comprises:

a first end having a first polarity; and a second end having a second polarity different from the first polarity, a position and orientation of the plurality of light emitting elements in the first sub-pixel are symmetrical with a position and orientation of the plurality of light emitting elements in the second sub-pixel about an imaginary line separating the first sub-pixel and the second sub-pixel, and at least one of the plurality of alignment electrodes in the first sub-pixel comprises an identification pattern for distinguishing the first sub-pixel from the second sub-pixel.

2. The display device of claim 1, wherein the plurality of alignment electrodes comprise:

a first alignment electrode and a second alignment electrode spaced apart from each other in the first sub-pixel; and a third alignment electrode and a fourth alignment electrode spaced apart from each other in the second sub-pixel, and at least one of the first alignment electrode and the second alignment electrode comprises a portion protruding in a direction as the identification pattern.

3. The display device of claim 2, wherein the first sub-pixel comprises an emission area in which the plurality of light emitting elements are disposed, and the identification pattern does not overlap the emission area in a plan view.

4. The display device of claim 3, wherein the second alignment electrode is disposed between the first alignment electrode and the third alignment electrode, the third alignment electrode is disposed between the second alignment electrode and the fourth alignment electrode, the plurality of light emitting elements comprise:

a first light emitting element disposed between the first alignment electrode and the second alignment electrode; and a second light emitting element disposed between the third alignment electrode and the fourth alignment electrode, a first end of the first light emitting element is disposed on the first alignment electrode, a second end of the first light emitting element is disposed on the second alignment electrode, a first end of the second light emitting element is disposed on the fourth alignment electrode, and a second end of the second light emitting element is disposed on the third alignment electrode.

5. The display device of claim 4, wherein the first sub-pixel and the second sub-pixel are alternately and repeatedly arranged in the display area.

* * * * *